(12) United States Patent
Kincaid et al.

(10) Patent No.: US 11,612,240 B1
(45) Date of Patent: *Mar. 28, 2023

(54) WORK AND VIDEOCONFERENCE ASSEMBLY

(71) Applicant: Steelcase Inc., Grand Rapids, MI (US)

(72) Inventors: Brett Kincaid, Ada, MI (US); Mark Spoelhof, Grand Rapids, MI (US); Mark Schoolmeester, Grand Rapids, MI (US); Duck Young Kong, Beaverton, OR (US); John Allen, Grand Rapids, MI (US); Hyun Yoo, Grand Rapids, MI (US)

(73) Assignee: Steelcase Inc., Grand Rapids, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/342,081

(22) Filed: Jun. 8, 2021

Related U.S. Application Data

(63) Continuation of application No. 17/004,666, filed on Aug. 27, 2020, now Pat. No. 11,185,158, which is a
(Continued)

(51) Int. Cl.
  *A47B 21/04* (2006.01)
  *H04N 7/14* (2006.01)
  (Continued)

(52) U.S. Cl.
  CPC ............. *A47B 21/04* (2013.01); *A47B 9/20* (2013.01); *A47B 21/02* (2013.01); *A47B 21/06* (2013.01);
  (Continued)

(58) Field of Classification Search
  CPC ........... A47B 21/04; A47B 9/20; A47B 21/02; A47B 21/06; A47B 23/004; A47B 81/06;
  (Continued)

(56) References Cited

U.S. PATENT DOCUMENTS 1,978,512 A  10/1934  Stone
3,079,198 A  2/1963  Morgan et al.
(Continued)

FOREIGN PATENT DOCUMENTS

EP  2373015 A2  10/2011
JP  S54104238 A  8/1979
(Continued)

OTHER PUBLICATIONS

Addi Design, Booth, http://addi.se/design/?portfolio=booth, Copyright 2010 Addi Design, Kalmar, Sweden, 2 pages.
(Continued)

*Primary Examiner* — Theodore V Adamos
(74) *Attorney, Agent, or Firm* — Quarles & Brady LLP

(57) ABSTRACT

A monitor support assembly includes a base designed to rest on an ambient floor surface. An upright frame structure is spaced forward to the rear of the base and extends vertically upward from the base. The frame structure includes first and second vertical members and a top frame member that extends horizontally between the vertical members, A shroud assembly is mounted to the upright frame structure and includes a first central wall member and first and second additional wall members extending from the first and second lateral edges in the same direction. The first central wall member and the additional wall members form a receiving space. A mounting plate mountable to the rear surface of a displays screen is releasably supported by the upright frame structure within the receiving space. A depth dimension of the receiving space is sufficient to accommodate a display screen mounted via the mounting plate.

24 Claims, 50 Drawing Sheets

Related U.S. Application Data continuation of application No. 15/991,368, filed on May 29, 2018, now Pat. No. 10,786,074, which is a continuation of application No. 15/347,252, filed on Nov. 9, 2016, now abandoned, which is a continuation of application No. 14/859,990, filed on Sep. 21, 2015, now abandoned, which is a continuation of application No. 14/320,984, filed on Jul. 1, 2014, now abandoned, which is a continuation of application No. 13/481,400, filed on May 25, 2012, now Pat. No. 8,804,321.

(51) Int. Cl.

| | | |
|---|---|---|
| A47B 81/06 | (2006.01) | |
| F16M 11/04 | (2006.01) | |
| A47B 21/06 | (2006.01) | |
| H04N 7/15 | (2006.01) | |
| F16M 13/02 | (2006.01) | |
| A47B 9/20 | (2006.01) | |
| H05K 5/03 | (2006.01) | |
| A47B 21/02 | (2006.01) | |
| A47C 7/72 | (2006.01) | |
| H05K 5/00 | (2006.01) | |
| F16M 11/18 | (2006.01) | |
| H04N 5/645 | (2006.01) | |
| A47B 23/04 | (2006.01) | |

(52) U.S. Cl.
CPC .......... *A47B 23/04* (2013.01); *A47B 81/06* (2013.01); *A47C 7/72* (2013.01); *A47C 7/727* (2018.08); *F16M 11/04* (2013.01); *F16M 11/046* (2013.01); *F16M 11/18* (2013.01); *F16M 13/02* (2013.01); *H04N 5/645* (2013.01); *H04N 7/142* (2013.01); *H04N 7/15* (2013.01); *H05K 5/0017* (2013.01); *H05K 5/03* (2013.01); *A47B 2023/049* (2013.01); *A47B 2200/0075* (2013.01); *A47B 2200/0079* (2013.01); *F16M 2200/047* (2013.01)

(58) Field of Classification Search
CPC ......... A47B 2200/006–0079; A47B 2023/049; F16M 11/04; F16M 11/046; F16M 11/18; F16M 13/02; F16M 2200/047; A47C 7/72; A47C 7/727; H04N 5/645; H04N 7/142; H04N 7/15; H05K 5/0017; H05K 5/03

See application file for complete search history.

(56) References Cited

U.S. PATENT DOCUMENTS

| | | | |
|---|---|---|---|
| 3,117,534 A | 1/1964 | Martland | |
| 3,541,256 A | 11/1970 | Anders | |
| 3,842,556 A | 10/1974 | Brendgord | |
| 4,224,769 A * | 9/1980 | Ball | A47B 21/06 |
| | | | 312/140.1 |
| 4,392,486 A | 7/1983 | Gardineer et al. | |
| 4,762,072 A | 8/1988 | Boundy et al. | |
| 4,986,330 A | 1/1991 | McGonagle | |
| 5,024,398 A | 6/1991 | Riedinger et al. | |
| 5,572,248 A | 11/1996 | Allen et al. | |
| 5,615,854 A | 4/1997 | Nomura et al. | |
| 5,651,219 A | 7/1997 | Baloga et al. | |
| 5,961,192 A * | 10/1999 | Bernart | A47B 21/00 |
| | | | 312/265.5 |
| 6,122,865 A | 9/2000 | Branc et al. | |
| 6,191,939 B1 | 2/2001 | Burnett | |
| 6,205,716 B1 | 3/2001 | Peltz | |
| 6,260,903 B1 | 7/2001 | von der Heyde | |
| 6,474,025 B1 * | 11/2002 | Faiks | A47B 83/001 |
| | | | 52/64 |
| 6,549,230 B2 | 4/2003 | Tosaya | |
| 6,550,724 B2 * | 4/2003 | Gosling | A47B 83/001 |
| | | | 108/147 |
| 6,564,723 B2 | 5/2003 | Shapton | |
| 6,644,736 B2 | 11/2003 | Nguyen et al. | |
| 6,663,267 B2 * | 12/2003 | Newhouse | F21V 21/26 |
| | | | 108/50.01 |
| 6,697,250 B2 * | 2/2004 | Kuo | G06F 1/181 |
| | | | 361/679.6 |
| 6,771,333 B2 | 8/2004 | Tanaka et al. | |
| 6,803,900 B1 | 10/2004 | Berkoff et al. | |
| 6,844,893 B1 | 1/2005 | Miller et al. | |
| 6,847,173 B2 | 1/2005 | Berthou et al. | |
| 6,980,259 B2 | 12/2005 | Strollo et al. | |
| 7,057,637 B2 | 6/2006 | White | |
| 7,126,627 B1 | 10/2006 | Lewis et al. | |
| 7,136,090 B1 | 11/2006 | McDuffie White | |
| 7,234,814 B2 | 6/2007 | Morita et al. | |
| D583,781 S | 12/2008 | Derocher et al. | |
| 7,508,655 B2 * | 3/2009 | Baek | G02F 1/133308 |
| | | | 349/56 |
| D599,357 S | 9/2009 | Kaufman | |
| 7,619,881 B1 * | 11/2009 | Granville | G06F 1/1601 |
| | | | 361/679.21 |
| 7,621,544 B2 | 11/2009 | Rossini | |
| 7,640,866 B1 * | 1/2010 | Schermerhorn | A47B 21/00 |
| | | | 108/5 |
| D611,473 S | 3/2010 | Lee | |
| 7,760,229 B2 | 7/2010 | White | |
| D623,577 S | 9/2010 | Orson et al. | |
| D623,621 S | 9/2010 | Roed et al. | |
| 7,886,671 B2 * | 2/2011 | Roberge | A47B 21/02 |
| | | | 108/50.01 |
| 7,916,165 B2 | 3/2011 | Ferren et al. | |
| D638,551 S | 5/2011 | Gann | |
| 8,011,138 B2 | 9/2011 | McGonagle et al. | |
| 8,051,782 B2 | 11/2011 | Nethken et al. | |
| 8,074,581 B2 | 12/2011 | Epstein et al. | |
| 8,094,181 B2 | 1/2012 | Barreiro | |
| 8,121,166 B2 | 2/2012 | Van Sprang et al. | |
| 8,125,771 B2 * | 2/2012 | Yukawa | G06F 1/16 |
| | | | 313/582 |
| 8,164,617 B2 | 4/2012 | Mauchly | |
| 8,164,886 B1 | 4/2012 | Shelander et al. | |
| 8,167,434 B2 | 5/2012 | Overes | |
| 8,169,548 B2 | 5/2012 | Ryckman | |
| 8,174,488 B2 | 5/2012 | Kadijk et al. | |
| 8,264,519 B2 | 9/2012 | Lunde et al. | |
| 8,272,674 B2 | 9/2012 | Vance | |
| 8,274,544 B2 | 9/2012 | Kurtz et al. | |
| 8,289,371 B2 | 10/2012 | Wagner et al. | |
| 8,300,785 B2 | 10/2012 | White | |
| 8,319,819 B2 | 11/2012 | MacDonald et al. | |
| 8,330,791 B2 | 12/2012 | Gorzynski et al. | |
| 8,416,279 B2 | 4/2013 | Pepperell | |
| 8,446,449 B1 | 5/2013 | Miller et al. | |
| 8,446,454 B2 | 5/2013 | Decker et al. | |
| 8,487,977 B2 | 7/2013 | Saleh et al. | |
| 8,662,605 B2 | 3/2014 | McRorie et al. | |
| 8,804,321 B2 * | 8/2014 | Kincaid | H04N 5/645 |
| | | | 312/265.6 |
| 8,893,628 B2 | 11/2014 | McKenzie, III et al. | |
| D720,165 S | 12/2014 | Kincaid et al. | |
| 9,167,894 B2 | 10/2015 | DesRoches et al. | |
| 10,786,074 B2 | 9/2020 | Kincaid et al. | |
| 11,185,158 B1 * | 11/2021 | Kincaid | H04N 7/142 |
| 2004/0090154 A1 * | 5/2004 | Chang | A47B 21/0073 |
| | | | 348/E5.128 |
| 2004/0130109 A1 | 7/2004 | Yu et al. | |
| 2004/0149177 A1 | 8/2004 | Gayhart et al. | |
| 2005/0007445 A1 | 1/2005 | Foote et al. | |
| 2005/0011138 A1 | 1/2005 | Ball et al. | |
| 2005/0016081 A1 * | 1/2005 | Gomree | A47B 13/04 |
| | | | 52/36.1 |
| 2005/0022699 A1 * | 2/2005 | Goza | A47B 21/0314 |
| | | | 108/50.01 |

(56) References Cited

U.S. PATENT DOCUMENTS

| | | |
|---|---|---|
| 2005/0217540 A1 | 10/2005 | Novak |
| 2006/0209527 A1 | 9/2006 | Shin |
| 2006/0283098 A1* | 12/2006 | Golino .............. A47B 87/00 52/36.1 |
| 2007/0114892 A1* | 5/2007 | Boxenbaum .......... A47B 51/00 312/223.3 |
| 2007/0258015 A1 | 11/2007 | Diederiks et al. |
| 2008/0055564 A1 | 3/2008 | Chang et al. |
| 2008/0259541 A1* | 10/2008 | Woodward .......... F16M 11/425 248/323 |
| 2008/0291260 A1 | 11/2008 | Dignan et al. |
| 2008/0315734 A1 | 12/2008 | Birsel et al. |
| 2009/0102335 A1* | 4/2009 | Hancock .......... A47B 21/0073 312/223.1 |
| 2009/0133609 A1* | 5/2009 | Nethken .............. A47B 21/02 108/50.02 |
| 2009/0145050 A1 | 6/2009 | Dugand |
| 2009/0260547 A1* | 10/2009 | Epstein .............. G06F 3/0481 108/50.02 |
| 2009/0278913 A1 | 11/2009 | Rosenfeld et al. |
| 2010/0053229 A1 | 3/2010 | Krijn et al. |
| 2010/0085382 A1 | 4/2010 | Lundqvist et al. |
| 2010/0091193 A1 | 4/2010 | Hoogenstraaten et al. |
| 2010/0172152 A1 | 7/2010 | Boonekamp |
| 2010/0201878 A1 | 8/2010 | Barenbrug et al. |
| 2010/0238265 A1 | 9/2010 | White |
| 2010/0245532 A1 | 9/2010 | Kurtz et al. |
| 2010/0302454 A1 | 12/2010 | Epstein et al. |
| 2011/0059796 A1 | 3/2011 | Kondo et al. |
| 2011/0090302 A1 | 4/2011 | Leviav et al. |
| 2011/0096136 A1 | 4/2011 | Liu et al. |
| 2011/0102538 A1 | 5/2011 | Tan |
| 2011/0102539 A1 | 5/2011 | Ferren |
| 2011/0164398 A1 | 7/2011 | Holten et al. |
| 2011/0194274 A1 | 8/2011 | Kwisthout et al. |
| 2011/0260626 A1 | 10/2011 | Matthys |
| 2011/0292255 A1 | 12/2011 | Kanade et al. |
| 2011/0312384 A1 | 12/2011 | Youn |
| 2012/0050458 A1 | 3/2012 | Mauchly et al. |
| 2012/0069508 A1* | 3/2012 | Sweere .............. A47B 21/02 361/679.01 |
| 2012/0086316 A1 | 4/2012 | Schaaf |
| 2012/0099254 A1* | 4/2012 | Rogers .............. G06F 1/1637 361/679.01 |
| 2012/0140098 A1 | 6/2012 | Ryckman |
| 2012/0169838 A1* | 7/2012 | Sekine ................ H04N 7/15 348/E13.001 |
| 2012/0194455 A1 | 8/2012 | Hsu et al. |
| 2012/0212116 A1 | 8/2012 | McRorie et al. |
| 2012/0249724 A1 | 10/2012 | Morrison |
| 2012/0274727 A1 | 11/2012 | Robinson et al. |
| 2012/0281059 A1 | 11/2012 | Chou et al. |
| 2012/0306994 A1 | 12/2012 | Schwartz |
| 2013/0016483 A1 | 1/2013 | Chuang et al. |
| 2013/0026889 A1* | 1/2013 | Lee ................ F16M 11/046 312/7.2 |
| 2013/0093838 A1 | 4/2013 | Tan et al. |
| 2013/0162749 A1 | 6/2013 | Eskilsson |
| 2013/0176450 A1 | 7/2013 | Pryor |
| 2013/0194378 A1 | 8/2013 | Brown |
| 2013/0222529 A1 | 8/2013 | Decker et al. |
| 2014/0311050 A1 | 10/2014 | Kincaid et al. |
| 2019/0328131 A1 | 10/2019 | Wanstall |

FOREIGN PATENT DOCUMENTS

| | | |
|---|---|---|
| JP | 2006033642 A | 2/2006 |
| WO | 9407327 A1 | 3/1994 |
| WO | 93028372 A1 | 4/2003 |
| WO | 2004091214 A1 | 10/2004 |
| WO | 2008137362 A1 | 11/2008 |
| WO | 2010111275 A1 | 9/2010 |
| WO | 2012008972 A1 | 1/2012 |
| WO | 2012173564 A1 | 12/2012 |
| WO | 2013032461 A1 | 3/2013 |

OTHER PUBLICATIONS

Antec Online Store, Bias Lighting, SKU: 0-761345-77020-0, http://store.antec.com/Product/soundscience/bias-lighting/0-761345-77020-0.aspx, printed May 17, 2012, 1 page.

Ambilight, Wikipedia, retrieved May 17, 2012, 4 pages.

Bretford's Guide to Successfully Planning a Video Conferencing Room, Copyright 1999 Bretford Manufacturing, Inc., 14 pages.

Burkett, Innovative Furniture Brings Video Conferences to the Cubicle, Jun. 27, 2011, http://bestinuc.com/innovative-furniture-brings-video-conferences-to-the-cubicle/, 4 pages.

Buzzispace, BuzziHub, http://www.buzzispace.com/products/buzzihub, Copyright 2013 BuzziSpace, 3 pages.

Cisco Systems, TelePresence: In-Person Experiences for All, http://www.cisco.com/web/telepresence/index.html, Accessed Nov. 4, 2013, 1 page.

EPlus Advantage, Portable Video Conferencing, http://www.eplus.com/Collateral/Brochures/Portable%20Video% 20Conferencing.pdf, Copyright 2012 ePlus Inc., 2 pages.

Hofer, et al., MatrixView: Extending Immersion in Video Conferencing, UIST 2006 Adjunct Proceedings: Posters, pp. 87-88.

IFA News: Philips Lights the Way with Aurea 3 and LED Backlighting, Sep. 3, 2009, http://www.whathifi.com/News/IFA-News-Philips-lights-the-way-with-Aurea-3-and-LED-backlighting/, 1 page.

IVCi, UC Mobile System, http://www.ivci.com/uc-mobile-systems.html, Copyright 2012 IVCi, LLC, 2 pages.

IVCi, UC Room, http://www.ivci.com/uc-room-systems.html. Copyright 2012 IVCi, LLC, 2 pages.

Oblong Industries, Mezzanine, http://www.ivci.com/oblong-mezzanine.html. Copyright 2012 IVCi, LLC, 2 pages.

Polycom, Inc., HD Video Conferencing & Telepresence Systems, http://www.polycom.com/products-services/hd-telepresence-video-conferencing.html. Copyright 2013 Polycom, Inc., 3 pages.

Polycom, Inc., RealPresence Experience (RPX), http://www.polycom.com/products-services/hd-telepresence-video-conferencing/realprese . . . , Copyright 2013 Polycom, Inc., 1 page.

Polycom, Inc., Open Telepresence Experience (OTX), http://www.polycom.com/products-services/hd-telepresence-video-conferencing/realprese . . . , Copyright 2013 Polycom, Inc., 1 page.

Polycom, ATX—Architected Telepresence Experience, http://www.ivci.com/polycom-architected-telepresence-experience-atx.html, Copyright 2012 IVCi, LLC, 2 pages.

Polycom, HDX Executive Collection, http://www.ivci.com/polycom-hdx-executive-collection.html. Copyright 2012 IVCi, LLC, 3 pages.

Tandberg Products, Tandberg Video Conferencing, http://vsgi.com/products/videoconferencing/tandberg/, Copyright 2012 VSGI, 4 pages.

Tely Labs, telyHD Pro, TelyMed MTS-100 Mobile Station, http://www.ivci.com/tely-labs.html, Copyright 2012 IVCi, LLC, 2 pages.

\* cited by examiner

WORK AND VIDEOCONFERENCE ASSEMBLY

CROSS-REFERENCE TO RELATED APPLICATIONS

This application is a continuation of U.S. application Ser. No. 17/004,666 which was filed on Aug. 27, 2020, which is a continuation of U.S. application Ser. No. 15/991,368 which was filed on May 29, 2018, which is a continuation of U.S. application Ser. No. 15/347,252 which was filed Nov. 9, 2016 which is of continuation of U.S. application Ser. No. 14/859,990 which was filed Sep. 21, 2015, which is a continuation of U.S. application Ser. No. 14/320,984 which was filed Jul. 1, 2014, which is a continuation of U.S. application Ser. No. 13/481,400 which was filed on May 25, 2012 and which is titled "WORK AND VIDEO CONFERENCE ASSEMBLY" and issued on Aug. 12, 2014 as U.S. Pat. No. 8,804,321, all of which are incorporated herein by reference in their entireties.

STATEMENT REGARDING FEDERALLY SPONSORED RESEARCH OR DEVELOPMENT

Not applicable.

BACKGROUND OF THE INVENTION

The present invention relates to one person work spaces designed to facilitate and enhance use of technology in open floor plan environments and more specifically to work spaces designed to support individual work activities as well as accommodate two person and videoconference activities in open floor plan spaces.

Many companies purchase or rent large amounts of office space and provide either personal offices or personal workstations or spaces (e.g., cubicles) for each employee for performing individual employment tasks. In many of these cases, each employee is provided with a computer of some type including, among other components, a display and one or more input devices (e.g., a keyboard) for generating and accessing digital media content. Personal computers are also used to facilitate videoconferencing within dedicated private spaces. Conference rooms are set up to facilitate meetings among two or more employees where the conference rooms often include, among other things, large displays for facilitating videoconferences and for sharing digital media content.

In the last few years, in an effort to reduce real estate costs, many companies have started to eliminate many dedicated personal offices and workstations in company facilities by having employees work directly out of their homes most of the time. In these cases, when an employee needs to periodically be at a company facility for some reason, many companies provide "hotdesks" at their facilities that can be used by any employee on a part time (e.g., by the day, by the hour, etc.) basis. Many known hotdesk configurations are very simple and may include nothing more than a table or bench having a plurality of spaces where any employee can use any of the bench spaces while at a company facility. For instance, an employee may set up a temporary office with the employee's laptop supported at one of the hotdesk spaces. Other hotdesks may include a computer and a keyboard or other input device for use by visiting employees. Still other hotdesks may include more structure such as a conventional partition wall structure surrounding a computer supported by a worksurface. To support group activities among co-located employees, most employers still provide large conference rooms equipped with large displays for digital data sharing and videoconferencing.

While hotdesks have been employed successfully to reduce real estate costs in many companies, known hotdesks have several shortcomings which likely reduce overall worker efficiency and effectiveness. For instance, because many employees routinely access digital media on display screens and often access several applications at once, it would be advantageous to have access to at least one relatively large display screen at a hotdesk. Hotdesks that require employees to use laptop computers clearly do not provide large display screen access. Other hotdesks equipped with screens typically have small display screens.

As another instance, many hotdesks do not provide enough enclosure to give user's a sense of privacy. For instance, where hotdesks comprise spaces at a bench, hotdesk users are completely exposed which can cause anxiety as well as minimize the frankness with which user's verbally communicate with others in their hotdesk space and remotely via phone or videoconference. In other cases hotdesks may be too enclosed to effectively support dyadic communication. To this end, while the lions share of tasks performed by employees are performed independent of other people, it is believed that the second largest volume of tasks performed by employees involve communications between only two people. While small enclosed hotdesks may be ideal for use by a single employee, the small enclosed space often is too tight for use by two people. In these cases, instead of using a small, enclosed space to facilitate dyadic communications, often two employees will seek out a large conference space to share ideas and collaborate or will simply attempt to collaborate in an open facility space using a laptop or the like to access digital media.

Where the number of enclosed conference spaces are small, collaboration in open spaces using laptops occurs more often which it is believed has an adverse affect on collaboration both because small screens are not optimal for viewing by two people and because people naturally are less inclined to openly share thoughts in a completely open space. While a company could build out a great number of large conference spaces, those spaces would be too large for optimal dyadic collaboration.

As still one other instance, hotdesks often require users to use relatively poor quality equipment for videoconferencing. For example, in many cases hotdesk user's have to use their laptop screens, cameras and speakers and ambient lighting to videoconference. In these cases often the lighting is poor resulting in a poor quality image being presented to a remote conferee, the speakers are not high quality and are not oriented to emanate sound directly toward a hotdesk user and the laptop screens are too small to present a realistic image of a remote conferee. In addition, laptop display screens are often supported on a worksurface height desk so that they are angled rearward from bottom to top so that a remote conferee's image is presented in a somewhat horizontal orientation. The angled screen position often results in a video of the local conferee that is not head on (e.g., resulting in alignment "up the nose") resulting in a poor experience for the remote conferee. Exacerbating matters, laptop users can change the distance between a laptop and the user which changes the size of the user in the resulting video so that the user's size is often too large or too small in the resulting video. Where a dedicated screen is provided at a hotdesk, many of the problems described above with laptops still persist as ambient lighting and relative positions of displays, cameras and local conferees continue to be issues.

Thus, it would be advantageous to have workspace configurations that are optimized for personal use but which have attributes that are also relatively optimal for facilitating dyadic collaboration between two persons. It would also be advantageous if the workspace configurations were configured to optimize a videoconferencing experience with optimized lighting, optimized camera to local conferee distance and optimized and directional audio support. It would further be advantageous if the workspace configurations were simply configured and relatively inexpensive to configure.

These and other objects and advantages of the invention will be apparent from the description that follows and from the drawings which illustrate embodiments of the invention, and which are incorporated herein by reference.

BRIEF SUMMARY OF THE INVENTION

It has been recognized that a relatively simple workstation for use by a single person can be configured that includes a table top member adjacent a totem or display screen support structure where the dimensions of the screen, support structure and table top are such that the person is positioned ideally for obtaining video during a video conference. A display is mounted to the totem and, in at least some embodiments, includes a height adjustment subassembly that enables a user to adjust the height of the display with respect to the table top, to compensate for different height persons that may use the configuration at different times. Thus, the display height can be moved up or down depending on a user's height, to align the display with the user so that, during conferencing, an image of a remote conferee can be adjusted up or down and eye-to-eye contact may result.

In at least some embodiments the display is mounted in a core assembly that includes an outer shell that also houses an audio box (e.g., including speakers, an amplifier, etc.), a camera and a power strip. Here, the shell may operate to direct sound from the audio box forward toward a local user thereby increasing the quality and volume of sound adjacent on the side of the assembly including the table while reducing the quality and volume on other sides of the assembly. The core assembly may also include the height adjustment subassembly.

In some embodiments the height adjustment assembly may be located within compartments formed by the shell so that the overall core package has a relatively clean and simple appearance. While the core assembly may be used with a totem or the like, in other cases it is contemplated that the core assembly may be used independent of a totem and instead may simply be mounted to any structural wall.

In some embodiments the totem or display screen support structure includes a panel assembly mounted to a frame structure. In some cases the panel assembly may simply include two rigid members, each having front and rear surfaces, where the rigid members are placed one immediately adjacent the other and a display may be mounted to the exposed front surface. Here, a channel may be routed into one of the members that is between the contacting surfaces to operate as a wire management channel to route power (and perhaps data) cables to the display screen. In at least some cases the framer structure includes first and second frame members that sandwich the first and second panel members together. In some cases the panel members extend from opposite sides of the sandwiching frame members and bushings between the frame members are used to secure the panel members to the frame members. Here, the resulting structure is relatively simply constructed and yet is extremely functional as many different panel and frame constructions can be formed to meet different design objectives. In some cases a fabric cover member may be placed onto one or both of the panel members to increase sound absorption within a workspace. In some cases a layer of foam may be provided under a fabric cover to further increase sound absorption.

A lounge and arch assembly is contemplated in some embodiments where the arch defines a space about the a lounge or sofa type seating arrangement to provide additional privacy. In at least some embodiments the arch supports lighting, audio and microphone devices that can be used to substantially enhance a videoconferencing experience. In some cases the lighting in the arch is provides indirectly by shining light onto internal surfaces of the arch assembly causing those surfaces to glow and fill the space defined by the arch with light. In some embodiments a lounge is positioned relative to a totem supported display screen to optimize privacy as well as to optimize videoconferencing activities.

Some embodiments of the invention include a monitor support assembly comprising a support frame including (i) a first elongated frame member forming a first surface and (ii) a second elongated frame member forming a second surface, the second frame member supported adjacent and parallel to the first frame member with the first surface facing the second surface and forming an elongated gap, a panel assembly including (i) a first panel member having oppositely facing substantially parallel front and rear surfaces and (ii) a second panel member having oppositely facing substantially parallel front and rear surfaces, the second panel member supported adjacent the first panel member with the front surface of the first panel member facing the rear surface of the second panel member, the panel assembly supported within the gap by the first and second frame members with the front surface of the second panel member and the rear surface of the first panel member adjacent and facing the first and second surfaces of the first and second frame members that form the gap, the panel assembly extending laterally to either side of the gap and at least a first electronic display mounted to and supported adjacent the front surface of the second panel member.

In some cases the first electronic display includes a power cable and wherein a channel is formed between the front surface of the first panel member and the rear surface of the second panel member, the power cable linked to the electronic display passing from the electronic display through the channel. In some cases the second panel member forms a hole that passes from the front surface of the second panel member to the rear surface of the second panel member, the hole aligned with the channel and the power line passing through the hole into the channel. In some cases at least one of the front surface of the first panel member and the rear surface of the second panel member is recessed from adjacent portions of the surface to form the channel. In some cases the rear surface of the second panel member forms the recess that forms the channel. In some cases the rear surface of the second panel is pressed against the front surface of the first panel member.

In some embodiments the first and second facing surfaces of the first and second elongated members compress the second panel member against the first panel member with the rear surface of the second panel member contacting the front surface of the first panel member along at least portions of the rear and front surfaces of the second and first panel members, respectively. In some cases the second panel member includes a substantially rigid structural member forming a circumferential edge and a fabric cover that extends across the front surface of the structural member and that wraps around the circumferential edge, the edges of the fabric cover sandwiched between the facing rear surface of the second panel member and the front surface of the first panel member.

In some cases each of the first and second panel members is formed of bent sheet metal. In some cases each of the first and second panel members is substantially flat within the gap and forms at least one bend adjacent the gap, the at least one bend of the second panel member mirroring the at least one bend of the first panel member. In some cases each of the first and second panel members forms a bend to either side of the gap.

Some embodiments further include at least one bushing mounted between the first and second elongated frame members within the gap that forms an upwardly facing surface, each of the first and second panel members forming an opening having a downwardly facing surface that is received on the upwardly facing surface to support the panel member within the gap. In some cases the openings formed by the panel members are holes. In some cases the elongated gap is a first elongated gap, the frame assembly further includes third and fourth elongated frame members that form third and fourth surfaces, respectively, the third frame member supported adjacent and parallel to the fourth frame member with the third surface facing the fourth surface and forming a second elongated gap, the panel assembly further supported within the second elongated gap by the third and fourth frame members with the front surface of the second panel member and the rear surface of the first panel member adjacent and facing the third and fourth surfaces of the first and second frame members that form the second elongated gap, respectively, the panel assembly extending laterally to either side of the second elongated gap.

In some cases the first and second elongated gaps are formed in different parallel planes. In some cases the first panel member has a circumferential edge and wherein lateral portions of the circumferential edge are exposed on opposite sides of the frame members. Some embodiments further include a table top member supported by the support frame adjacent the front surface of the second panel member. Some embodiments further include a shelf member supported at a height below a top surface of the table top member and between the table top member and the second panel member.

Other embodiments include a panel assembly comprising: a support frame including (i) a first frame structure forming at least first and second elongated surfaces that reside in different first and second planes, respectively and (ii) a second frame structure forming at least first and second elongated surfaces that are substantially parallel to and spaced apart from the first and second elongated surfaces formed by the first frame structure to form first and second elongated mounting gaps that extend along the different first and second planes, respectively, a panel assembly including at least a first substantially rigid and integrally formed panel member having oppositely facing front and rear surfaces, the panel assembly supported within each of the first and second elongated mounting gaps and extending to either side of each of the first and second mounting gaps with a central portion of the panel assembly extending between the first and second mounting gaps, a first wing portion extending from the first mounting gap to a side opposite the central portion and terminating in a first exposed panel edge portion and a second wing portion extending from the second mounting gap to a side opposite the central portion and terminating in a second exposed panel edge portion.

In some cases each of the first and second elongated mounting gaps extends substantially vertically, the central portion of the panel assembly forming at least a first curve between the elongated mounting gaps. In some cases the portions of the panel assembly within the first and second elongated mounting gaps are substantially parallel. In some cases the central portion of the panel assembly includes a substantially flat wall portion and first and second curved portions between the flat wall portion and the portions of the panel assembly within the first and second elongated mounting gaps. In some cases the flat wall portion is substantially perpendicular to the portions of the panel assembly within the first and second elongated mounting gaps. In some cases the panel member is formed of bent sheet metal.

In some cases the panel member is a first panel member and the panel assembly further includes a second panel member having oppositely facing front and rear surfaces, the second panel member positioned adjacent the first panel member with the rear surface of the second panel member contacting the front surface of the first panel member. In some cases the first panel member forms a hole and one of the front surface of the first panel member and the rear surface of the second panel member forms a channel that extends from the hole to a lower edge of the panel member that forms the channel. Some embodiments further include a display mounted to the front surface of the second panel member.

Some embodiments include a lounge assembly comprising a lounge including a seat and a backrest and having first and second ends, an arch supported by the lounge, the arch including first and second substantially vertical end wall members that extend upward from adjacent the first and second ends of the lounge and a ceiling member that traverses the distance between the first and second end wall members, the space between the end wall members forming an arch space, each end wall member having an internal surface facing the arch space, each of the end wall members and the ceiling member having a rear edge proximate the backrest and a front edge opposite the rear edge and first and second light sources supported by the first and second end wall members, respectively, each light source generating light that is directed at least partially onto the internal surface of the end wall member that supports the light source along trajectories away from the front edge of the end wall member that supports the light source.

In some cases each light source includes a reflector that extends at least partially into the arch space and that reflects light from the light source along trajectories away from the front edges. In some cases channels are formed in the internal surfaces of each of the first and second end wall members and wherein the light sources are at least partially received in the channels. In some cases the reflectors extend at least partially into the channels.

In some cases each of the channels is formed proximate the front edge of one of the side wall members. In some cases the internal surfaces are covered with a material that reflects the light back into the arch area. Some embodiments further include an audio box supported by the ceiling member within the arch area. In some cases each of the end wall members forms a channel adjacent the front edge of the wall member, the light sources each including light generating devices and reflectors, the light generating devices mounted within the channels and the reflectors reflecting light along the trajectories away from the front edges of the end wall members.

In some cases the light devices include strings of LEDs mounted in the channels, the reflectors including elongated reflectors that extend along at least a portion of a height of each of the end wall members. In some cases a channel is formed along the front edge of the ceiling member and wherein a light source is also mounted within the channel formed in the ceiling member to direct light along trajectories away from the front edge of the ceiling member. Some embodiments further include a screen member supported by the arch. The screen member including a substantially planar member having a shape similar to the shape formed by the rear edges of the side wall members and the ceiling member, the planar member spaced apart from the rear edges of the side wall members and the ceiling member to form a gap. In some cases the gap is between two and eight inches wide.

Other embodiments include a display assembly for mounting a display to a support structure for movement between different heights, the assembly comprising an external frame member that forms an internal frame space, the frame member including substantially parallel top and bottom wall members and substantially parallel first and second lateral wall members that traverse the distance between opposite ends of the top and bottom wall members to form the frame space there between that is open to a front side, the frame member forming a rear frame opening, an electronic display screen mounted within the frame space so that a display surface of the display screen faces out the front side of the frame space, a mounting plate located outside the frame space for mounting to the support structure, a first height adjustment spring assembly mounted within the frame space and a first bracket connected to the spring assembly within the frame space and extending from the frame space and connected to the mounting bracket outside the frame space.

Some embodiments further include a second height adjustment spring assembly mounted within the frame space and a second bracket connected to the second spring assembly within the frame space and extending from the frame space and connected to the mounting bracket outside the shell space. In some cases the spring assembly is a gas spring assembly that includes a rod that telescopes from a spring housing, the first bracket connected proximate a distal end of the rod.

Some embodiments further include at least a first guide rod mounted within the frame space and at least a first guide sleeve mounted for sliding movement on the guide rod, the first guide sleeve secured to the mounting plate. Some embodiments further include at least a second guide sleeve mounted for sliding movement to the guide rod and also secured to the mounting plate. In some cases the mounting plate forms a shelf member that extends into a cavity formed in the shell space, the cavity moving vertically relative to the shelf during height adjustment of the display screen. Some embodiments further include an audio box mounted within the frame space. Some embodiments further include a glass cover member supported in the open front side of the frame member.

In some cases the glass cover has dimensions smaller than dimensions between the internal surfaces of the shell adjacent the front side of the shell so that a gap is formed between adjacent edges of the cover member and the frame member. In some cases there is a direct path between the audio box and the space external to the frame member through the gap. Some embodiments further include a shell member mounted within the frame member, the shell member forming compartments for mounting the display screen and the height adjustment spring assembly. In some cases the shell member forms a rear surface, the frame member forming a flange that mounts to the rear surface of the shell member.

Still other embodiments include a display assembly for mounting to a support structure for movement between different heights, the assembly comprising an external frame member that forms an internal frame space, the frame member including substantially parallel top and bottom wall members and substantially parallel first and second lateral wall members that traverse the distance between opposite ends of the top and bottom wall members to form the frame space there between that is open to a front side, the frame member including flanges that extend inward from rear edges of the wall members forming a rear frame opening, an internal shell member that includes side walls and a rear wall that form a rectilinear shell space that is open to a front side, the rear wall of the internal shell member mounted to the flanges formed by the frame member with the shell member positioned within the frame space, the rear wall forming at least first and second elongated and substantially vertically oriented openings, an electronic display screen mounted within the shell space so that a display surface of the display screen faces out the front side of the shell space, a mounting plate located outside the frame space for mounting to the support structure, a first height adjustment spring assembly mounted within the shell space, a second height adjustment spring assembly mounted within the shell space, a first bracket connected to the first spring assembly within the shell space and extending through the first opening formed by the rear wall of the shell member from the frame space and connected to the mounting bracket outside the frame space and a second bracket connected to the second spring assembly within the shell space and extending through the second opening formed by the rear wall of the shell member from the frame space and connected to the mounting bracket outside the frame space.

To the accomplishment of the foregoing and related ends, the invention, then, comprises the features hereinafter fully described. The following description and the annexed drawings set forth in detail certain illustrative aspects of the invention. However, these aspects are indicative of but a few of the various ways in which the principles of the invention can be employed. Other aspects, advantages and novel features of the invention will become apparent from the following detailed description of the invention when considered in conjunction with the drawings.

DETAILED DESCRIPTION OF THE INVENTION

Figure 1:
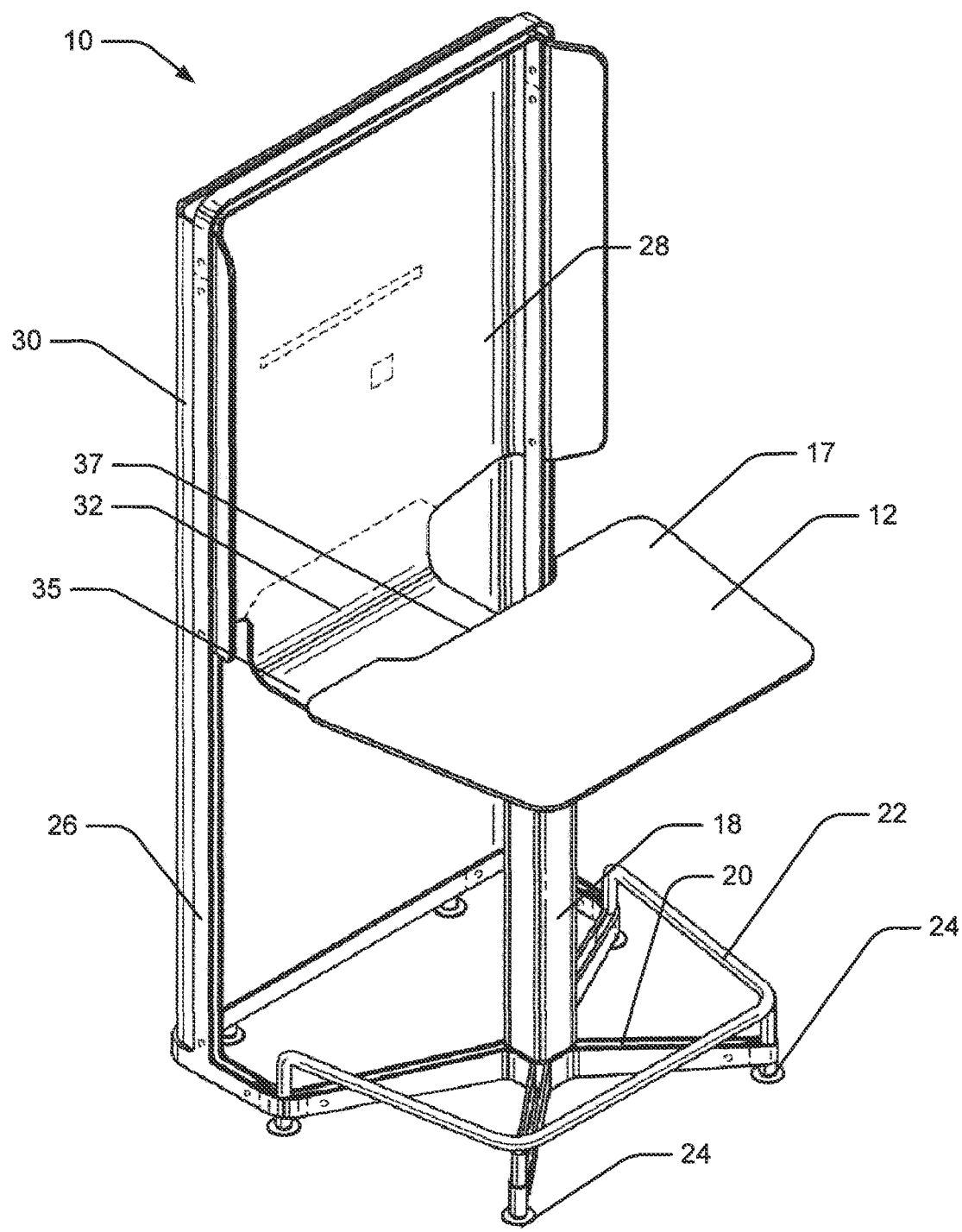
FIG. 1 is a perspective view of a standing totem assembly that is consistent with at least some aspects of the present invention.

The various aspects of the subject invention are now described with reference to the annexed drawings, wherein like reference numerals correspond to similar elements throughout the several views. It should be understood, however, that the drawings and detailed description hereafter relating thereto are not intended to limit the claimed subject matter to the particular form disclosed. Rather, the intention is to cover all modifications, equivalents, and alternatives falling within the spirit and scope of the claimed subject matter.

Referring now to the drawings wherein like reference numerals corresponding to similar elements throughout the several view and, more specifically, referring to FIGS. 1-11, at least some aspects of the present invention will be described in the context of an exemplary standing workstation 10 that is designed to be optimally used by a single user, but which can be used by two people at one time to share information in a dyadic fashion. Exemplary station 10 includes structure for supporting both a table top member 12 and a multi-media core assembly 120 (see also FIG. 12) which will be referred to herein after as a core assembly 120. In general, the workstation assembly 10 is a free standing structure which may be provided in any open space within a facility.

Referring specifically to FIGS. 1 and 3-6, assembly 10 has a construction which has been designed to have a particularly aesthetically pleasing appearance but which affords at least some privacy for an assembly user. In particular, assembly 10 includes light weight frame structure 216 that supports a light weight shroud or panel assembly that, in at least some embodiments, includes front and rear panel or shroud members 28 and 30, respectively, adjacent table top member 12 to afford at least some privacy. In at least some cases, assembly 10 may be spaced from an ambient wall (not illustrated) so that a front edge (see 90 in FIG. 6) forms a gap with the wall surface large enough to accommodate an assembly user. For instance, in some cases the wall to edge gap may be three feet. In other cases, a plurality of assemblies may be positioned in a line where the rear surface of each member 30 is spaced from a front edge 90 of an adjacent top member 12. In this way the shroud and other structure in a facility cooperate to provide privacy to an assembly user in a relatively simple and cost effective manner.

Here the phrase "light weight" refers to appearance of components and not necessarily to the weight of components. In this regard, for instance, exemplary frame members (see FIG. 9 generally) used to construct frame 26 may have a relatively minimal one and one-half inch by one-half inch cross-sectional shape while each panel member 28, 30, may have a thickness of between one-sixteenth inch and one-half inch so that the combined thickness of the shroud assembly 28, 30 is minimal.

Figure 3:
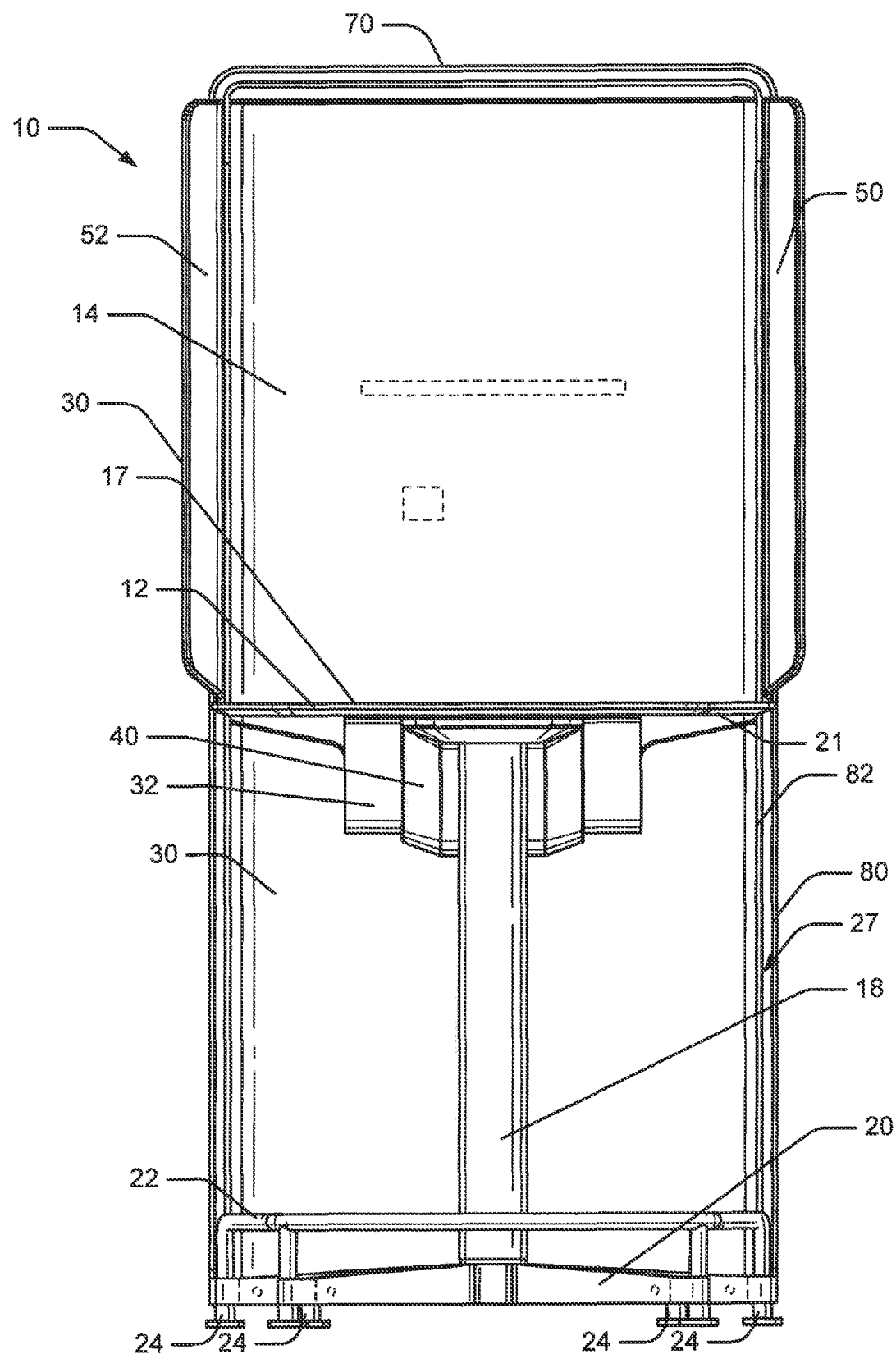
FIG. 3 is a front plan view of the assembly shown in FIG. 1.
Figure 6:
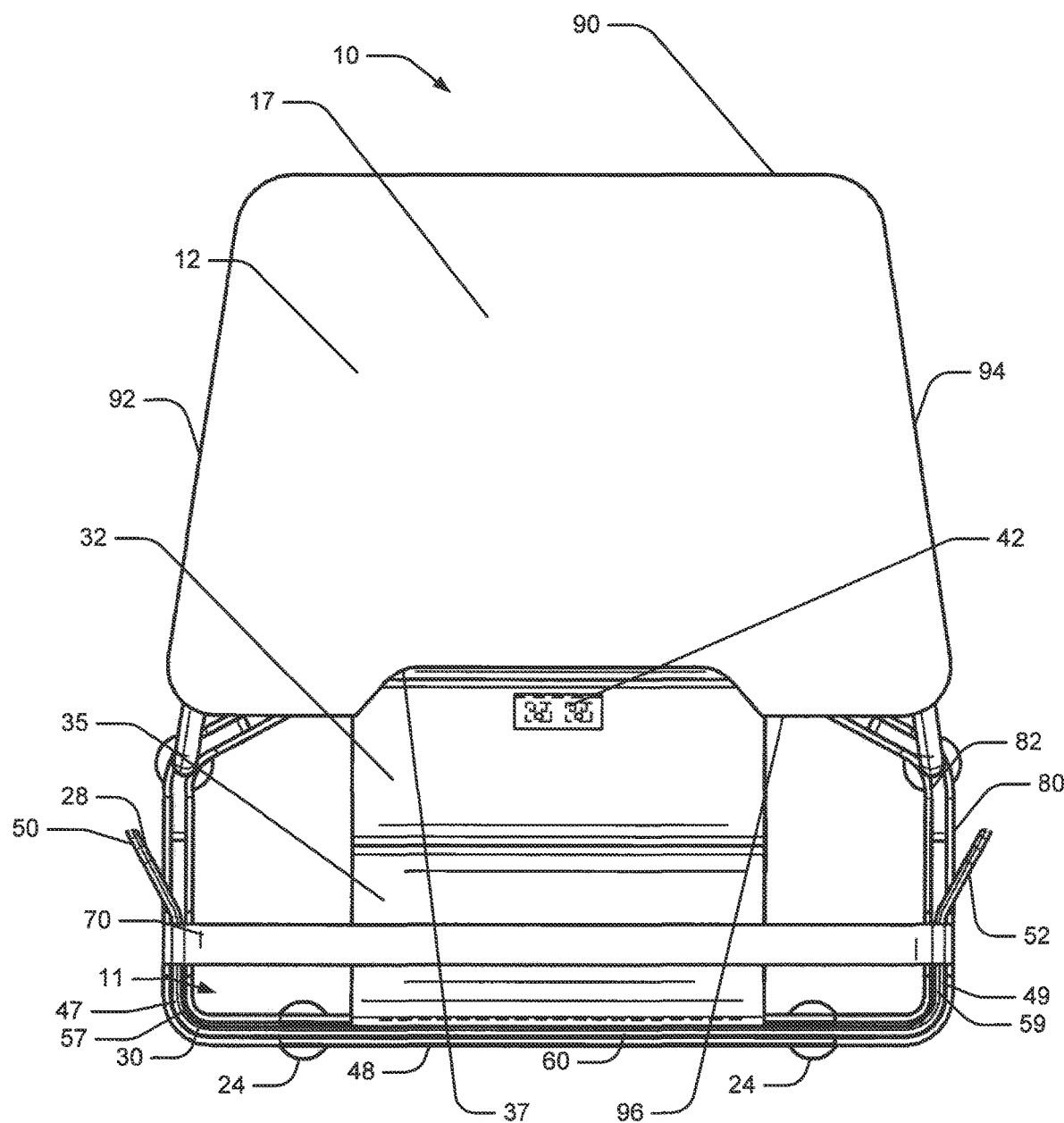
FIG. 6 is a top plan view of the assembly shown in FIG. 1.
Figure 7:
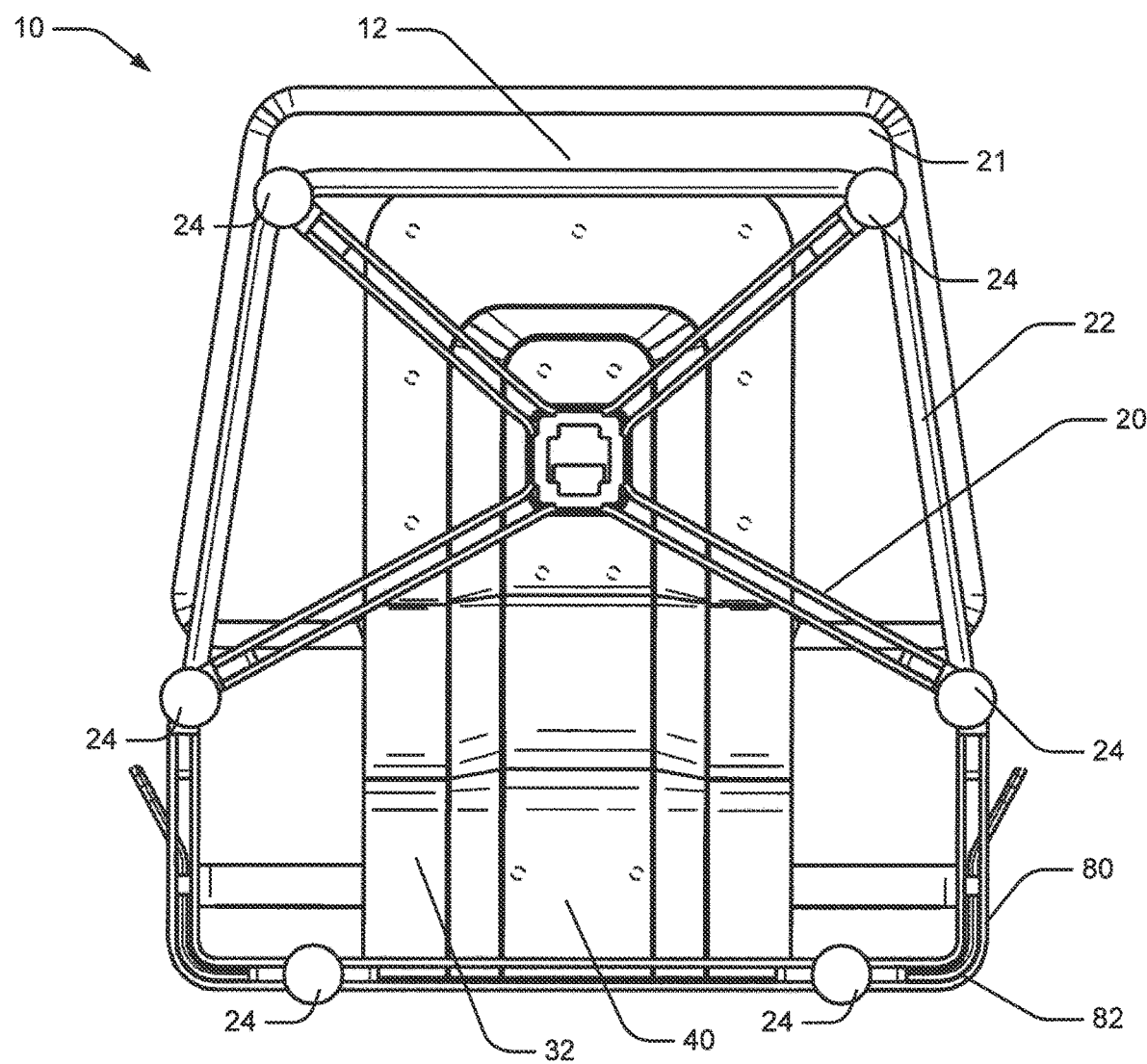
FIG. 7 is a bottom plan view of the assembly shown in FIG. 1.

Referring still to FIGS. 1 and 3-6, frame 26 includes a plurality of elongated members that define or form an outer or first frame structure and an inner or second frame structure that is framed by the outer frame structure where facing elongated surfaces of the outer and inner frame structures form elongated gaps (see 27 in FIG. 3). The panel or shroud assembly 28, 30 is mounted to the frame structures so that the assembly 28, 30 is received in the gap 27 and extends to either side thereof. As shown in FIGS. 1 and 6, assembly 28, 30 forms a plurality of bends or curves such that assembly 28, 30 is mounted at two different locations within gap 27. The bends or curves result in an assembly 28, 30 having a shape that forms a receiving space 11 in which core assembly 120 can be mounted. Assembly 28, 30 forms lateral wings 50 and 52 that flare out to opposite lateral sides from the receiving space to block view of a core assembly 120 display screen from side locations. As described in more detail hereafter, panel assembly 28, 30 and the frame 26, despite having a relatively light weight appearance, provide hidden wire management channels so that no cables or cords appear after assembly.

Assembly 10 includes a base structure 20, a foot rail 22, an upright frame structure 26, a table pedestal 18, table top member 12, rear shroud or panel member 30, front shroud or panel member 28, a bridge member 32, a plurality of height adjustable foot members collectively identified by numerals 24, a wire management channel forming member 40 (see FIGS. 3, 4 and 8), a power/data outlet subassembly 42 (see FIGS. 6 and 8), and a plurality of mechanical fasteners (e.g., screw, bolts, nuts, etc.), which are not separately illustrated. Referring specifically to FIG. 9, base structure 20 includes a plurality of rigid metal components 26a, 26b, 26c and 26d that are mechanically fastened together to form a rigid sub-structure that forms a horizontal footprint sufficient to hold the upright frame structure 26 and components attached thereto in a stable upright position. In at least some embodiments, although not illustrated, the base structure 20 may include components to fasten an ambient surface such as a floor surface to ensure that components supported thereby do not inadvertently tip over. In other embodiments, base structure 20 may include some type of weight device to increase the overall weight of assembly 10 near the bottom portion thereof to reduce the possibility of the assembly 10 tipping.

Referring still to FIG. 9, upright frame structure 26 includes a plurality of members 80, 82, 70, etc., that form a sub-structure that generally extends upward from base structure 20 to support a subset of the other assembly components. In the illustrated example, upright frame structure 26 extends upward from base structure 20 near, but spaced forward of, a rear end of the base structure (see FIG. 4). Frame structure 26 includes an internal or inner relatively thin structural frame or frame structure 82 located within an external or outer structural frame or frame structure 80 (see FIG. 3) where a gap 27 is formed between the internal and external frame structures. To provide this look, the upright frame structure 26 includes bushings 69a, 69b, 69c and 69d that are used to space the external frame structure 80 from the internal frame structure 82 to form gap 27. A top frame member 70 continues the external frame structure up and around a top portion of the internal frame structure 82 (see again FIG. 9) so that a uniform gap appears around the entire upright frame structure 26. Height adjustable foot assemblies 24 are mounted to base structure 20 and can be individually adjusted to compensate for irregularities in a support floor.

Referring still to FIGS. 1-4, 7 and 8, table pedestal 18 is mounted at a bottom end to base structure 20 and extends upward there from to a top end where table top member 12 is supported at a height that is comfortable for use by an average height person in a standing position. An exemplary table height for use by a standing person is thirty-eight inches but other heights between thirty-four and forty-two inches are contemplated. A bottom or undersurface 21 (see FIG. 4) of top member 12 is mechanically fastened (e.g., severed) to the top end of pedestal 10. While not shown, in at least some embodiments, it is contemplated that pedestal 18 may be a telescoping pedestal enabling a user to adjust the height of top member 12 to suit a specific user's needs.

Top member 12 forms a top work surface 17 that is substantially horizontal in the illustrated example. Referring specifically to FIG. 6, top member 12 has a unique shape defined by an outer edge that forms a front edge 90, a rear edge 96 and first and second lateral or side edges 92 and 94, respectively. The front and rear edges 90 and 96 are generally parallel to each other while side edges 92 and 94 extend from opposite ends of front edge 90 at similar obtuse angles toward opposite ends of rear edge 96. The obtuse angles between front edge 90 and each of the side edge 92 and 94 are approximately 110° although other angles are contemplated. Rear edge 96 forms a central recess or scallop 37 which operates to help users maintain power or data cords or the like in a supported centrally located position with respect to the rear edge when a device requiring such a cord is used on top surface 17. In the illustrated example the recess or scallop 37 is recessed in from rear edge 96 approximately 2 to 3 inches and takes up approximately half of the rear edge 96 in the central portion thereof. Table top member 12 is dimensioned to support two persons to encourage dyadic communications. For instance, to provide sufficient worksurface space for two laptops and some personal materials, member 12 may have a largest width (e.g., adjacent rear edge 96) of substantially thirty-four inches and a length of substantially twenty-two inches.

Referring again to FIGS. 1-8, in at least some embodiments, rear panel member 30 will be formed of bend sheet metal to have the shape illustrated. In other embodiments panel 30 may be formed using other rigid material such as plastic. Illustrated panel member 30 includes a base or central wall member, first and second intermediate wall members 47 and 49 (see FIG. 6) and first and second lateral wing members 50 and 52, respectively. The base member 48 is a substantially flat rectilinear member having parallel top and bottom edges and having parallel first and second lateral edges that extend between the top and bottom edges. Intermediate wall members 47 and 49 extend along approximately the top half of opposite side edges of central wall member 48 to form substantially right angles with wall member 48. Member 30 includes curved or radial corner portions (not labeled) between central wall member 48 and intermediate wall members 47 and 49. The curved corner portions extend along the entire length of panel member 30 (see FIG. 8 and FIGS. generally).

The wing members 50 and 52 are integrally formed with intermediate wall members 47 and 49, respectively, and extend from edges of the intermediate wall members 47 and 49 opposite central wall member 48, flaring outward and forward at approximately 30° from intermediate wall members 47 and 49.

Referring again to FIG. 8, each of the intermediate wall members 47 and 49 forms mounting holes (see 54) and mounting slots (see 56) that are positioned to align with mechanical fasteners for mounting rear panel 30 to upright frame structure 26 as will be described in more detail below. Exemplary panel member 30 extends down to a rear portion of base 20 that, like other parts of the frame 26, includes inner and outer members that form a gap where the lower edge of member 30 is received in the gap (see again FIG. 1). The lower parts of the curved portions on either side of central wall member 48 extend at least somewhat (e.g., one quarter inch) into the gap 27 all the way down to the base portion 20 to effectively close the frame.

In at least some embodiments panel member 30 may have a height dimension of substantially seventy inches and in some cases may be anywhere between sixty-five inches and eighty-two inches. The width of the illustrated panel 30 is generally larger than the width of top member 12 (see FIG. 3). Wing members 47 and 49 extend from the top edge of member 30 about half way down to the bottom edge. In some embodiments the vertical length of each wing member 47 and 49 is approximately thirty-six inches.

Referring still to FIGS. 1-8, in at least some embodiments, front panel member 28 is formed of bent sheet metal to have a shape that is substantially similar to the shape of the upper portion of rear panel member 30. To this end, see in FIG. 6 that, upon assembly, front panel member 28 is located immediately adjacent rear panel member 30 and substantially covers the top front surface portion of rear panel 30. Thus, referring specifically to FIG. 8, front panel member 28 includes a base or central member 60, intermediate wall members 57 and 59 and wing members 62 and 64 where base member 60 includes top and bottom edges and parallel, lateral or side edges, intermediate wall members 57a and 59 extend from opposite lateral edges of central member 60 at right angles. Wing members 62 and 64 angel forward and outward from front edges of wall members 57 and 59 opposite wall member 60 to form a shape that mirrors the shape of panel member 30.

Figure 2:
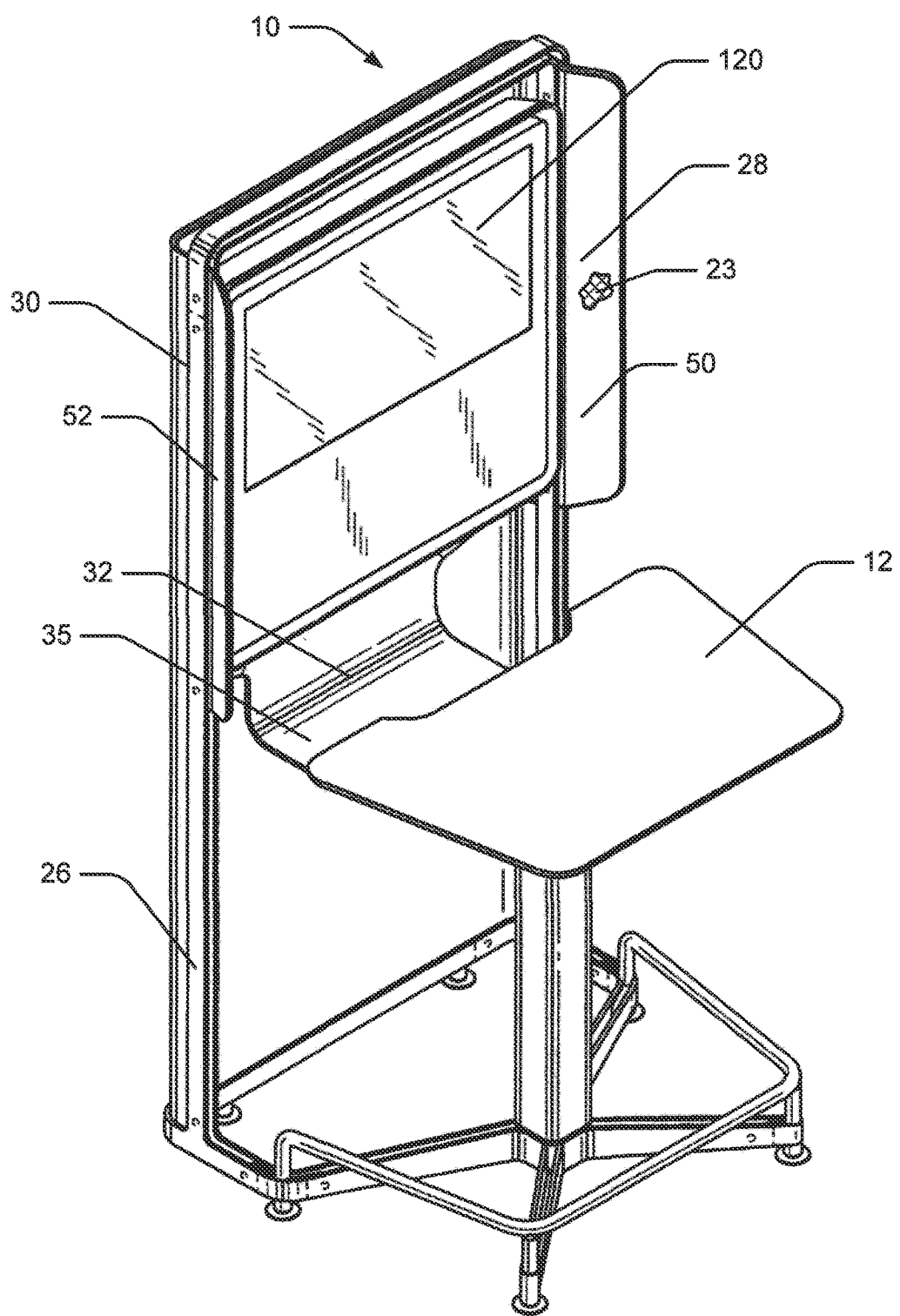
FIG. 2 is similar to FIG. 1, albeit showing a core assembly that is consistent with at least some aspects of the present invention mounted to the totem assembly of FIG. 1.

In at least some embodiments, referring to FIG. 2, a fabric material or a fabric covering foam 23 may be provided to cover a front surface (i.e., the surface facing away from rear panel member 30) of front panel member 28. Here, the fabric cover may wrap around the top, bottom and lateral edges of front panel member 28 and be secured via glue or some type of mechanical fastener to a rear surface of member 28 so that the edges of the fabric can be sandwiched between panel members 28 and 30 upon installation. In at least some embodiments, the portion of the fabric cover between facing surfaces of panel members 28 and 30 will be relatively thin so that facing surfaces of members 28 and 30 are essentially immediately adjacent and may even contact each other (e.g., members 28 and 30 may flex somewhat upon assembly) after assembly. Intermediate wall members 57 and 59 form mounting holes 63 and slots 65 similar to the holes 54 and slots 56 formed by wings 50 and 52 and align therewith upon installation.

Figure 8:
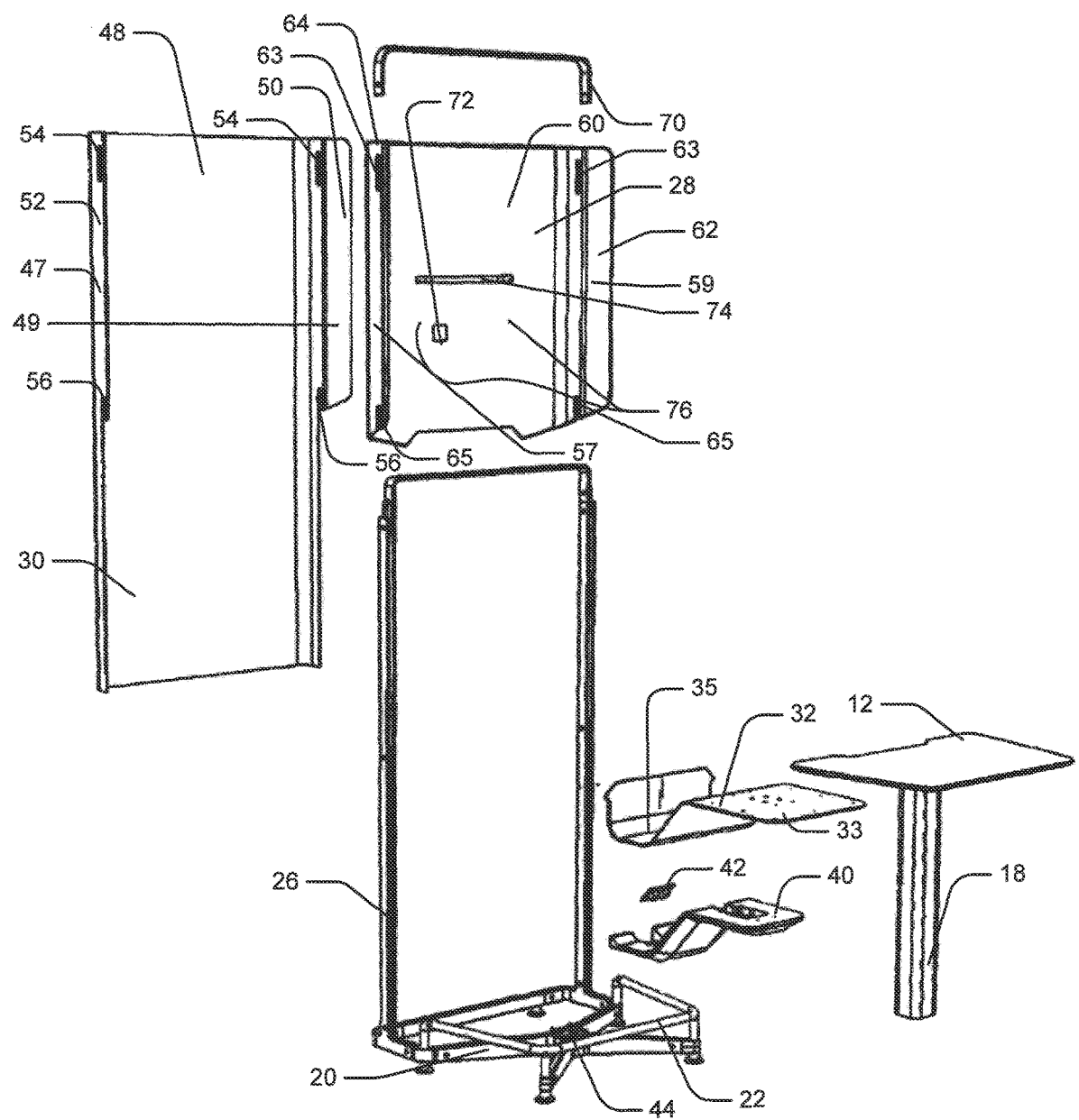
FIG. 8 is a partially exploded view of the assembly shown in FIG. 1.
Figure 9:
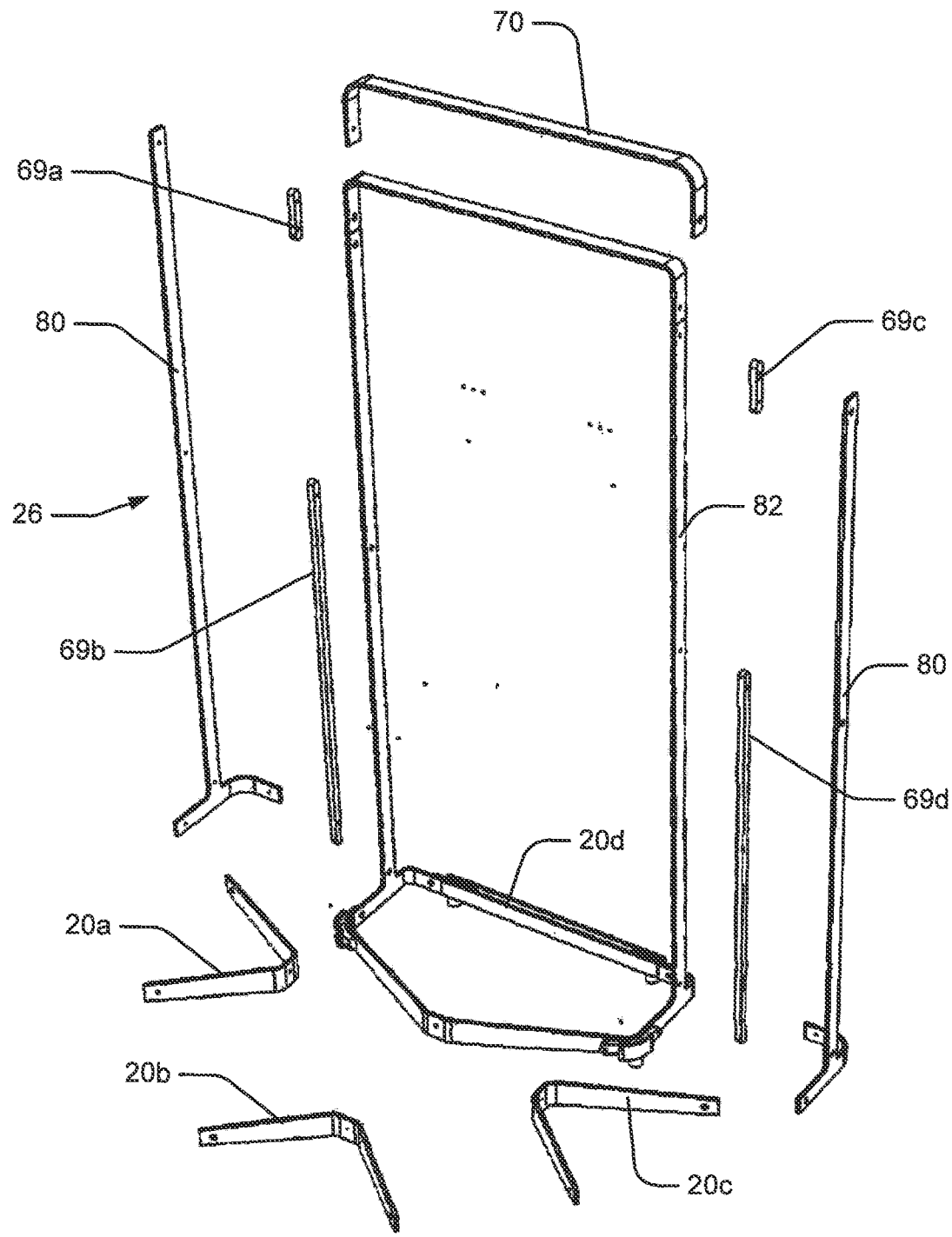
FIG. 9 is a partially exploded view of the frame assembly or structure shown in FIG. 8.

Referring still to FIG. 8, central wall member 60 forms a hole 72 in a mid section as well as a plurality of holes 76 for mounting the multi-media core assembly 120 in a manner to be described in greater detail below. A mounting bracket 74 is also mounted to a front surface of base member 60 for mounting core assembly 120. Bracket 74 may be a simple upwardly extending and elongated lip member designed and dimensioned to receive a similar downwardly extending lip member (see 132 in FIG. 17) extending from the rear of the core assembly 120.

Figure 4:
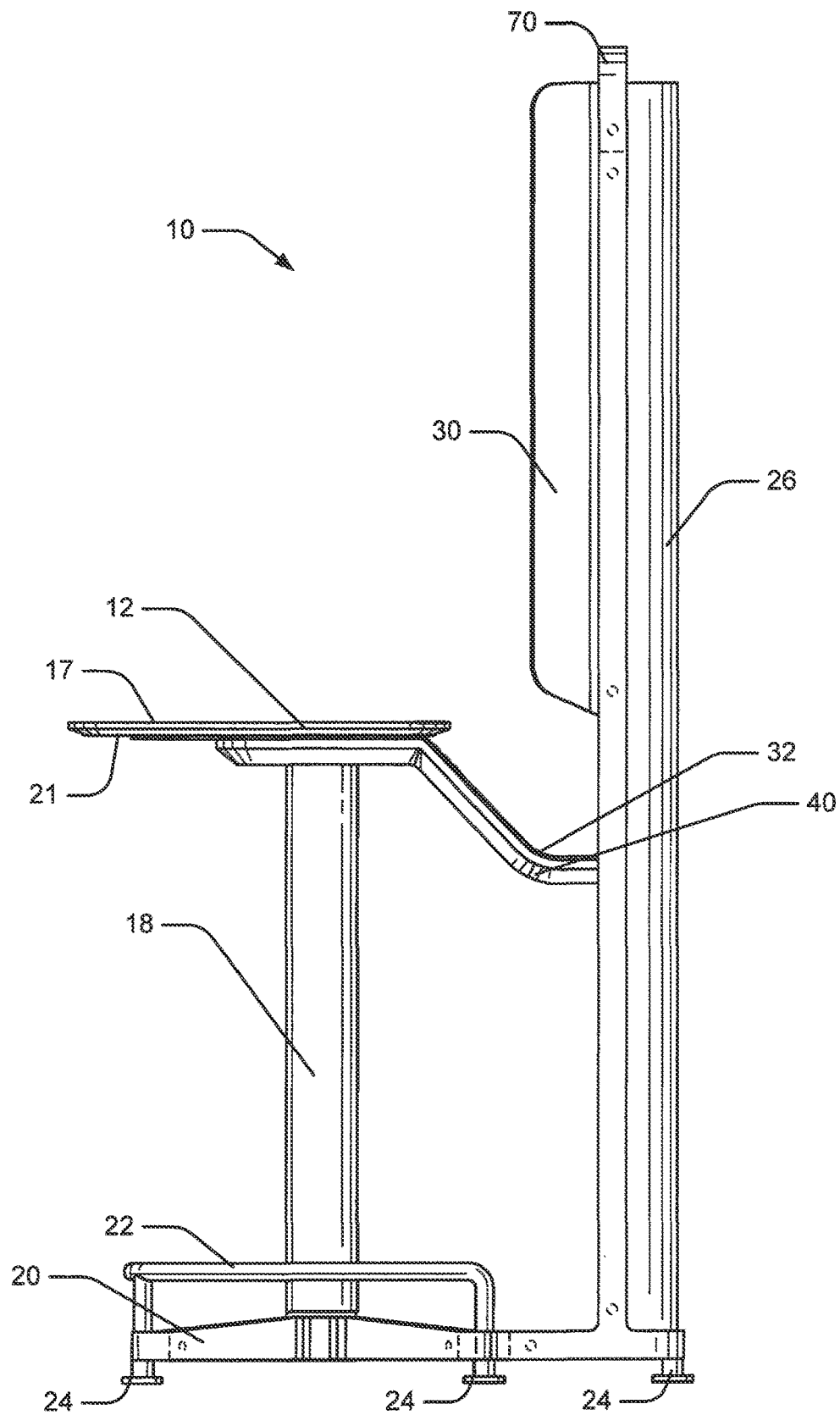
FIG. 4 is a side plan view of the assembly shown in FIG. 1.
Figure 5:
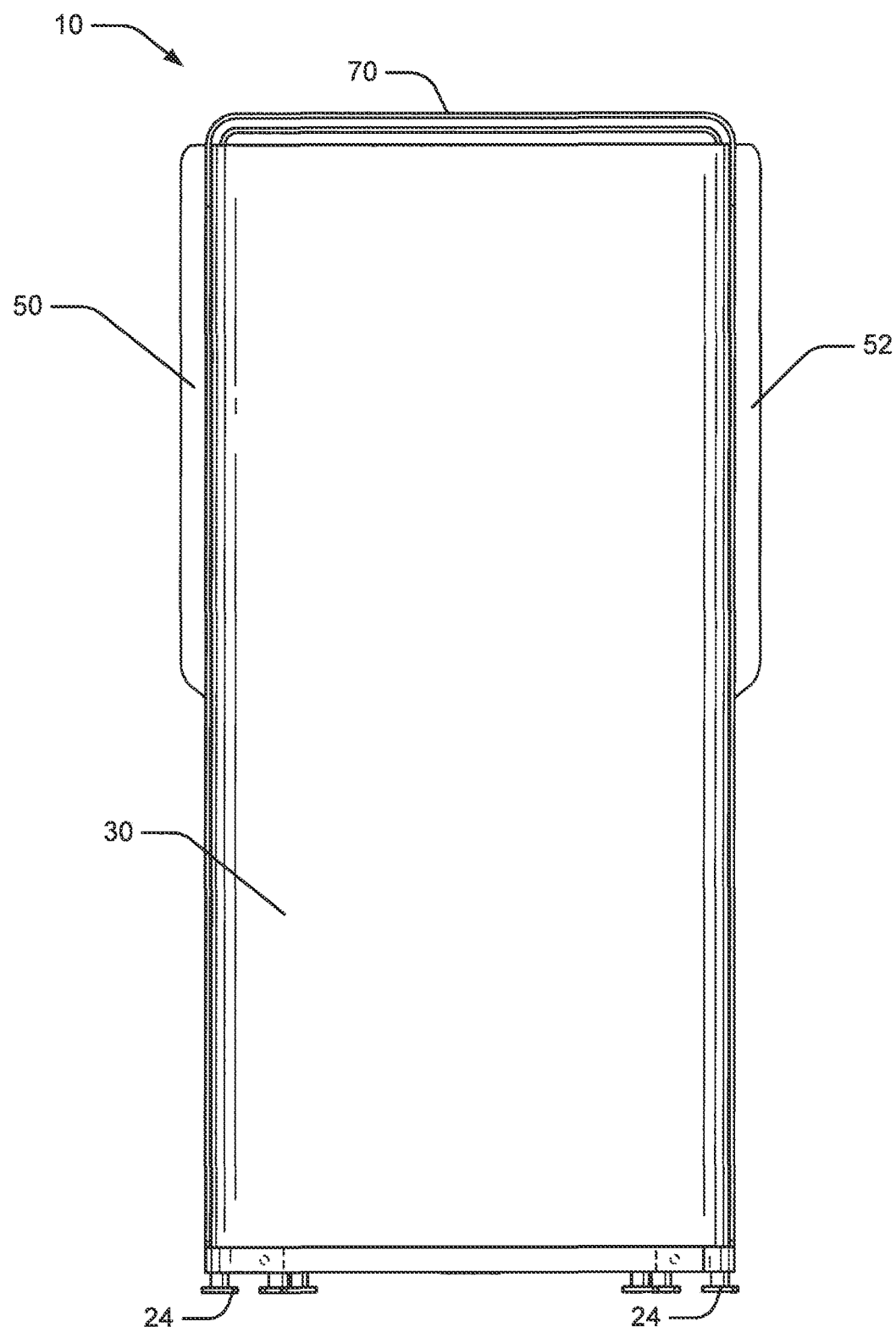
FIG. 5 is a rear plan view of the assembly shown in FIG. 1.

Referring again to FIGS. 1-4, 6-8 and 10, bridge member 32 is, in at least some embodiments, formed of bent sheet metal and, as the label implies, forms a bridging structure between front panel 28 and an undersurface 21 of table top member 12. As best seen in FIG. 4, bridge member 32 mounts to undersurface 21 and has a shape that bends downward adjacent rear edge of top member 12 at an approximately 45° angle and then bends back in the opposite direction to form a shelf surface 35 that is substantially parallel to the portion of member 32 mounted to undersurface 21 and then bends through an approximately 90° angle so that the distal end extends upward. The distance between rear edge 96 of top member 12 and the front surface of member 28 is in at least some embodiments, between twelve inches and eighteen inches, so that the shelf surface 35 is amply sized to support a book-bag or the like. The distance between front edge 90 of member 12 and the front surface of a mounted core 120 is, in at least some embodiments, approximately thirty-one inches, which it has been determined is a good distance for videoconferencing. Other front edge to screen distances may be anywhere within a range between twenty-six inches and thirty-six inches. The distal end or edge of bridge member 32 has a shape that complements the shape of the bottom edge of front panel member 28 so that the two edges generally mate. The distal end of bridge member 32 is secured to the bottom edge of panel member 28 in some fashion (e.g., via welding, or mechanical fasteners).

Referring specifically to FIG. 6, bridge member 32 forms an opening for mounting power receptacle 42 or a power/data receptacle or outlet box within the angled portion thereof just below the rear edge of top member 12 and centrally located with respect to the scallop 37 in rear edge 96.

Although not shown, in at least some embodiments, front panel member 28 and bridge member 32 may be integrally formed out of a single piece of bent sheet metal to simplify the configuration. In the regard, referring to FIGS. 1, 6 and 8, it should be appreciated that bridge member 32 has a width dimension that is less than the width dimension of the central portion 60 of front panel member 28 so that member 32 can extend from the flat central portion 60 between the curved portions of panel 28 on either side of central portion 60. Because of its juxtaposition to the central and curved portions of panel 28, bridge member 32 does not interfere with mounting of panel member 28 to the supporting frame 26.

Referring now to FIGS. 3, 4, 7, 8, 10 and 11, wire management channel forming member 40 is, in at least some embodiments, a molded plastic member that is shaped to generally mirror the undersurface of bridge member 32 and to form a central wire management channel 110 therebelow. To this end, see specifically FIG. 11 that shows a top surface 112 of channel forming member 140 that is contoured to mirror the shape of the undersurface of bridge member 32 where a channel 110 is formed in the central portion of surface 112. A mounting portion 114 of surface 112 is flat and is designed to abut the undersurface of member 32 below the table top member 12 (see again FIG. 4). At opposite ends of the channel 110, member 40 forms a table pedestal opening 116 and a second opening 118. Opening 116 is aligned with an internal portion of pedestal 18 (see again FIGS. 3 and 4) so that power and/or data cables may be run up though pedestal member 18 and into the channel 110 to link to outlet box 42 and/or to run up through the panel assembly 28, 30 in a manner to be described in more detail below to provide power to the core assembly 120. Opening 118 allows wires or cables to pass from channel 110 into the panel structure 28, 30.

Figure 10:
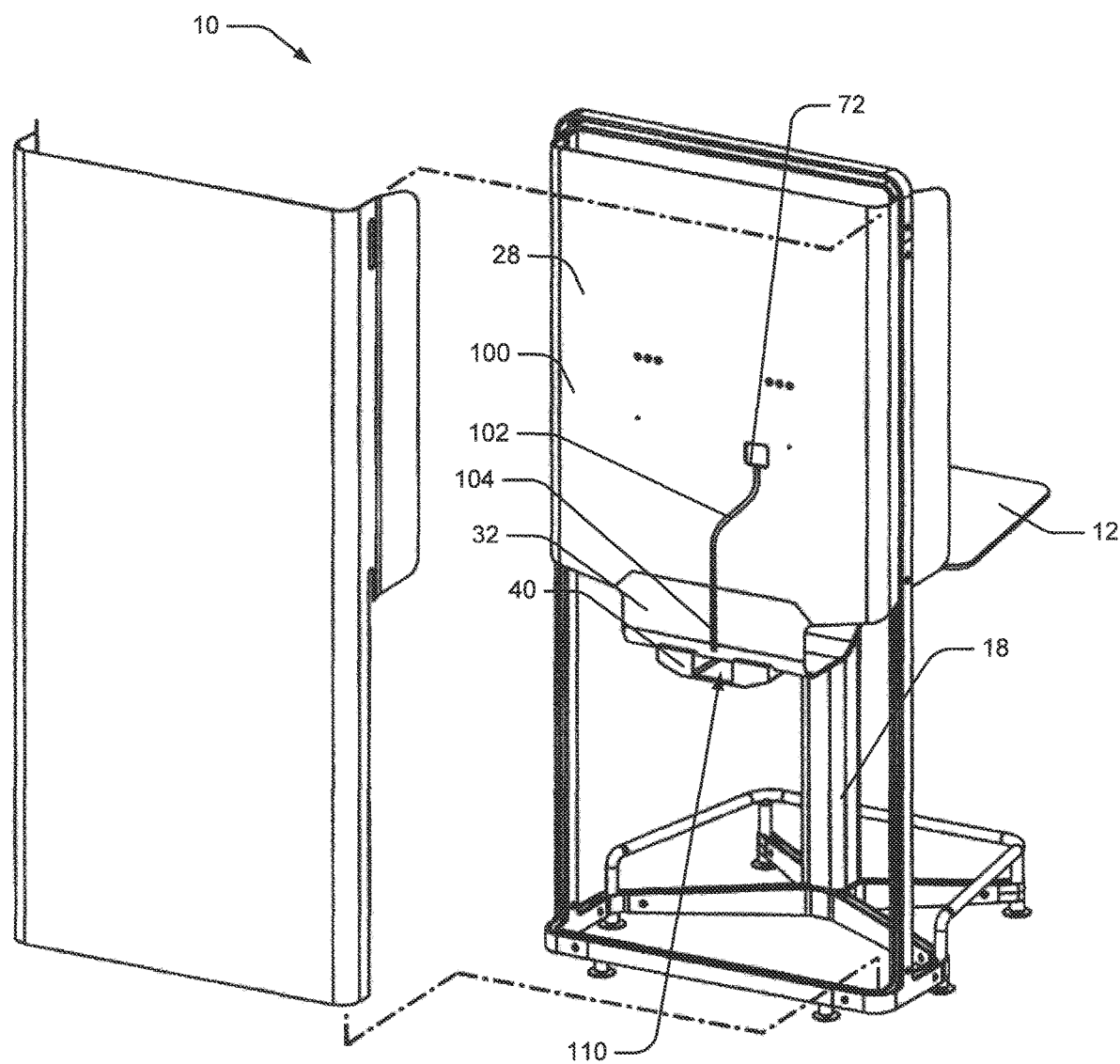
FIG. 10 is a rear perspective view of the assembly shown in FIG. 1, albeit where a rear panel member is shown in an exploded position.
Figure 11:
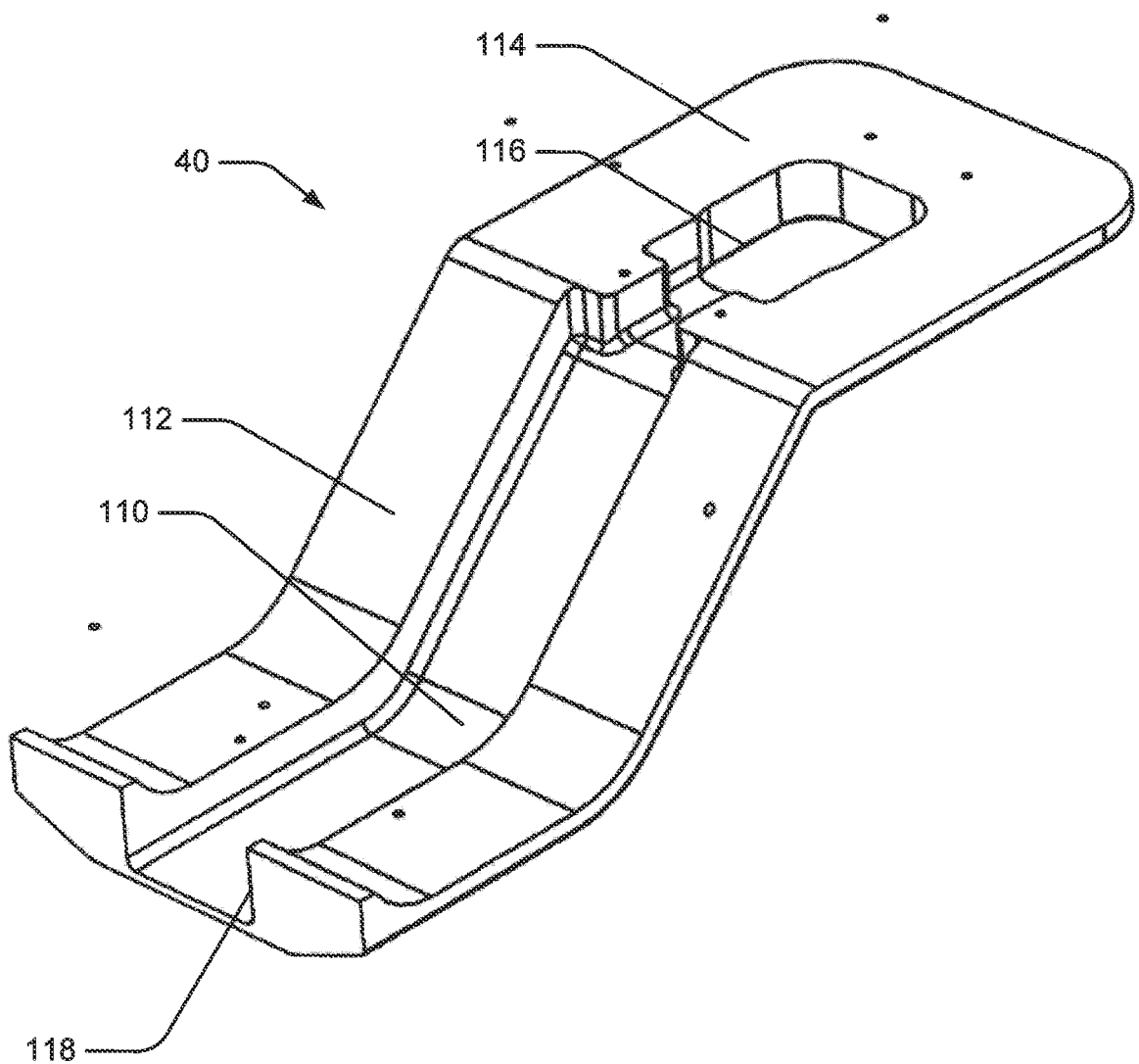
FIG. 11 is a perspective view of the channel forming member shown in FIG. 8.

Referring now to FIG. 10, front panel member 28 has a rear surface 100 that forms a channel 102 that extends from opening 72 down to the bottom edge of member 28. The channel 102 may be formed in various ways including via a simple routing procedure whereby material is removed from rear surface 100. Channel 102 should be dimensioned such that power and/or data cables that have to be run up to the core assembly 120 can fit within the channel 102 without standing proud thereof. A second channel 104 is routed or otherwise formed in a rear surface of member 32 where the second channel 104 is aligned, after assembly, with channel 102, so that the wires or cables in channel 102 can extend down through the second channel 104 and into the channel 110 formed by member 40.

Although not shown in other embodiments, instead of forming channel 102 in the rear surface of panel member 28, a similar channel could be formed in the front surface of panel member 30. In still other embodiments, aligned and mirrored channels could be formed in the facing surfaces of members 28 and 30 that together provide the depth required to accommodate assembly cables/wires. In still other embodiments, referring to FIG. 6, it may be that the relative dimensions of the panel members 28, 30 are such that when panel member 28 is mounted adjacent member 30, interference between facing surfaces of wing members of the two panel members 28 and 30 causes a slight gap (not illustrated) to occur between facing surfaces of central portions 48 and 60. Here, cables/wires would pass through the gap between the facing surfaces.

Figure 49:
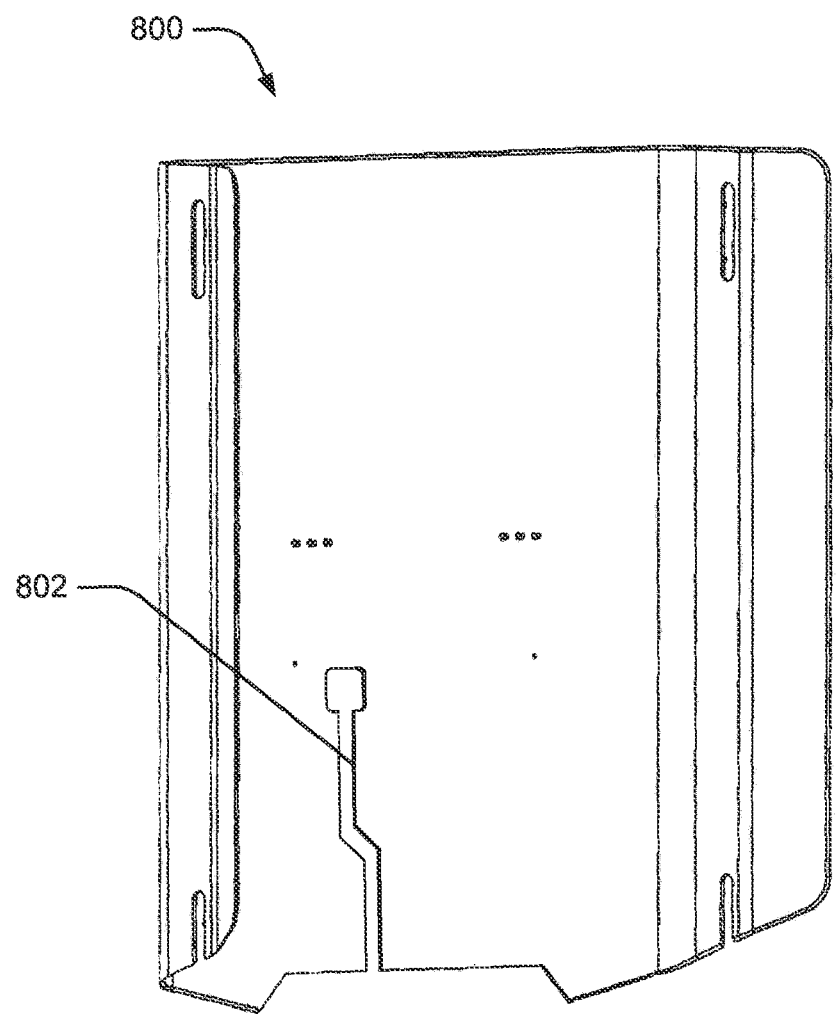
FIG. 49 is a perspective view of a central panel member that is consistent with at least some aspects of the present invention.

In still other embodiments, a three layer shroud assembly is contemplated wherein a central layer may include an opening that operates to form a channel when the central layer is sandwiched between the other two layers. In this regard see FIG. 49 that shows an exemplary central layer 800 that has a shape similar to the shape of member 28, albeit forming an opening 802 having the shape of the channel 102. The three layers or shroud members would mount to frame 26 in a fashion similar to that described with respect to the two member shroud described herein.

To construct assembly 10, referring to FIG. 9, all of the frame and base components shown in FIG. 9 except for bushings 69a and 69c and top frame member 70 can be assembled using mechanical fasteners and foot members 24 and foot rest member 22 can be assembled, also using mechanical fasteners. Next, with bushings 69a and 69c as well as top member 70 removed, power and/or data cables are passed through opening 72 (see FIG. 8) and are placed within channel 102 (see FIG. 10). Panel member 28 is positioned adjacent panel member 30 with one end of the power/data cables extending from opening 72 and the other end extending past the bottom edge of member 28. At this point, openings 54 and 63 and slots 56 and 65 are aligned.

Bushings 69a and 69c can be placed within the aligned openings 54 and 63 and the subassembly may be slid down into gap 27 (see again FIG. 3) until the slots 56 and 65 contact and are supported by upper ends of bushings 69b and 69d (see FIG. 9) and the lower edge of rear panel member 30 is supported in the gap formed by the rear portion of base 20 (see again FIG. 1). Next, top frame member 70 is slid down over the top of the already assembled structure so that ends thereof align with bushings 69a and 69c. Screws or bolts or other mechanical fasteners are used to the bushings 69a and 69c and frame components together. Pedestal 18 is mounted to base 20 and channel forming member 40 is mounted to the top end of pedestal 18. Power and/or data cables are fished through pedestal 18 and opening 116 into channel 110 (see FIG. 11). The cables that extend out opening 72 are connected to the cables in channel 110. Receptacle 42 (see FIG. 6) is connected to a power cable in channel 110. Bridge member 32 is secured to the top surface 112 of member 40 after receptacle 42 is mounted in the receptacle opening formed by member 32. Top member 12 is mounted to the top mounting surface 33 of bridge member 32.

Referring now to FIGS. 12 through 21, an exemplary multi-media core assembly 120 is illustrated that may be mounted to assembly 10 as shown in FIG. 2. In at least some embodiments, core assembly 120 includes, in addition to a flat panel display screen, other multi-media components such as speakers and a camera. The idea behind the core assembly is that all of the multi-media components that form the core will be housed in an elegant housing structure so the core assembly can be mounted and moved together as a single assembly to any substantially vertical upright wall surface or support structure. Thus, while core assembly 120 is shown mounted to the front surface of member 28 in FIG. 2, it should be appreciated that core assembly 120 could be used in many other applications to provide similar functionality. For instance, core assembly 20 may simply be mounted to a convention wall in an open floor plan facility.

In addition, the illustrated core assembly 120 includes components mounted substantially within the housing structure that includes the multi-media components that enables height adjustment of the core assembly to accommodate users of different heights in an optimal fashion. The height adjustability of the core assembly is particularly advantageous in the case of videoconferencing systems where eye-to-eye contact between conferees is important.

Figure 18:
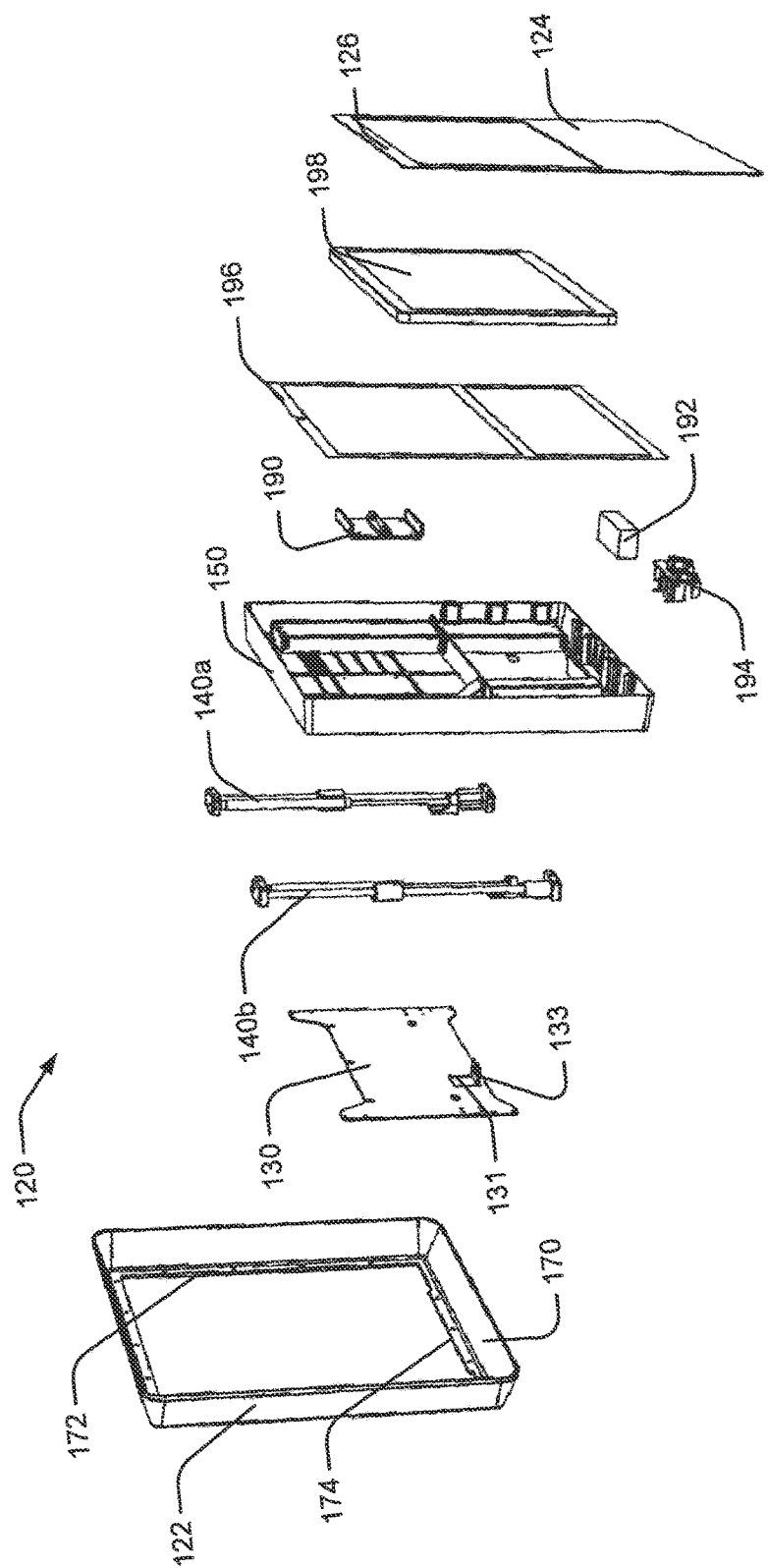
FIG. 18 is an exploded view of the core assembly shown in FIG. 12.

Referring specifically to FIG. 18, assembly 120 includes a frame member 122, a mounting plate 130, first and second pre-loaded spring subassemblies 140a and 140b, respectively, an internal shell structure 150, a vesa mounting plate 190, an power strip 194, a speaker type audio box 192, an internal frame member 196, a flat panel display including a camera 198 and a glass cover member 124.

Figure 17:
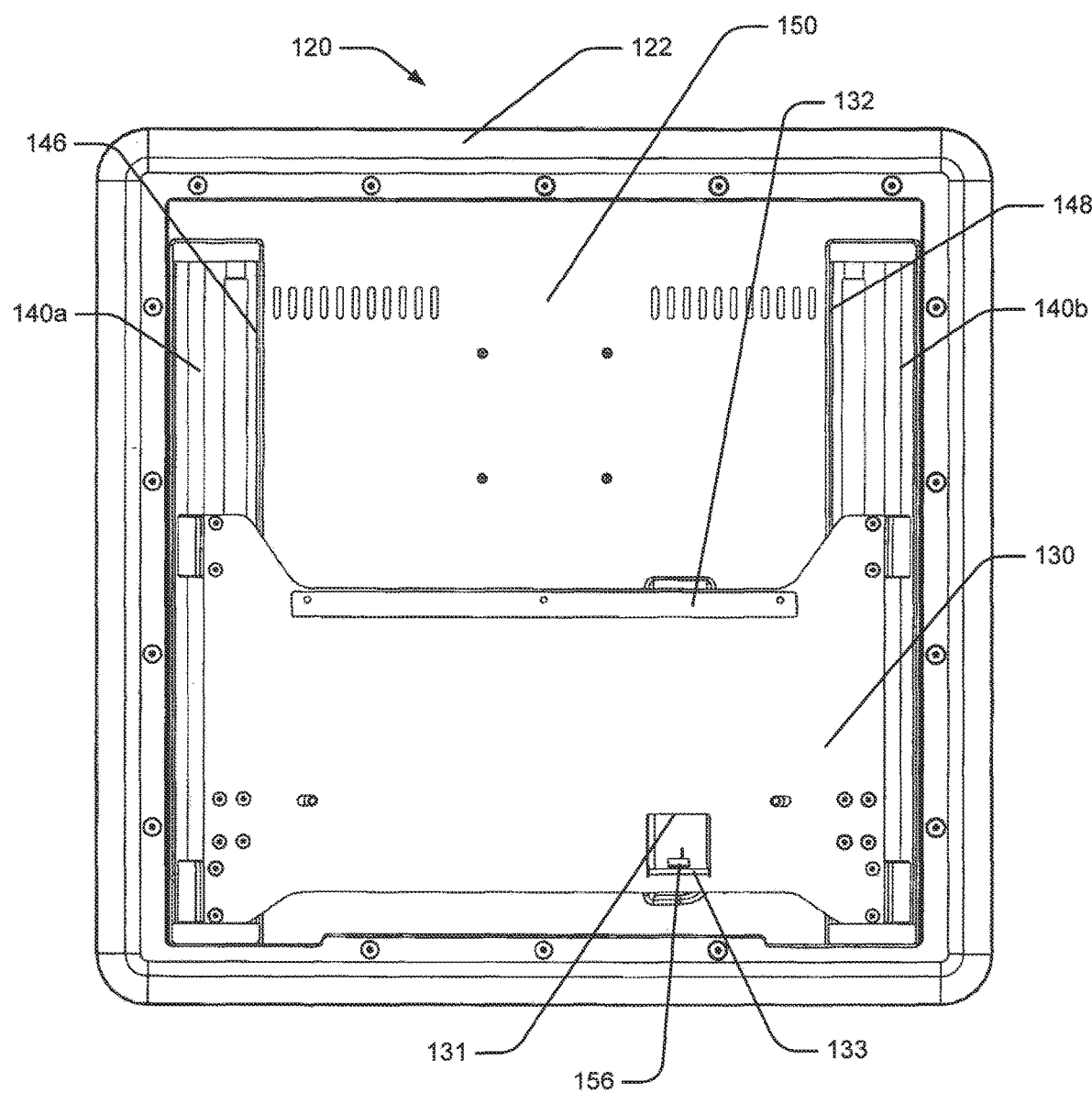
FIG. 17 is a rear plan view of the core assembly shown in FIG. 12.
Figure 19:
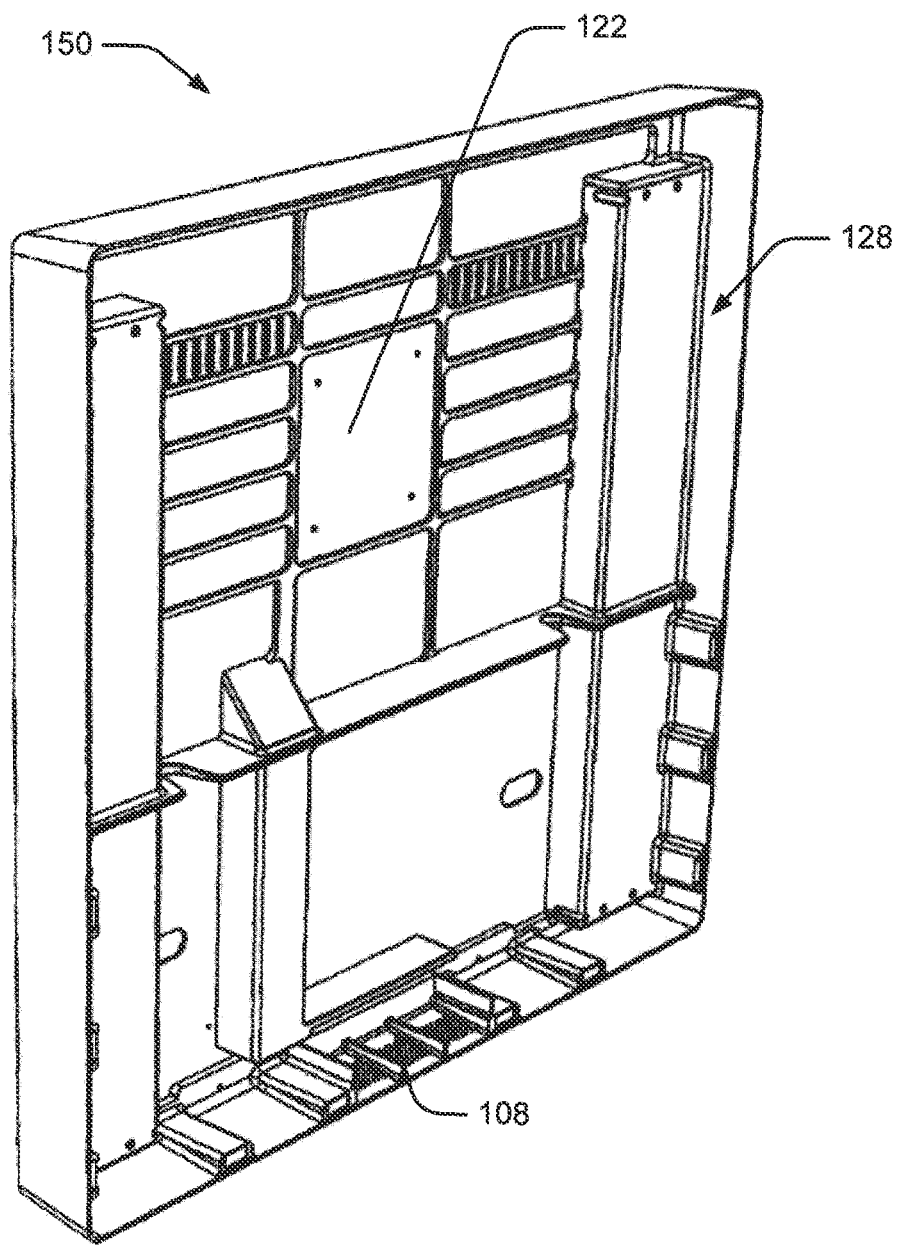
FIG. 19 is a perspective view of the shell assembly shown in FIG. 18.
Figure 20:
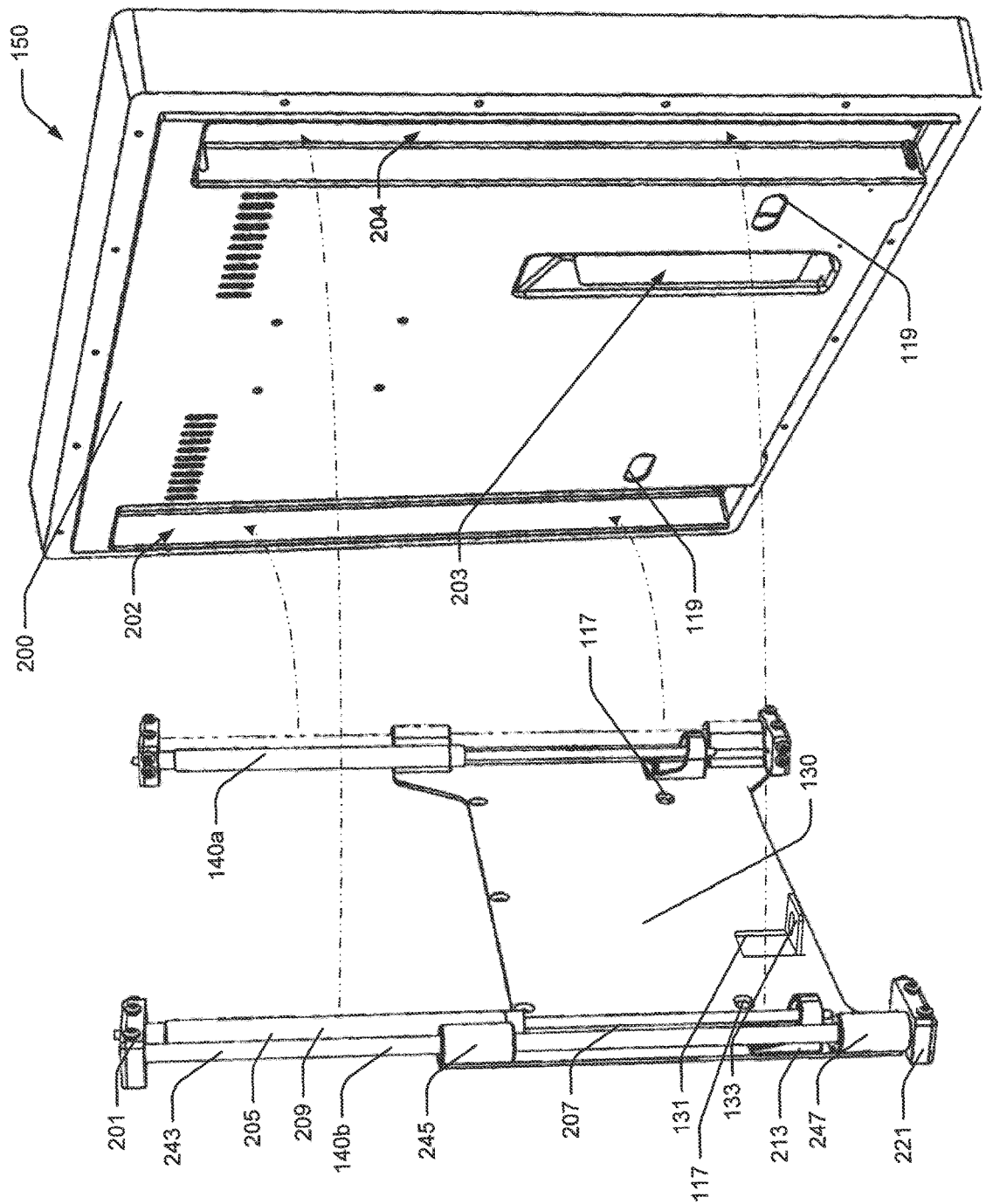
FIG. 20 is a partially exploded view of a subset of the components shown in FIG. 18 including a mounting plate, a shell assembly and height adjustment subassemblies.

Referring also to FIGS. 17, 19 and 20, internal shell structure 150 forms several different compartments in which many of the other core assembly components are installed. Structure 150 forms a large chamber or compartment 128 that opens to a front side. The walls that form compartment 128 include various features that are formed to facilitate mounting of other components. For example, a flat central surface 122 is formed for mounting vesa plate 190 via four bolts or screws. Display screen 198 is mounted to vesa plate 190 in a manner well known in the art to secure display 198 within compartment 128. In addition, power strip 194 and audio box 192 are mounted to an internal surface of a bottom wall 108 within compartment 128. A lower wall of shell structure 150 forms a plurality of openings (at 108) to form a screen just below where audio box 192 mounts once installed. The holes 108 allow sound from audio box to emanate from within compartment 128.

Referring to FIG. 20, a rear surface 200 of shell structure 150 forms a plurality of chambers or compartments 202, 203 and 204 for receiving various assembly components. Specifically, preload spring or height adjustment subassemblies 140*a* and 140*b* are mounted within chambers 202 and 204, respectively, via top and bottom mounting plates 201 and 221 (only two labeled). A power receptacle mount shelf 133 that extends from mounting plate 130 extends into chamber 203 after assembly.

Referring again to FIG. 18, spring subassemblies 140*a* and 140*b* are similarly constructed and operate in a similar fashion. Each of assemblies 140*a* and 140*b* includes a gas spring 205 (see FIG. 20). Exemplary spring 205 includes a spring rod 207 extending from a housing 209 where housing 209 remains stationary with respect to shell 150 after installation and rod 207 moves in a telescopic fashion with respect to housing 209 during core height adjustment. To this end, a distal end of rod 207 mounts via a connector bracket 213 to mounting bracket 130 so that bracket 130 moves along with the distal end of the rod 207. Each assembly 140*a* and 140*b* also includes a guide rod 243 that extends between plates 201 and 221 and bracket 130 mounts to two cylindrical guide sleeves 245 and 247 that slide along rod 243 during core height adjustment. The gas springs are preloaded to ensure that core 120 stays at the location at which it is set until purposefully moved by a user. After assembly, shell structure 150 and components mounted thereto move with respect to mounting plate 130 as the height of the core assembly is changed by a user.

Plate 130 is formed of sheet metal and a portion is cut out and bent in a forward direction to form power receptacle mount shelf 133 and opening 131. As described above, shelf 133 is formed so that, upon assembly, the shelf 133 aligns with chamber 203 (see FIG. 20). As shell 150 and components mounted thereto move with respect to plate 130, shelf 133 remains stationary with chamber 203 moving up and down relative to shelf 133 so that the shelf 133 does not obstruct movement of the other core components. As best seen in FIG. 17, a power outlet connection 156 is mounted to shelf 133.

Also shown in FIG. 17, bracket 132 is provided on a rear surface of mounting plate 130. Bracket 132 is configured to cooperate with bracket 74 (see again FIG. 8) that is mounted on the front surface of panel 28 or to some other bracket similar to bracket 74 to maintain core assembly 120 in a supported position. Exemplary bracket 74 comprises an upwardly extending lip along its length while bracket 132 comprises a downwardly extending lip sized and dimensioned to cooperate in a coupling fashion. Additional bolts or screws (not shown or labeled) pass through plate holes 117 and into holes 76 (see FIG. 8) to secure plate 130 to front panel member 28. Holes 115 (see FIGS. 19 and 20) enable access to holes 117 for installing mounting screws after core assembly 150 is temporarily mounted to member 28 are brackets 74 and 132.

Referring again to FIG. 18, frame member 122 includes a generally rectangular side wall member 170 that, upon installation, frames the external side surfaces of shell structure 150 and a rear lip member 174 that extends inward to form a flange around a rear rectilinear opening 172 formed by member 122. An internal surface of flange 174 forms a mounting surface for mounting frame member 122 to the rear surface 200 of shell structure 150 via screws, bolts or other types of mechanical fasteners. The side wall 170 of frame member 122 extends forward adjacent the external surface of the side wall that forms shell structure 150 and flares out slightly therefrom when moving in the forward direction so that a space or gap exists between facing side walls of member 170 and structure 150.

Referring yet again to FIG. 18, after display 198 is mounted via plate 190 within shell structure 150, frame 196 is installed on the forward facing rim of shell structure 150 to provide a mounting surface for glass cover member 124. Member 124 is adhered to a front facing surface of frame 196 to provide a completely smooth and seamless front surface to the core assembly 120. Prior to installing glass cover 124, a silk screening or other similar type process may be used to apply a black or other colored layer 126 to the rear surface of glass cover member 124 in areas of the glass cover member that are not aligned with the display screen 198 to thereby hide the internal components and structural features within the shell structure 150.

Figure 12:
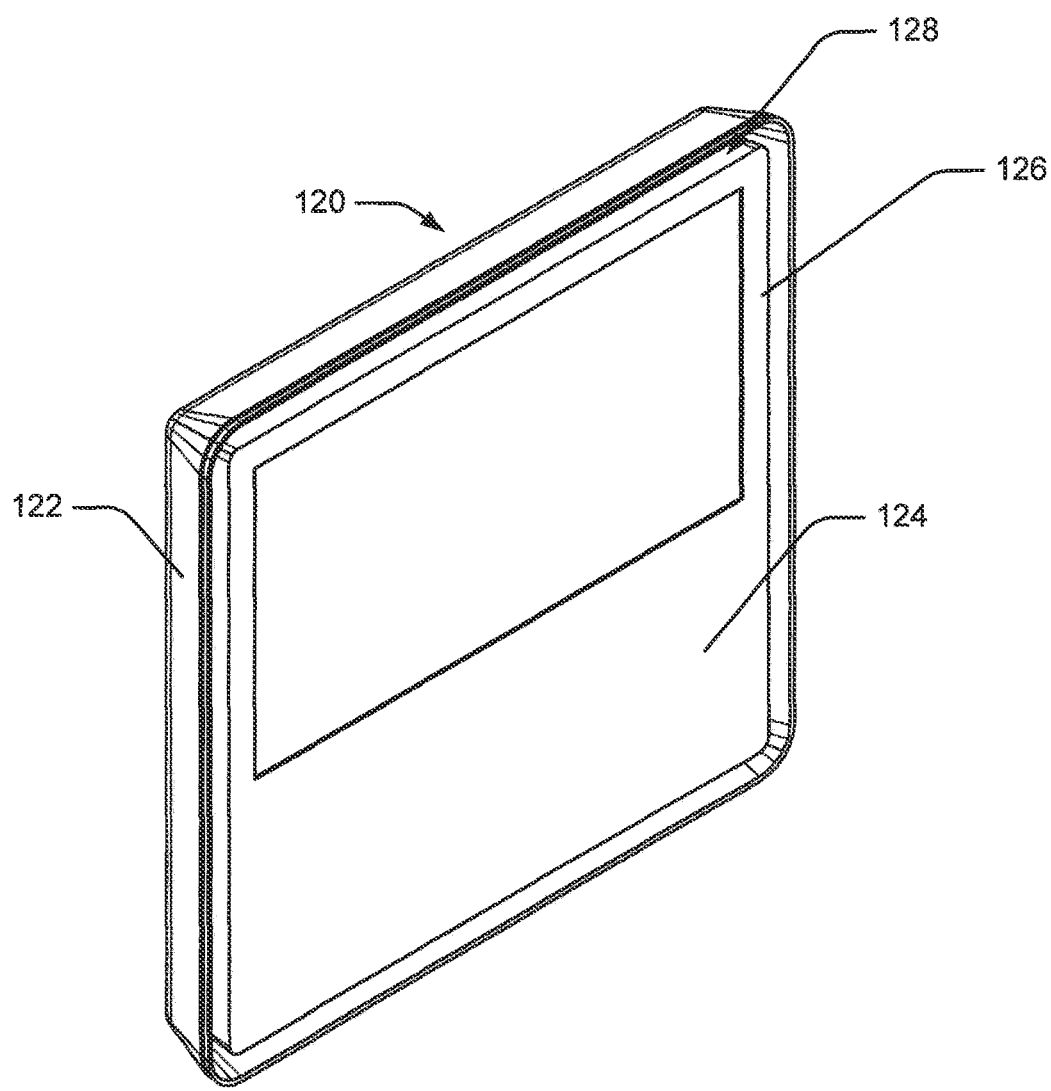
FIG. 12 is a perspective view of the core assembly shown in FIG. 2.
Figure 13:
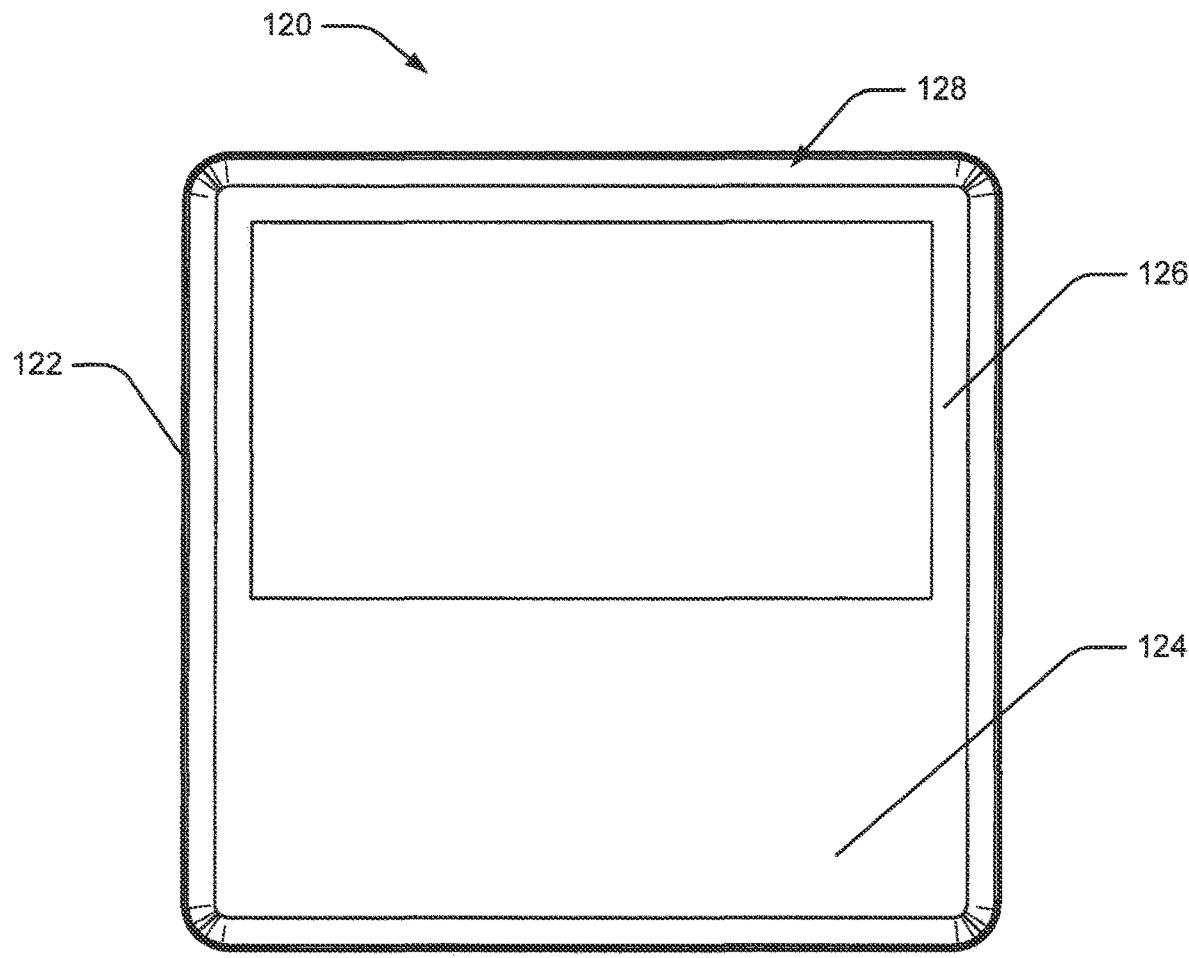
FIG. 13 is a front plan view of the core assembly of FIG. 12.
Figure 14:
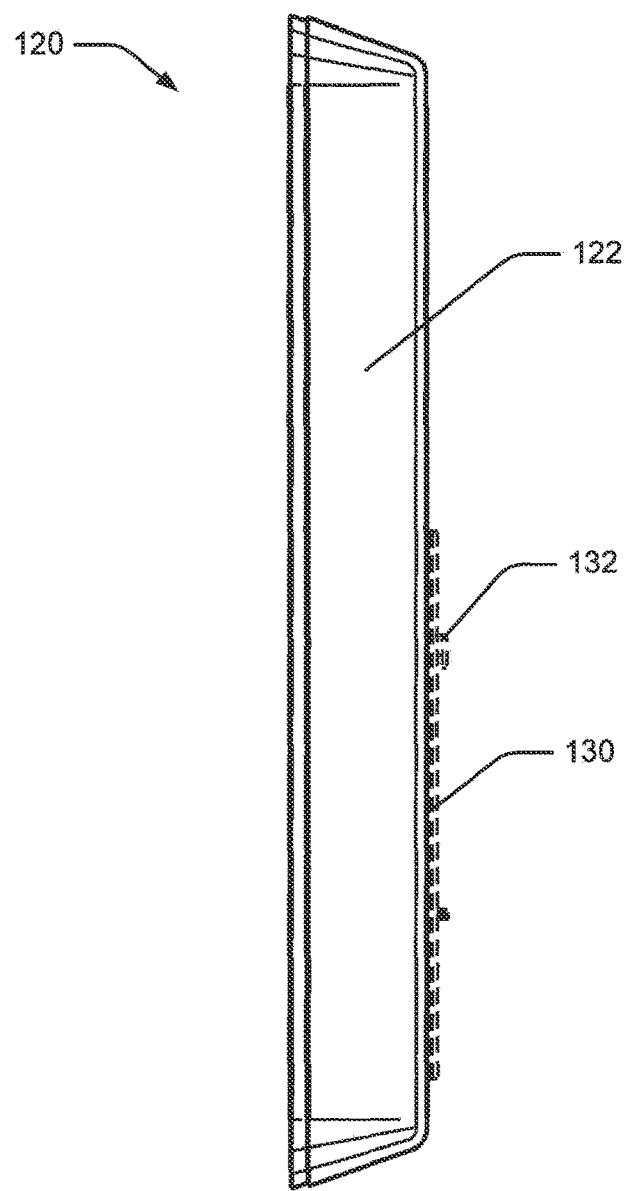
FIG. 14 is a side plan view of the core assembly shown in FIG. 12.
Figure 15:
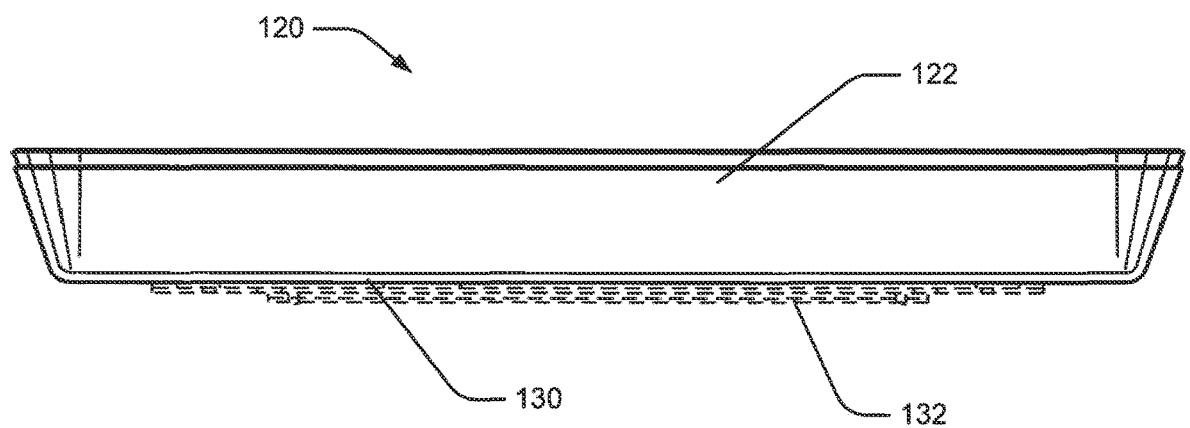
FIG. 15 is a bottom plan view of the core assembly shown in FIG. 12.
Figure 16:
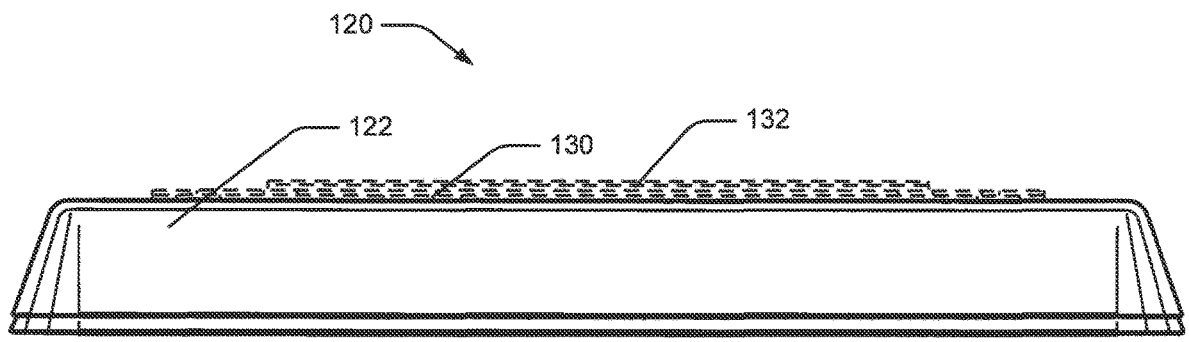
FIG. 16 is a top plan view of the core assembly shown in FIG. 12.

Referring specifically to FIGS. 12 and 13, the glass cover 124 is dimensioned such that, after installation, a gap 128 is formed between the outer edge of glass member 124 and the adjacent and facing edge of frame member 122. In at least some embodiments, the gap 128 may be approximately 1 inch while in other embodiments the gap 128 may range between ¼ inch and 2 inches. Gap 128 allows sound from audio box 192 to reverberate and exit the core assembly 120 directionally toward a person standing in front of the core assembly 120.

Figure 21:
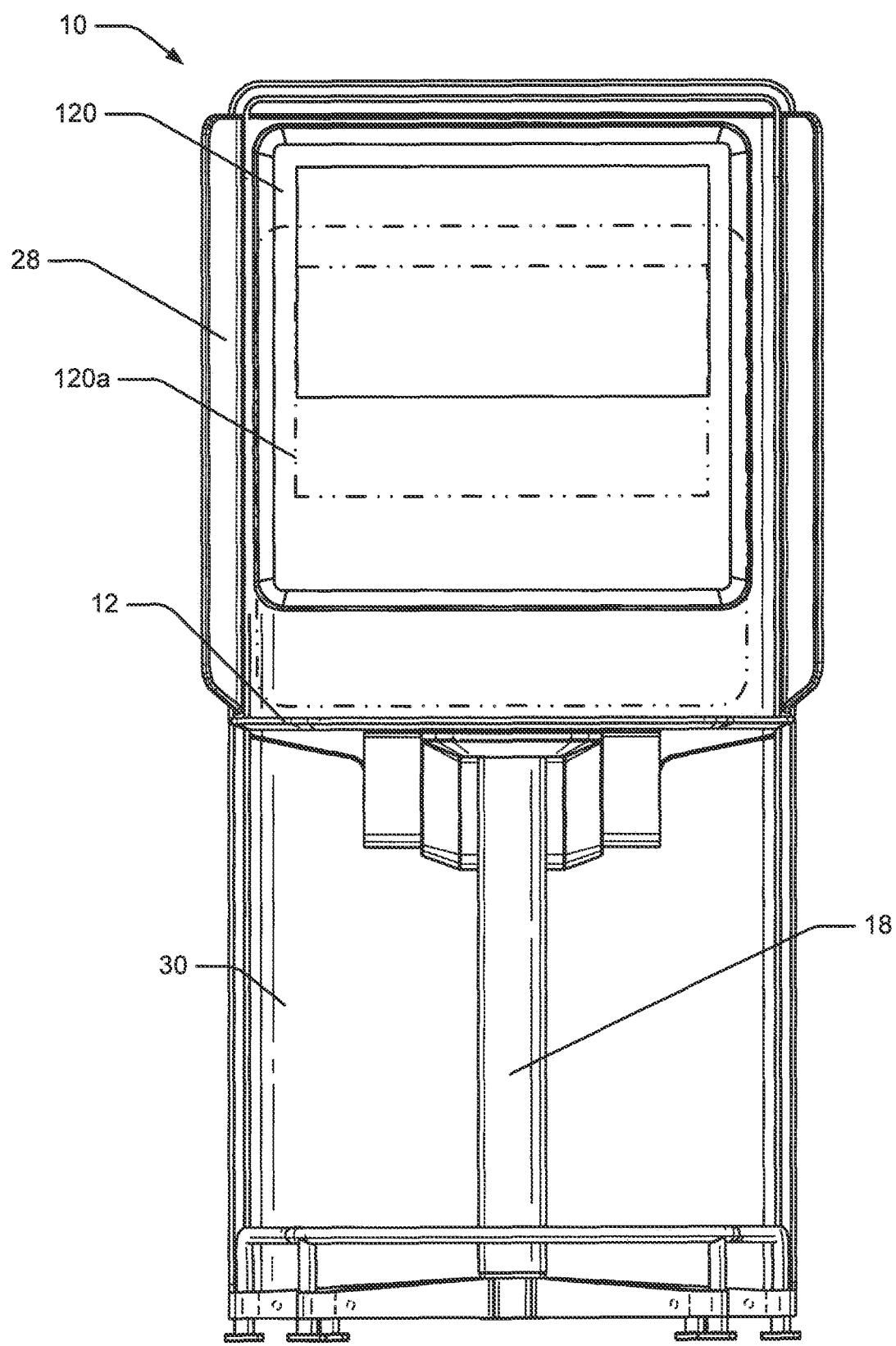
FIG. 21 is similar to FIG. 3, albeit showing the core assembly of FIG. 12 mounted to the support structure and also showing the core assembly in phantom in a second position.

Referring now to FIG. 21, after core assembly 120 is mounted to a support structure via mounting plate 130 (see again FIG. 17), a user can change the height of core assembly 120 by simply grasping frame member 122 and raising or lowering assembly 120 as desired. The gas springs in the spring subassemblies 140*a* and 140*b* should assist the user in changing the height of the assembly so that very little effort is required.

In FIG. 21, core assembly 120 is shown in a relatively high position and is shown in phantom at 120*a* in a relatively low position after height adjustment. In some embodiments the range of height travel may be approximately eight inches while in other embodiments the range may be anywhere from four to sixteen inches.

Figure 22:
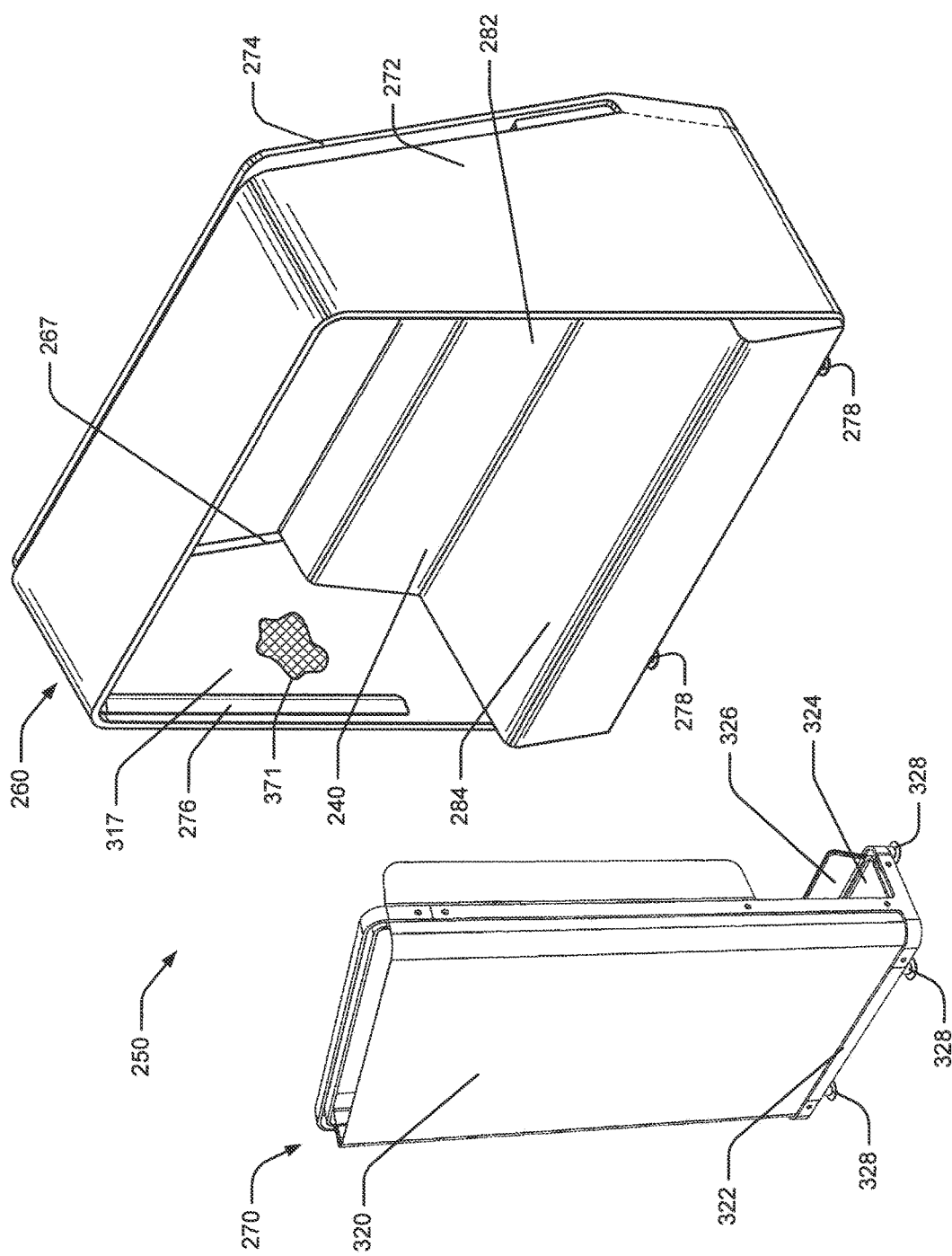
FIG. 22 is a perspective view of a furniture configuration that is consistent with at least some aspects of the present invention.

Referring now to FIG. 22, a furniture configuration 250 that is consistent with at least some aspects of the present invention is illustrated. Configuration 250 includes a lounge assembly 260 and a lounge height core support assembly 270 that is specifically configured for use with lounge assembly 260 or other similar structures. Referring also to FIGS. 23 through 28, lounge assembly 260 includes a lounge subassembly 240 and a arch sub assembly 272. The lounge subassembly 240 includes a backrest support structure 282 which is rigidly secured to a seat support structure 284. Although not shown in detail, structures 282 and 284 may be formed of plywood wrapped in foam and covered with a fabric material. In at least some embodiments, all but the undersurface of lounge subassembly 240 is covered with fabric and foam material. Height adjustable foot assemblies 278 are mounted to the undersurface of lounge subassembly 240 and each of assemblies 278 can be independently adjusted to compensate for undulations in a support floor. In at least some embodiments lounge subassembly 240 will have a width dimension of approximately fifty-eight inches.

Arch subassembly 272 includes a plurality of components including a technology ribbon 276, an arch substructure 290, a foam layer 291, and a rear screen subassembly 274. Arch substructure 290 is formed of rigid sheet material such as bent sheet metal, plywood or particle board, that includes a plurality of generally planar members that are secured together along edges by rounded corner pieces to form an arch structure. The overall structure includes first and second sidewall members 296 and 297, respectively, a ceiling member 290, and first and second bottom mounting flanges 300 and 302, respectively.

Sidewall members 296 and 297 are generally vertically upright and parallel members and include a substantially straight and vertical front edge and a rear edge that diverges away from the front edge when moving from the bottom end toward a top end up to about the height of the top surface of the seat structure 284 at which point the rear edges converge toward the front edge 313 until the rear edges reach the ceiling member. The ceiling member is generally a rectangular member and traverses the distance between rounded corner portions that connect the top ends of sidewall members 296 and 297. Flanges 300 and 302 extend from the bottom edges of wall members 296 and 297 at essentially right angles and extend toward each other to form mounting flanges for mounting arch substructure 290 to an undersurface of lounge subassembly 240 (see FIG. 27) via mechanical fasteners (e.g. bolts, screws, etc.) which are not illustrated.

Figure 28:
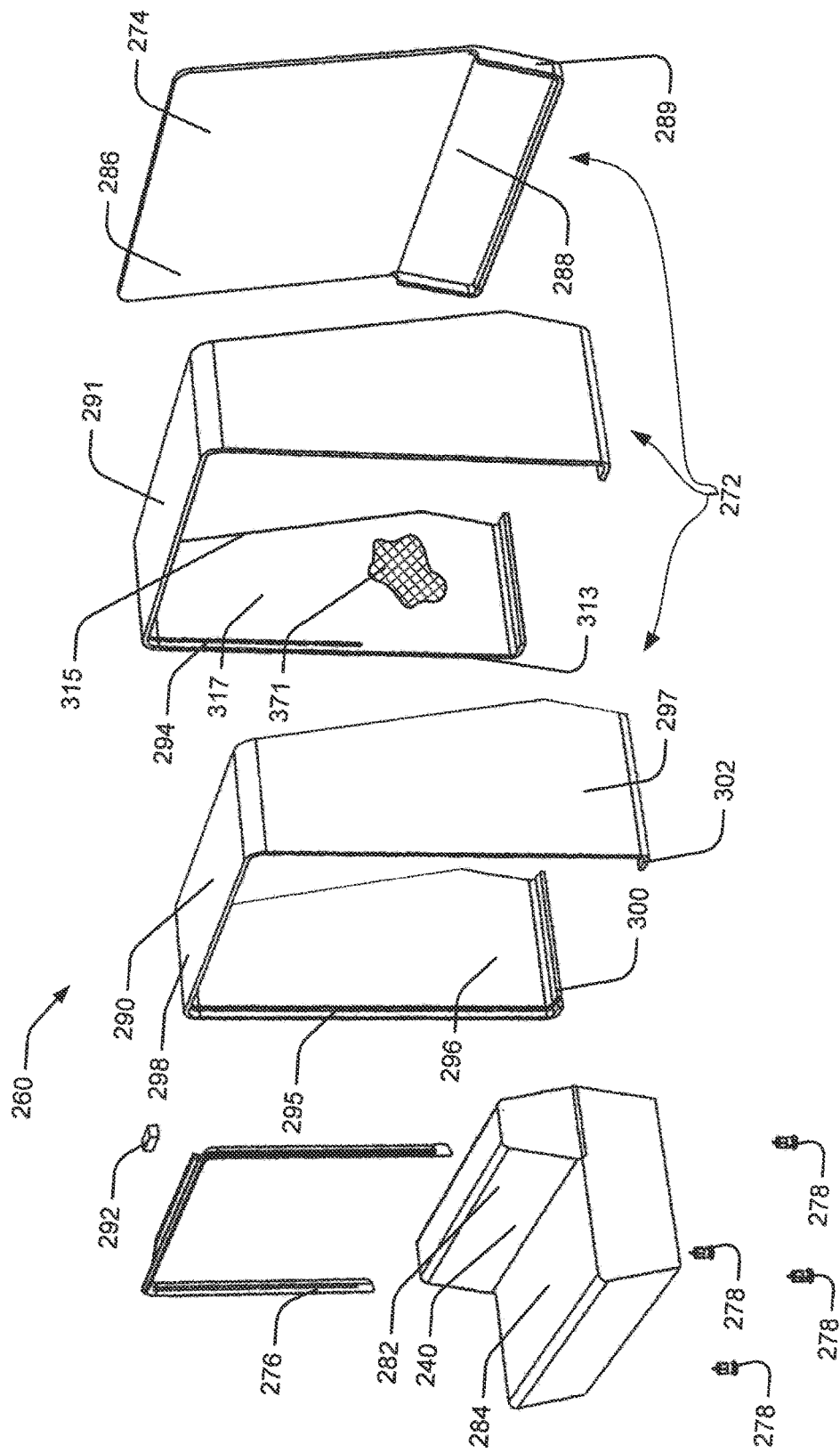
FIG. 28 is a partially exploded view of the lounge assembly shown in FIG. 22.
Figure 32:
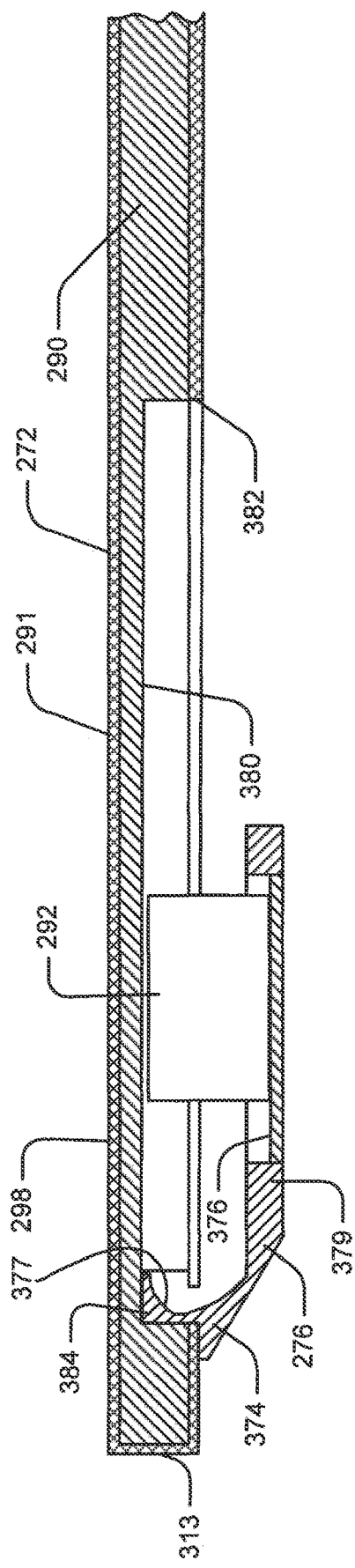
FIG. 32 is a cross-sectional view taken along the line 32-32 in FIG. 31.

Referring still to FIG. 28, arch substructure 290 forms a recessed channel 295 along an internal surface and adjacent the front edge of each of the ceiling member 290, the sidewall members 296 and 297 and at least one of the mounting flanges 300 and 302. Channel 295 is provided for receiving at least a portion of the technology ribbon 276 which will be described in greater detail below. Referring also to FIG. 32, ceiling member 290 forms a larger recess or channel 380 which receives part of the ribbon 276 and also may provide space for other components such as an audio box 292 including speakers, and amplifier, etc., as illustrated.

Arch substructure 290, in at least some embodiments, will have a height of approximately sixty-six inches although other heights in the range between sixty and seventy-two inches are contemplated.

Referring again to FIG. 28, arch foam 291 is a material structure which is provided to increase sound insulation within the space defined by the arch subassembly 272. To this end, arch foam 291 has a shape similar to the shape of arch substructure 290 and may be applied to an external surface thereof. Foam 291 forms a slot or slit 294 along the internal portion of sidewall members thereof which aligns with channel 295 formed by substructure 290 after assembly. Slot 294 only extends part way down each of the sidewall portions of foam 291 so that after technology ribbon 276 has been installed, the entire slot 294 along the sidewall portions is hidden. Referring again to FIG. 32, foam 291 also forms a large opening 382 aligned with channel 380 on the under surface portion of the ceiling portion thereof. Fabric cover 371 is secured to foam layer 291 and, in at least some embodiments, is selected to "glow" or reflect light shone thereon to "fill" the arch space with light, particularly during videoconferencing.

Figure 25:
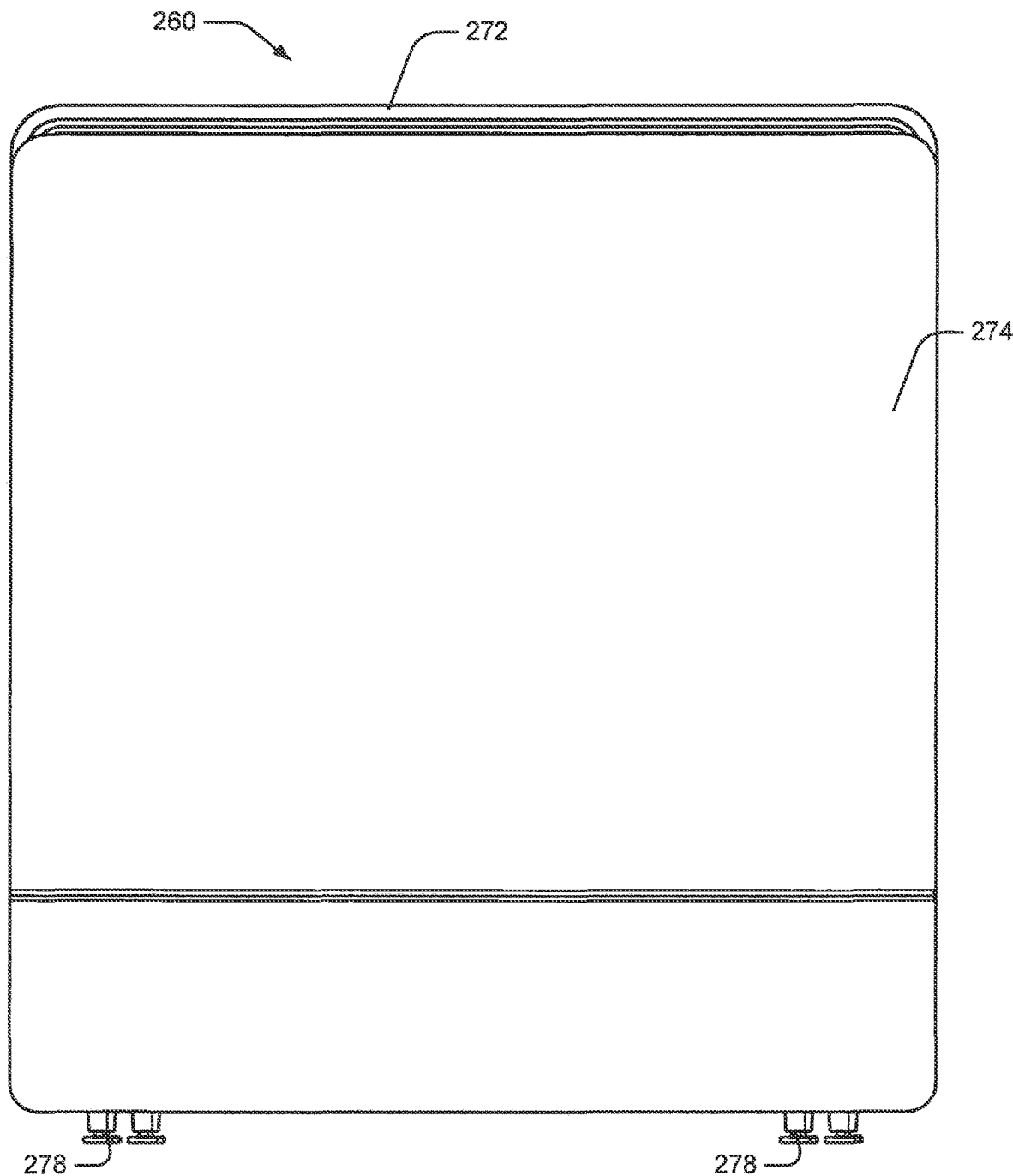
FIG. 25 is a rear plan view of the lounge assembly shown in FIG. 22.
Figure 26:
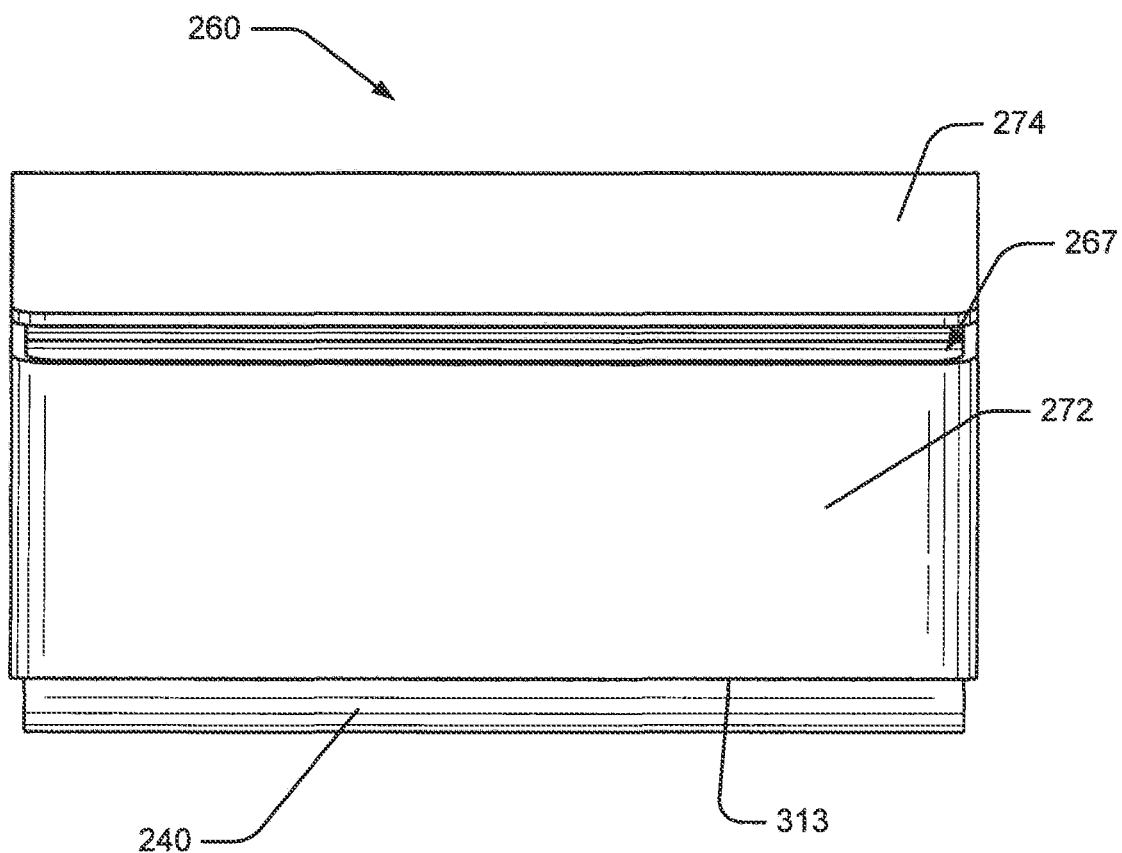
FIG. 26 is a top plan view of the lounge assembly shown in FIG. 22.
Figure 27:
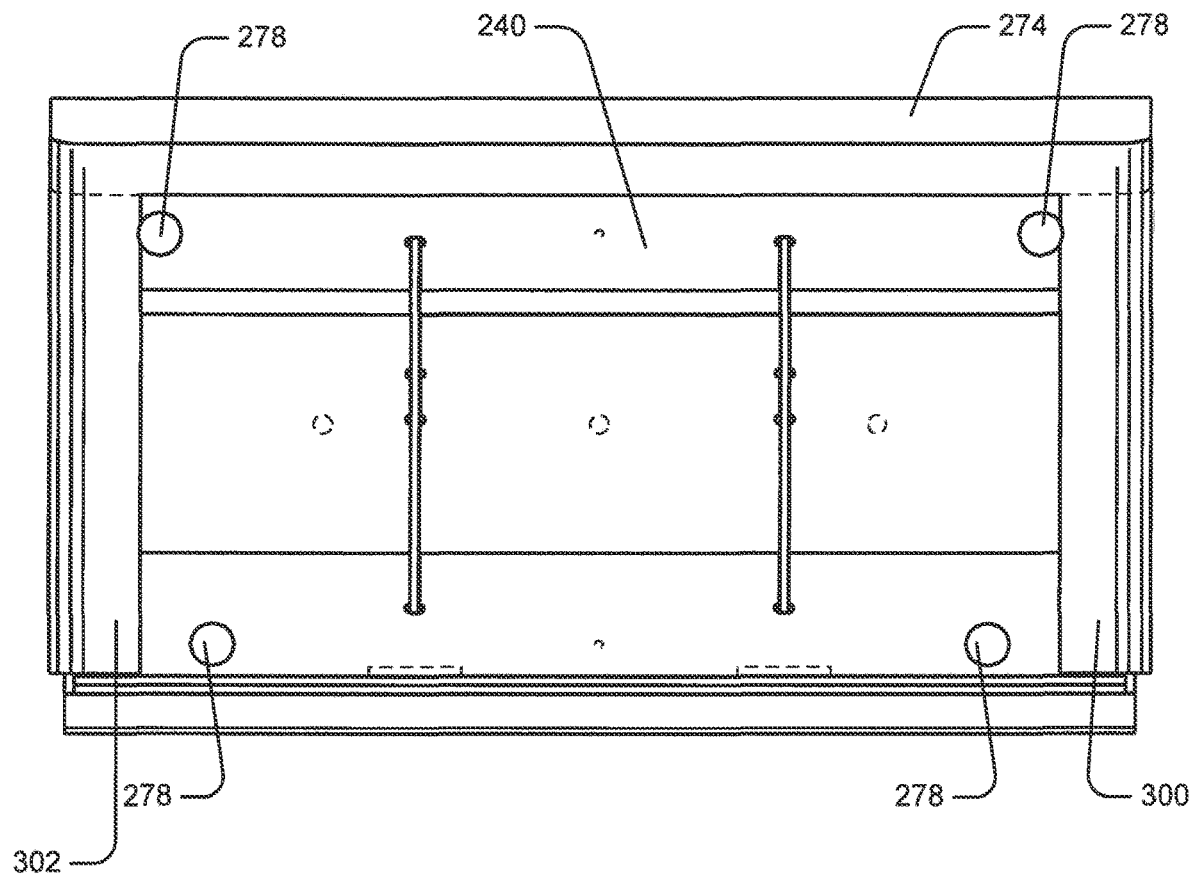
FIG. 27 is a bottom plan view of the lounge assembly shown in FIG. 22.

Referring once again to FIG. 28, rear screen subassembly 274 is a rigid structure that forms a back wall of the arch subassembly 272. To this end, rear screen 274 may be formed of plywood, bent sheet metal, rigid plastic, particleboard, etc. Exemplary screen 274 includes a relatively large rectilinear planer member 286 that has a shape similar to the shape defined by the upper portion of arch substructure 290 as best seen in FIG. 25 so that member 286 can substantially block a person's view into the space defined by the substructure 290 when the person is located to the rear of the assembly 260. Screen 274 also includes a lower member 288 integrally formed with rectilinear member 286 that has a shape similar to the bottom edge portion of the arch substructure. A lip 289 extends forward from bottom and side edges of lower member 288. Screen 274 is mounted to the lower edge portion of arch substructure 290 to extend upwards to the rear of lounge subassembly 240 after assembly.

Figure 24:
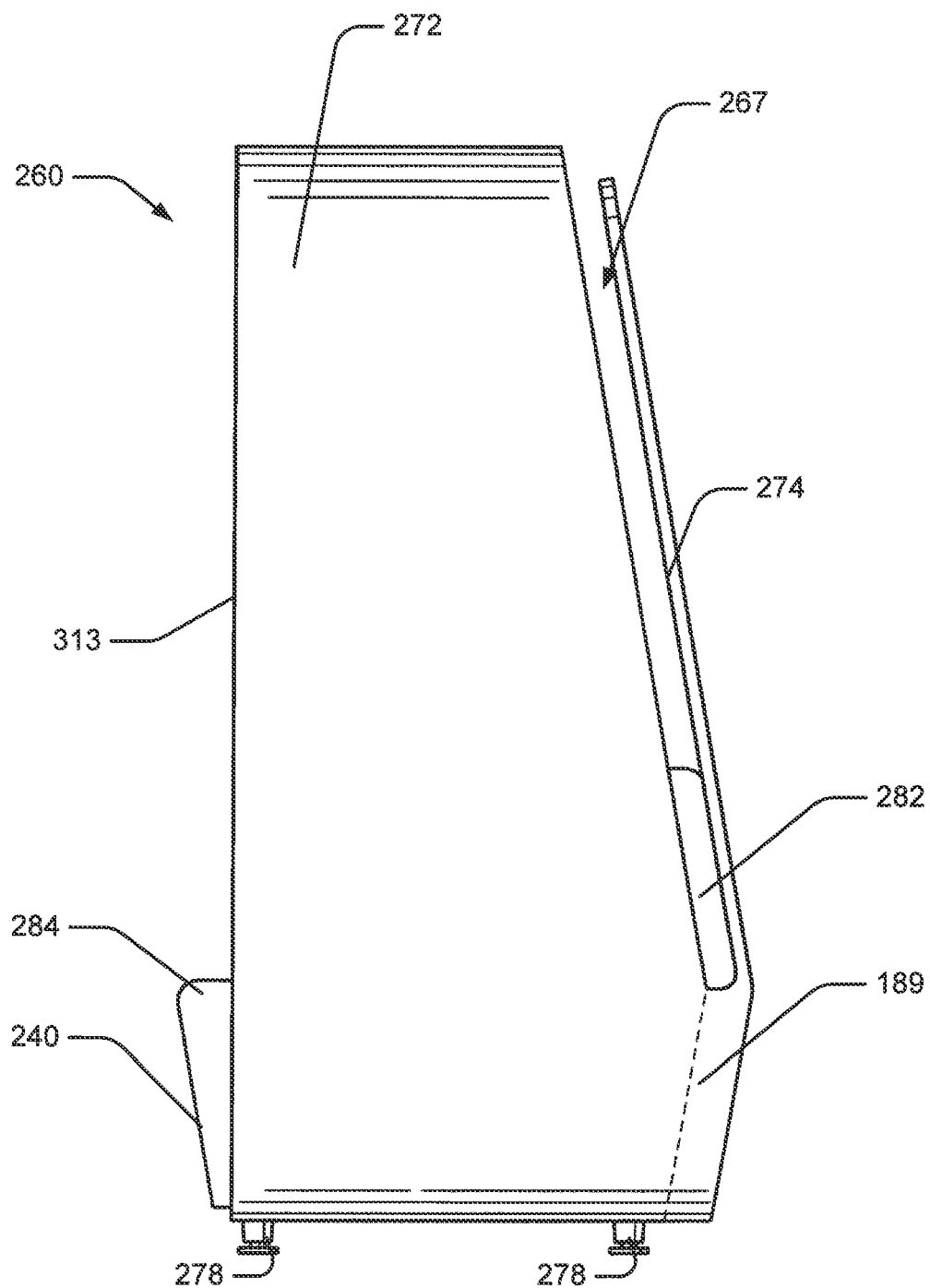
FIG. 24 is a side plan view of the lounge assembly shown in FIG. 22.

Referring to FIG. 24, after installation, the lip 289 operates as a spacer between the top portion of the rear edge of structure 290 and a facing surface of screen 274 so that a gap 267 (e.g., one to five inches) is formed. Gap 267 affords a person seated on lounge 240 a sense of their surroundings as the person has the ability to perceive other persons adjacent arch 260 while still providing a certain amount of privacy. Although not shown, a fabric cover or foam and fabric cover may also be provided for screen 274 for sound deadening as well as to provide a desired appearance.

Referring again to FIGS. 22 through 28, while assembly 260 is described above as including opaque materials and as being covered by fabric, in at least some embodiments, arch assembly 260 may be formed of semi-transparent material to provide privacy yet further enhance a sense of a user's surroundings. Here, for instance, the subassembly 260 may be constructed of or at least include portions constructed of a material having the translucency of a milk carton so that a person located within the arch defined space could perceive presence of another person adjacent the space without the person outside the space seeing any detail inside the space. In other cases screen 274 may be semi-transparent while the arch substructure 290 is opaque.

Figure 29:
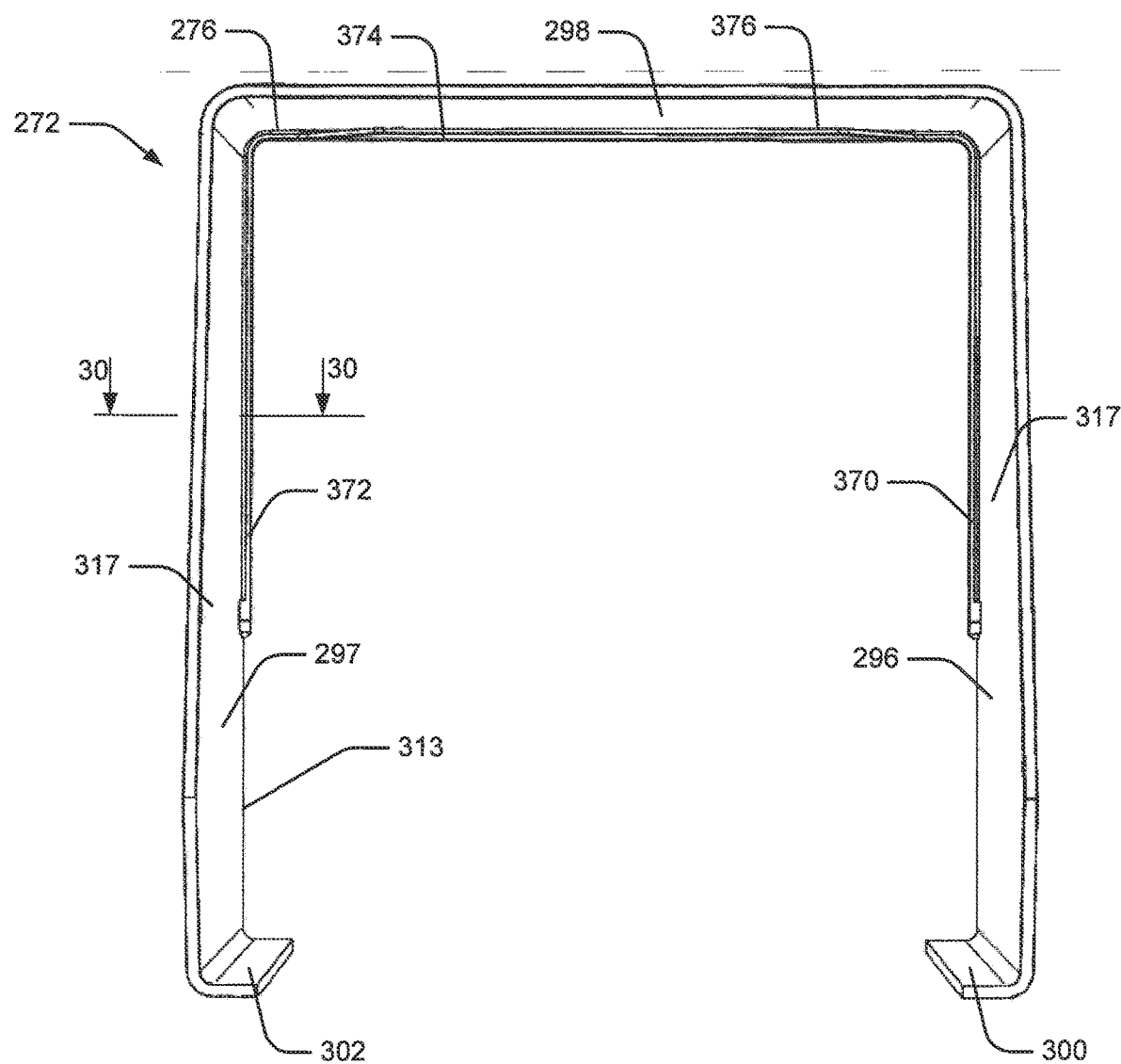
FIG. 29 is a rear perspective view of the arch assembly shown in FIG. 28.
Figure 30:
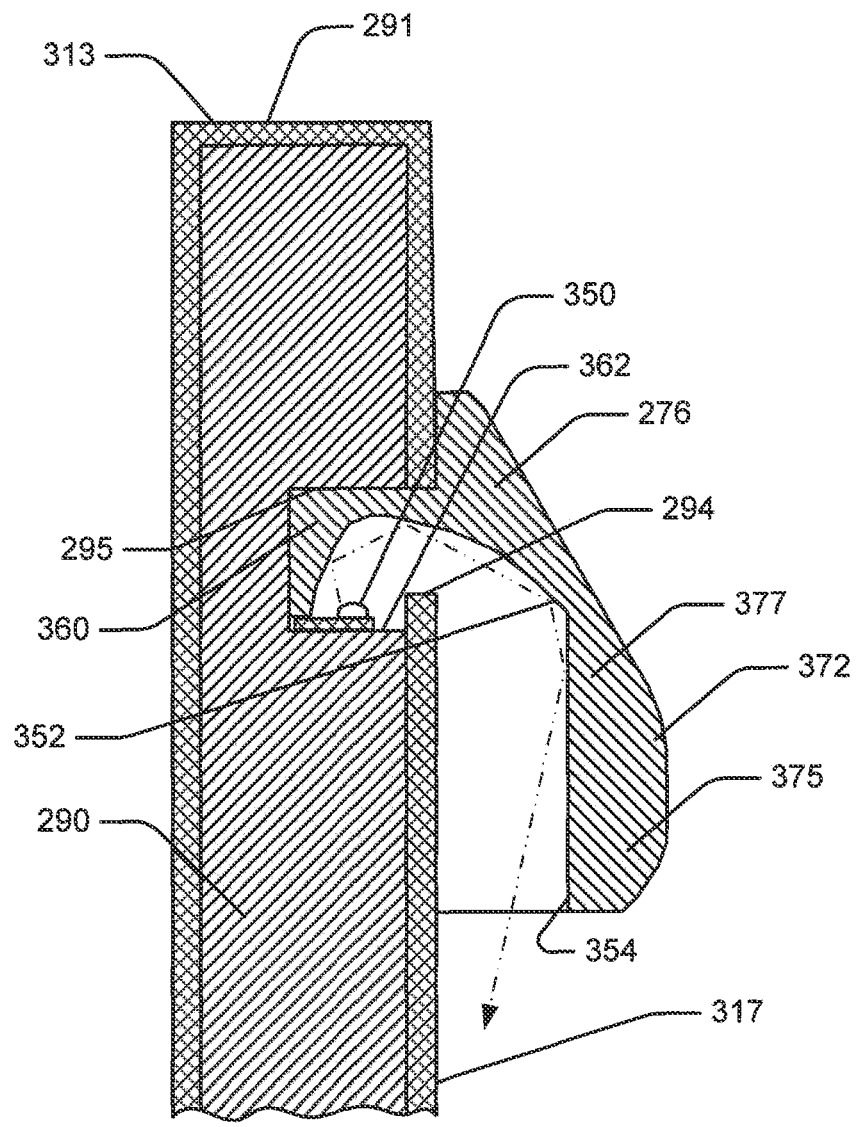
FIG. 30 is a cross-sectional view taken along the line 30-30 in FIG. 29.
Figure 31:
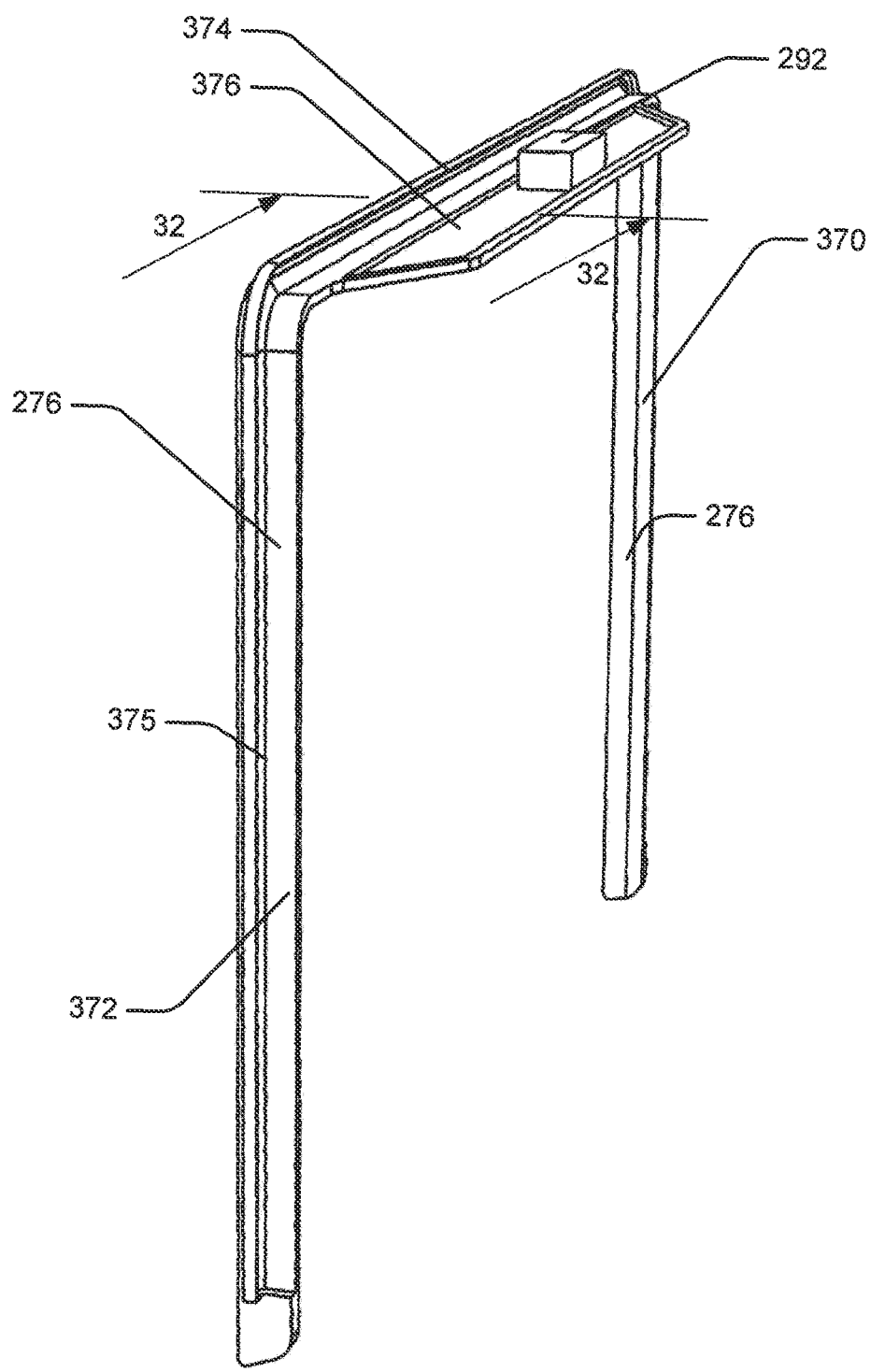
FIG. 31 is a perspective view of the technology ribbon shown in FIG. 28.

Referring again to FIGS. 22, 23 and 28 as well as to FIGS. 29-32, exemplary technology ribbon 276 is a rigid or semi-rigid assembly that includes a ribbon structure member 275 (see FIG. 31), a light source 350 and an audio or speaker component/box 292 (see FIG. 32). Referring specifically to FIGS. 30 through 32, ribbon structural member 375 is a rigid or semi-rigid member formed of molded plastic or a more rigid material that includes a central member 374 and first and second leg members 372 and 376 that extend generally at right angles from opposite ends of central member 374 in the same direction. In general, the shape defined by central member 374 and leg members 372 and 376 mirrors the shape defined by the internal surface of arch substructure 290 (see FIG. 20) adjacent the upper portion of channel 295 (see also FIG. 29).

Each leg member 372 and 376 has a similar cross section. Referring to FIG. 30, leg member 372 has a cross section that includes a mounting block portion 360 and an integrally formed extension portion 377. Mounting block portion 360 is shaped to be received within channel 295 formed by arch substructure 290. With block portion 360 received in channel 295, extension portion 277 extends a short distance (e.g., 1-3 inches) out of channel 295 and into the space defined by arch assembly 260. Block portion 360 and extension portion 377 together form a concave reflecting surface 352 that generally faces rearward away from front edge 313 of assembly 260. After assembly, a portion of reflecting surface 352 is located within channel 295 and a portion of surface 352 is located outside of channel 295 and opens rearward away from front edge 313.

Light source 350 is mounted inside channel 295 and relative to reflecting surface 352 such that light from the light source 350 is reflected one or more times off surface 352 and emanates from member 372 generally rearward. Some of the reflected light subtends the internal surface 317 of assembly 260 causing surface 317 to light up. Other reflected light simply lights up persons within the arch defined space. Where surface 317 is a light color (e.g., white), the lit up surface 317 increases the amount of light shown on arch occupants by effectively filling the arch space with light. To this end, the fabric used to form cover 371 should be selected to have properties capable of extending light shown thereon.

In at least some embodiments light source 350 may include an array or line of LEDs mounted to an internal wall 362 of channel 295 or integrally mounted to member 375 for simultaneous installation with member 372. Power is provided to light source 350 via a cable/wire that passes through the lower portion of channel 295 (see FIG. 28) which is hidden after assembly by layer 291. Surface 352 may be coated with a silver or other colored layer to increase reflectivity. In addition, in some cases a diffusing layer or member may be provided adjacent light source 350 to diffuse the source light to minimize or eliminate "hot spot" of light on surface 317 (e.g., the light pattern becomes more uniform).

Referring now to FIGS. 31 and 32, central ribbon member 374 has a shape that is similar to the shape of leg member 372 shown in FIG. 30, the main difference being that the portion of member 374 extending from the channel formed by substructure 290 is enlarged to form a shelf member. In this regard, member 374 includes a mounting block portion 384 and an extending portion 379 that is integrally formed therewith. Block portion 384 is shaped and dimensioned to be received in large channel 380 formed in the underface of the top member 296 of substructure 290 near front edge 313. Member 379 extends from member 384 out into the arch defined space and forms a top surface 376 that forms a shelf. Audio box 292 is positioned on or mounted to the top shelf surface 376 and, in at least some cases, may extend at least partially into channel 380 thereabove. In some cases, perforations (not shown) may be formed in member 379 to allow sound to emanate downward from box 292. Box 292 or some other dedicated component within ribbon 276 may also include one or more microphones to capture voices in the arch space during videoconferencing. In addition, the side wall members 296 and 297 may include or form additional relatively large chambers akin to compartment 380 (see again FIG. 32) for housing additional speakers, microphones or other components.

While no light devices are shown in FIG. 32, in at least some embodiments an inner surface of member 374 may be reflective and a light source may be provided in channel 380 for increasing the light within the arch defined space.

Ribbon 276 may be mounted to substructure 290 in any manner. For instance, ribbon 276 may be adhered into the channels formed by substructure 290. As another instance mechanical fasteners (e.g., screws, Velcro, etc.) may be used to secure ribbon 276. AS still one other instance, the components described may be dimensions to create a friction fit. Sources other than LEDs may be employed including fluorescent sources, incandescent sources, etc.

Referring now to FIG. 29, it should be appreciated that after ribbon 276 is installed, when the light sources are on, light therefrom washes internal arch surface 317 and indirectly thereby lighting up any persons within the arch space. In addition, at least some of the light will illuminate the front surface of screen member 274 (see FIG. 28).

Referring again to FIG. 22 and now also to FIGS. 33-39, core support assembly 270 has a construction similar to assembly 10 shown in FIG. 1. To this end, assembly 270 includes a plurality of components that form a frame structure 322 and a panel subassembly 320, 400 that is mounted to the frame 322 to form a core receiving space. The primary difference between assembly 270 and assembly 10 are dimensional and related to the fact that assembly 270 does not include a table subassembly.

Regarding dimensions, because assembly 270 is intended to be used by a person or persons seated on lounge 240 (see FIG. 22), assembly 270 is generally not as tall as assembly 10. For instance, the top edge of panel member 320 may be approximately sixty-six inches. In at least some cases, a single core assembly (120 in FIG. 12) may be used with either of assemblies 10 and 270 and therefore width dimensions of assemblies 10 and 170 may be identical or similar.

Referring still to FIGS. 22 and 33-39, instead of including a table top 12 as in FIG. 1, assembly 270 forms a bottom shelf structure 404 (also labeled 324 in FIG. 22) for supporting a bookbag, brief case, or other user accessories. Because assembly 270 does not include a table subassembly as in FIG. 1, the base footprint of assembly 270 is smaller. To increase stability in at least some cases weights 421 (see FIG. 39) are provided below member 404 to lower the center of mass of assembly 270.

Figure 33:
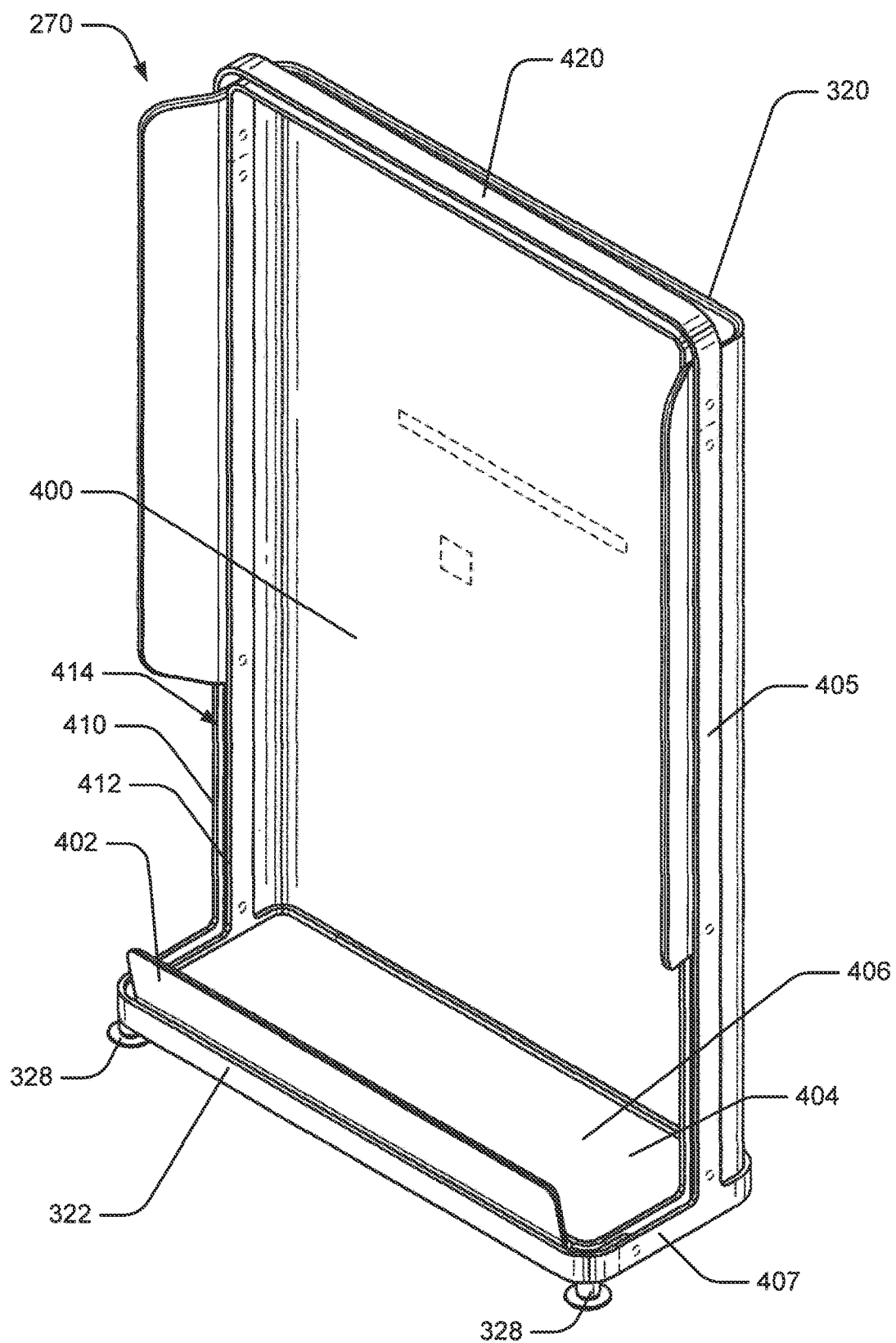
FIG. 33 is a perspective of the core support assembly shown in FIG. 22.
Figure 34:
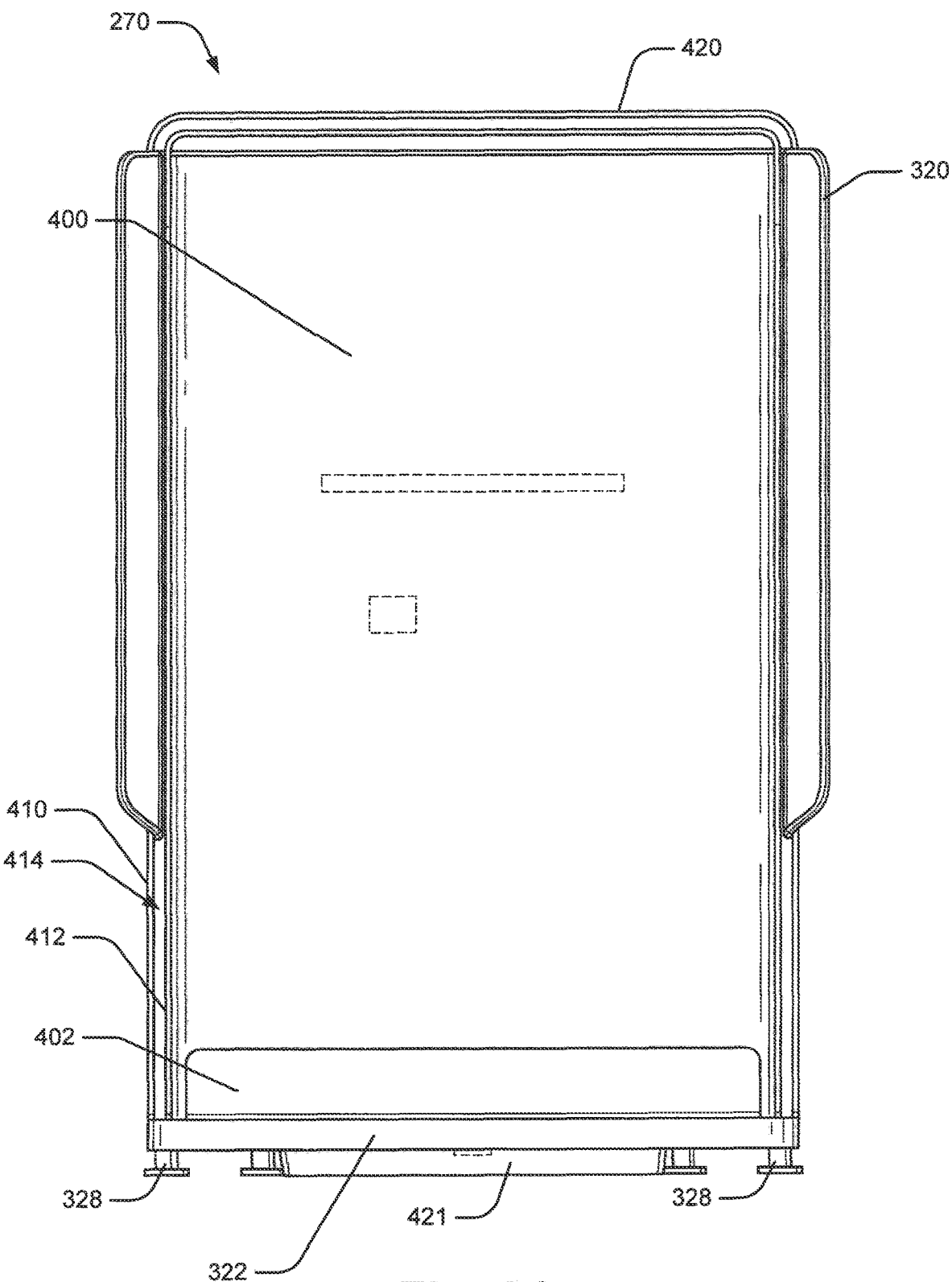
FIG. 34 is a front plan view of the assembly shown FIG. 33.
Figure 35:
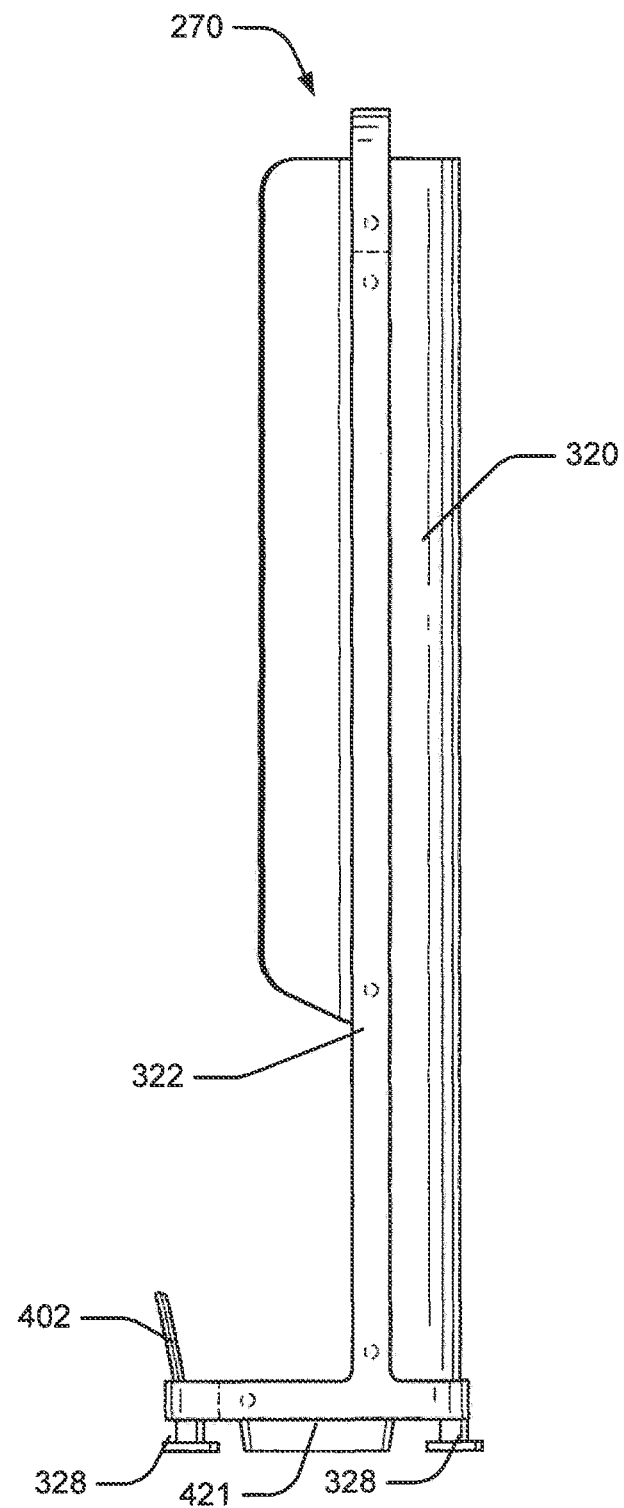
FIG. 35 is a side plane view of the assembly shown in FIG. 33.
Figure 36:
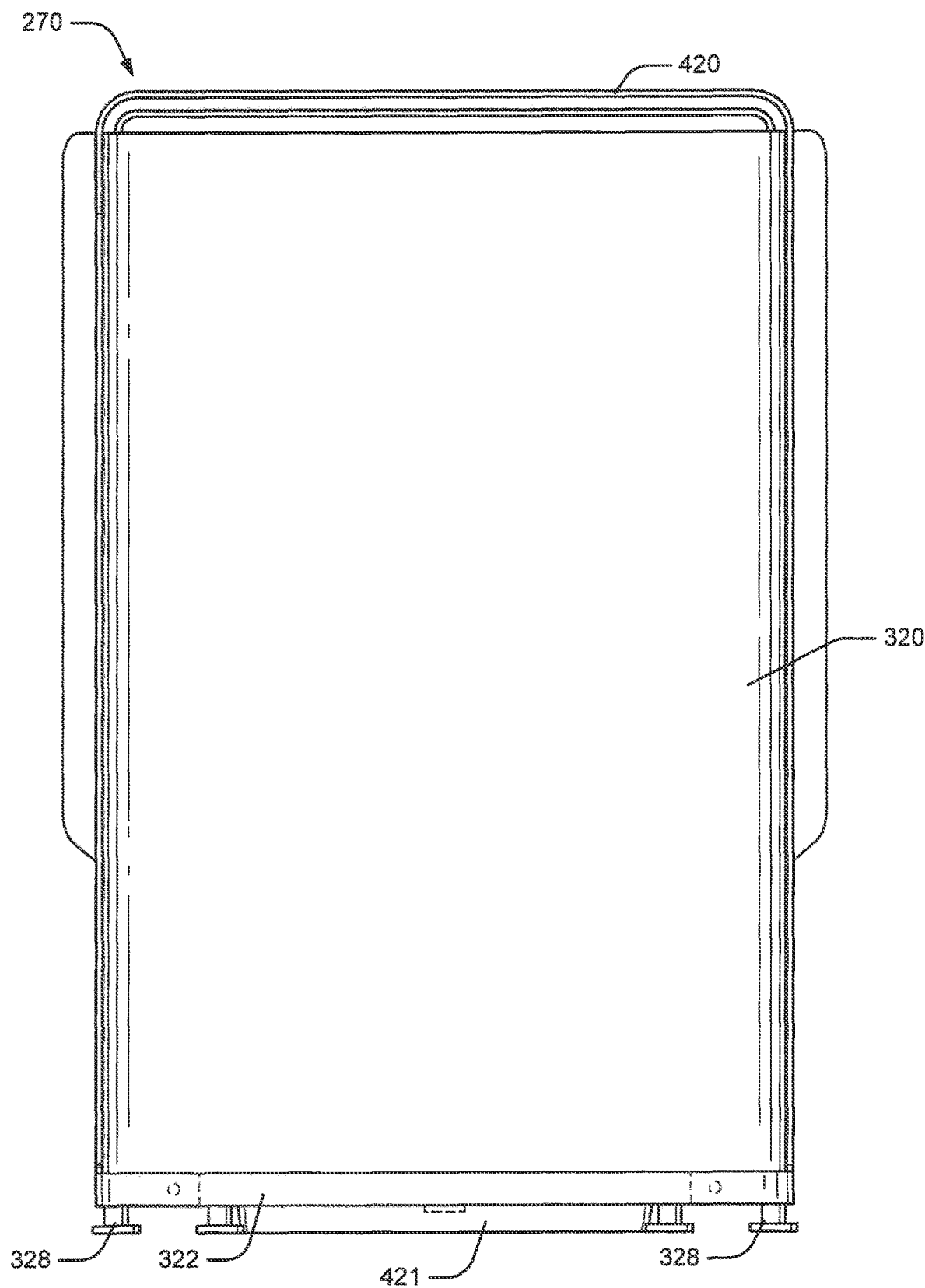
FIG. 36 is a rear plan view of the assembly shown in FIG. 33.
Figure 37:
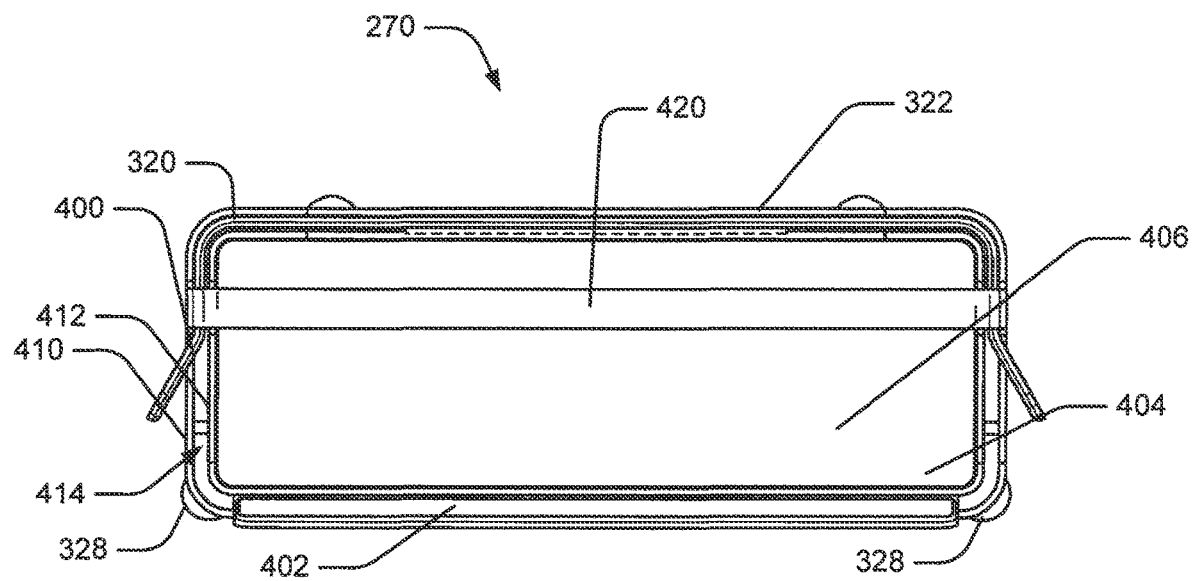
FIG. 37 is a top plan view of the assembly shown in FIG. 33.
Figure 38:
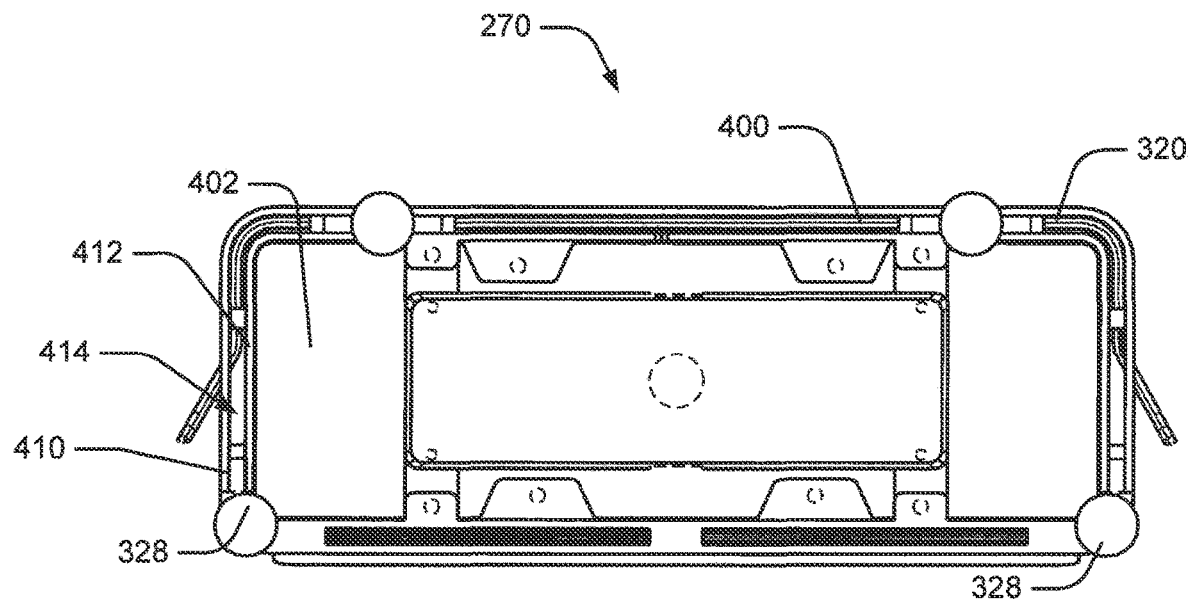
FIG. 38 is a bottom view of the core assembly shown in FIG. 33.

Referring to FIGS. 33-34, frame 322 is constructed using a plurality of elongated members and bushings to form a base structure 402 and a substantially vertical upright structure 405 that extends upwards from the base structure 407. Upright frame structure 405, like frame 26 described above, includes an inner frame structure 412 and an outer or external frame structure 410 that frames the inner structure 412 but that is spaced apart therefrom to form an elongated gap 414 there between. Bushings (see exemplary bushing 419 in FIG. 39) are provided between the frame structures 410 and 412 to help define and maintain gap 414. A top frame member 420 can be removed as shown in FIG. 39 to install the panel subassembly 320, 400 in a fashion similar to that described above with respect to the FIG. 1 assembly 10.

With the exception of dimensions, panel member 320 is similar to panel member 30 described above and therefore panel member 320 will not be described here in detail.

Figure 39:
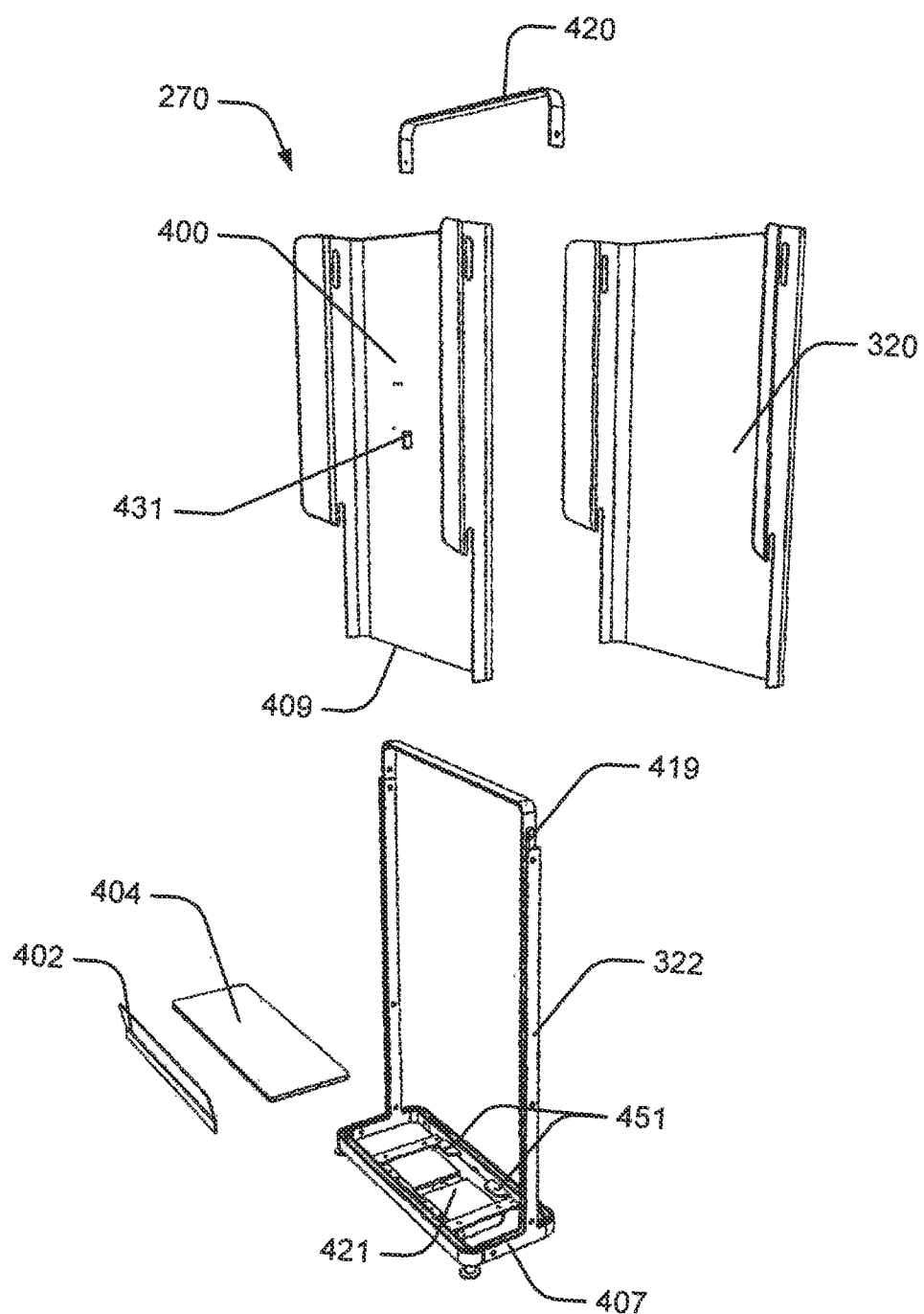
FIG. 39 is a partially exploded view of the assembly shown in FIG. 33.

Referring to FIGS. 33 and 39, inner or second panel member 400 has a length dimension similar to panel member 320 so that member 400 extends all the way down to the rear portion of base 407 and has a lower edge 409 that is received, along with a lower edge of member 320, in a gap formed by the base structure 407 upon assembly. Member 400 forms a cable passing opening 431 that passes through between front and rear surfaces thereof. Although no shown, member 400 forms a channel akin to channel 102 in FIG. 10 in a rear surface that extends from opening 431 to bottom edge 409.

Base 407 has a generally rectangular shape and includes members that continue the dual-frame appearance of structure 405. Brackets 451 (see FIG. 39) extend inward from an inner surface of the base 407 and form a seat for member 404. Weights 421 are connected to brackets 451 or other structure to secure the weights 421 to the base 407. Shelf member 404 is a rigid substantially rectilinear member dimensioned to fill the space within the portion of the frame 322 forming the base 407. Shelf member 404 rests on top surfaces of brackets 451 and forms a top surface 406 for supporting bags, cases, accessories, etc.

A retaining member 402 (also labeled 326 in FIG. 22) is provided on a side of member 404 opposite panel member 400. Retaining member 402 is mechanically fastened within the gap 414 formed by the front portion of base 407. Member 402 may form a bend so that the portion of member 402 outside the gap 414 can angle forward (see FIG. 35)

away from member 400 from bottom to top. While member 402 may include a single piece of material (e.g., a piece of sheet metal), in some embodiments member 402 will include two members having characteristics similar to panel members 400 and 320 so that the assembly 270 has a consistent appearance. For instance, member 402 may include two pieces of sheet metal where one piece is wrapped in a fabric cover and the two pieces have facing contacting or rear contacting surfaces.

Foot members or assemblies 328 are provide that are independently height adjustable. Assemblies 38 are mounted to an undersurface of base 407.

Figure 40:
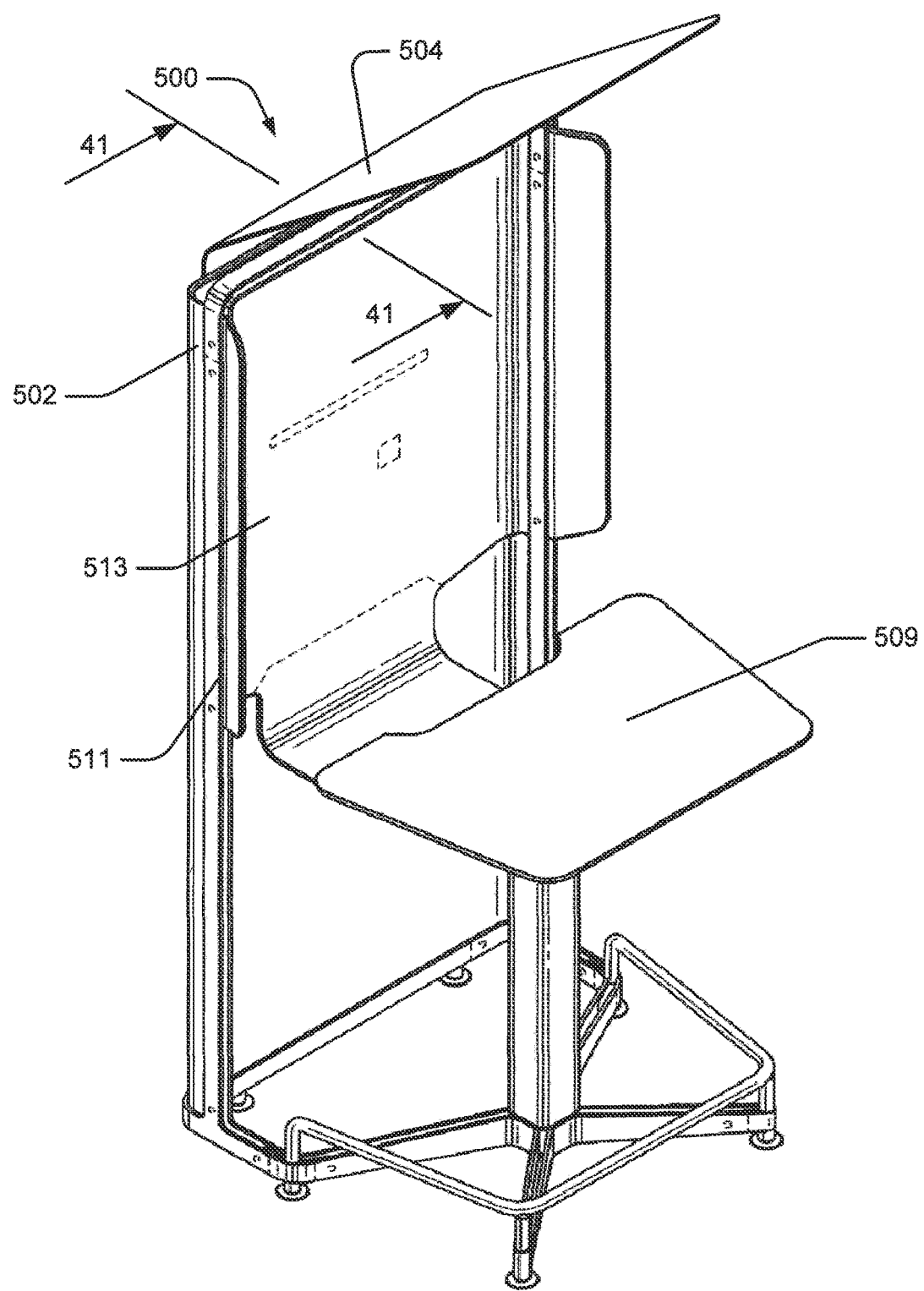
FIG. 40 is a perspective view of a support structure similar to the support structure shown in FIG. 1, albeit including a canopy extension member for lighting purposes.
Figure 41:
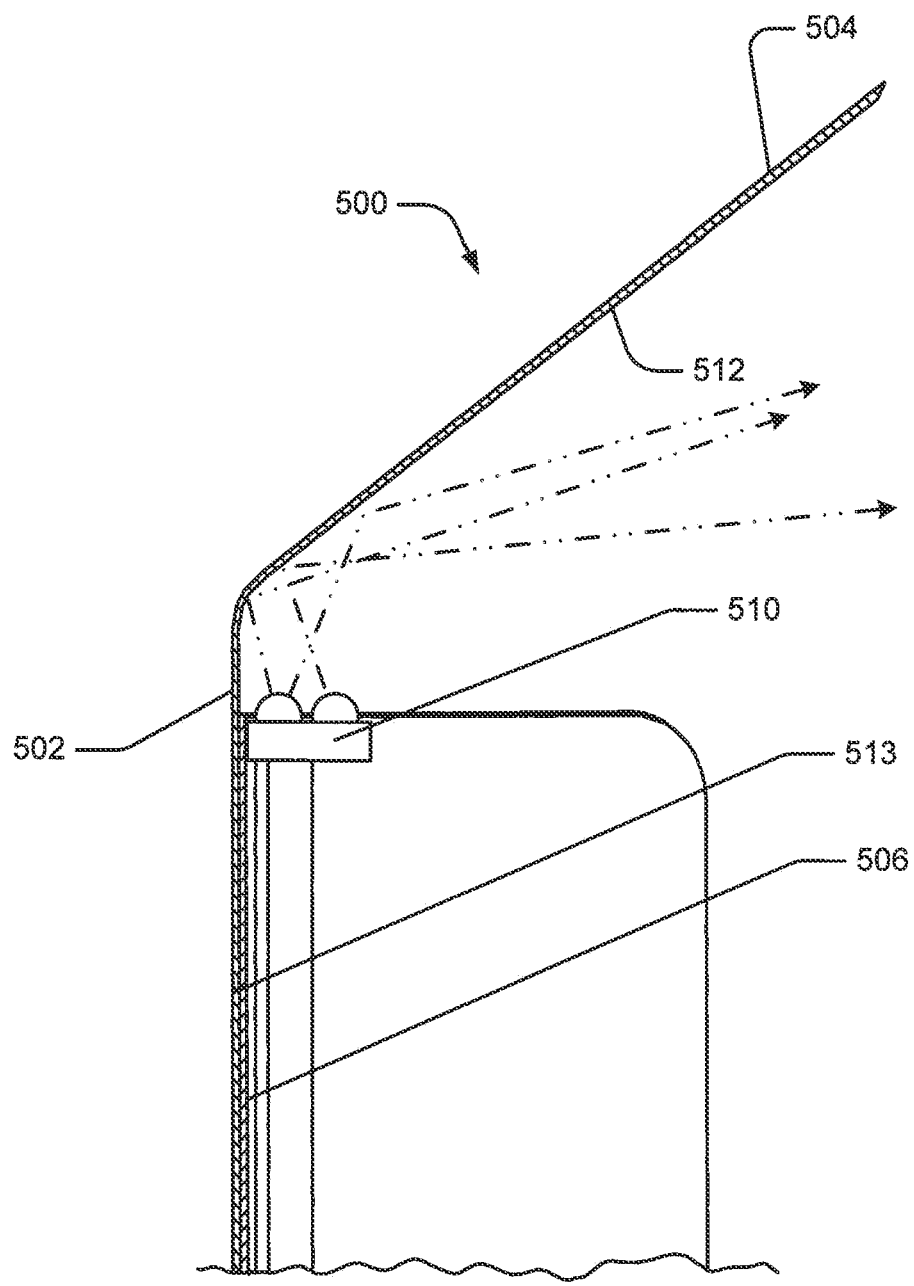
FIG. 41 is a cross-sectional view taken along the line 41-41 in FIG. 40.

Referring now to FIG. 40, to increase illumination of a person or persons using a standing assembly 500 similar to assembly 10 in FIG. 1 described above (e.g. to enhance videoconferencing appearance), in at least some embodiments it is contemplated that the rear panel member 30 in FIG. 1 above may be replaced with a rear member 502 that forms a canopy 504 in addition to the other structural members. Referring also to FIG. 41, canopy 504 is simply an extension of rear panel member 502 which extends upward and then angles forward (e.g., at a 45 degree angle with vertical) to form an angled reflecting surface 512. A light source (e.g., LED string, fluorescent bulbs, etc.) is mounted to front panel member 506 to shine light up and on to reflecting surface 512. The reflected light is directed forward of surface 512 to illuminate a person or persons standing adjacent table top 509.

In other embodiments both the front and rear panel members 506 and 502 may form canopy extensions 504 to maintain a uniform appearance. A fabric cover may be provided over a front panel member and over canopy 504 if desired. In some embodiments it is contemplated that canopy 504 may be an add on component that can be mechanically fastened to a panel assembly. While light device 510 is shown mounted to the front surface of member 506, in other embodiments device 510 may be mounted to the top frame member 517. Referring again to FIGS. 40 and 41 canopy 504 extends from the top of the central and planar portion 513 of panel member 502 and therefore will not interfere with frame 511 during installation. A canopy akin to canopy 504 may also be provided for assembly 270 shown in FIG. 33.

Figure 23:
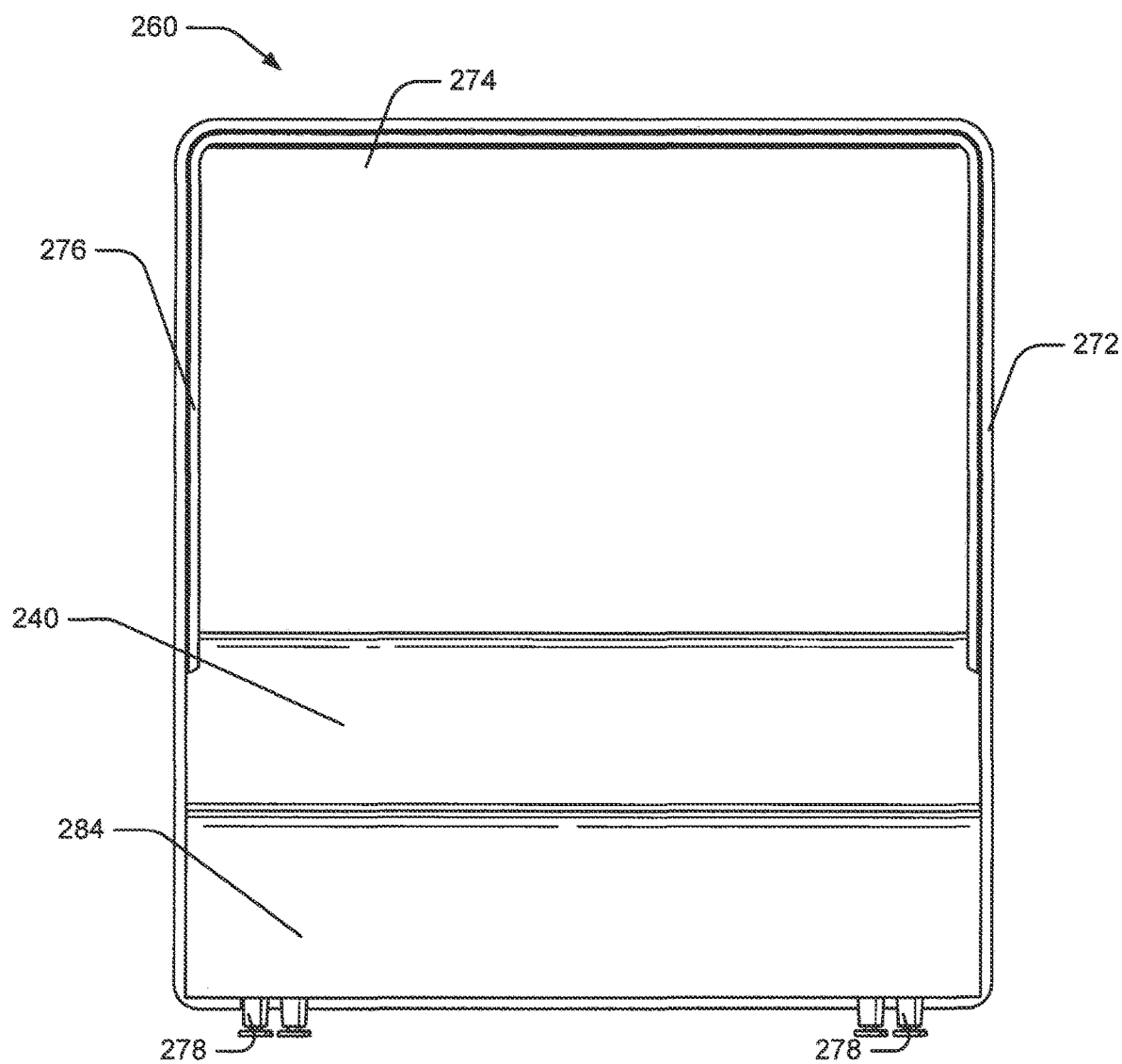
FIG. 23 is a front plan view of the lounge assembly shown in FIG. 22.
Figure 42:
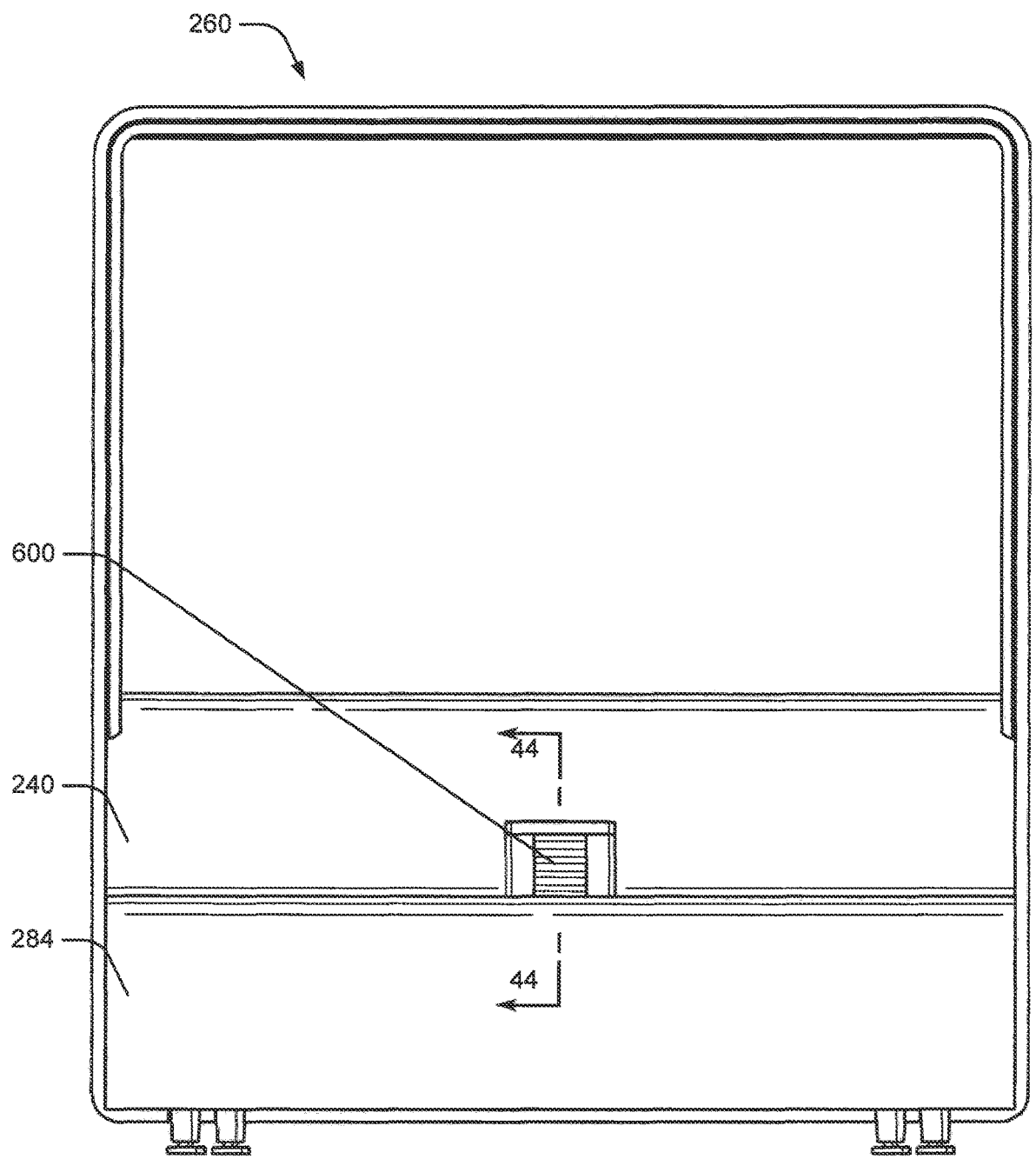
FIG. 42 is a front plan view similar to the view shown in FIG. 23, albeit including a bolster accessory.
Figure 43:
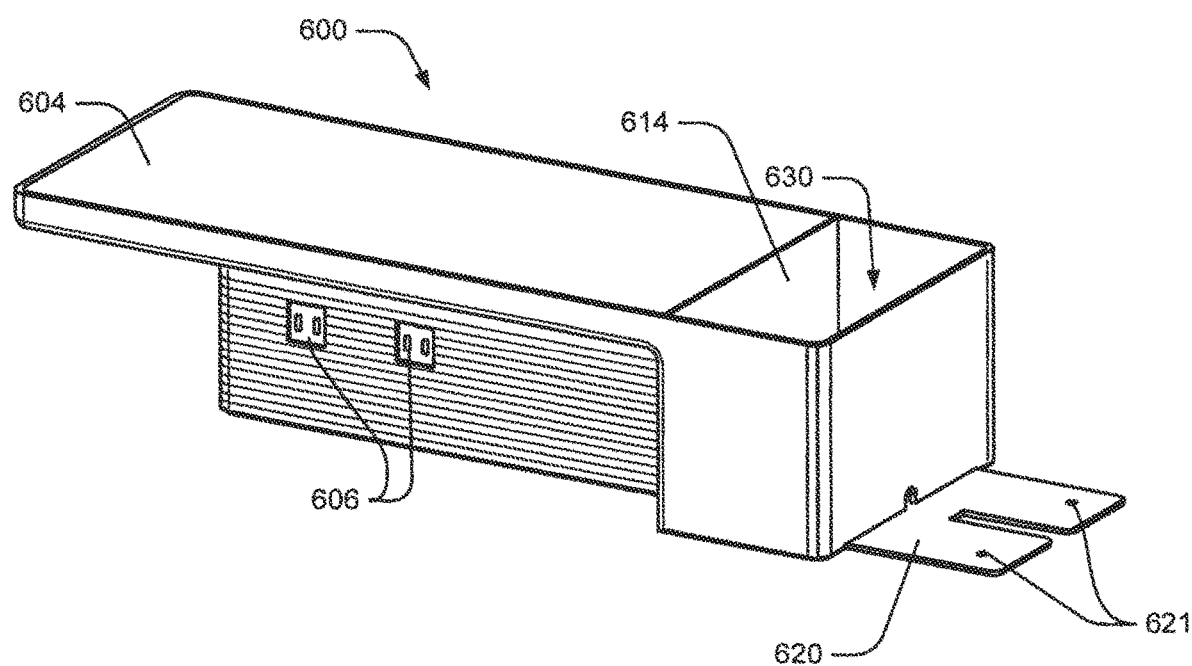
FIG. 43 is a perspective view of the bolster assembly of FIG. 42.
Figure 44:
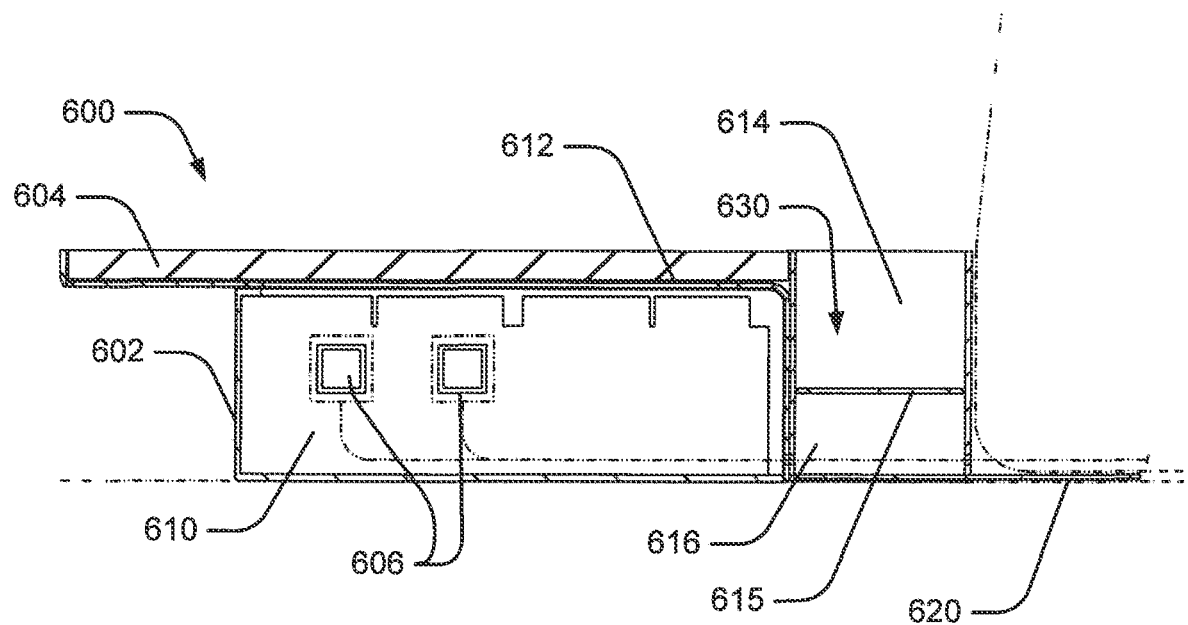
FIG. 44 is a cross-sectional view taken along the line 44-44 in FIG. 42.

Referring now to FIG. 42, a view similar to the view of the lounge assembly shown in FIG. 23 is illustrated, albeit where a bolster 600 has been added to the assembly 260. Bolster 600 provides an arm rest and storage space to a lounge user. Bolster 600, in at least some cases, also provides power receptacles for use by a lounge user and may provide data hook-ups or cables as well. Referring also to FIGS. 43 and 44, exemplary bolster 600 includes a molded rigid housing structure 602, a cushion member 604 and power receptacles 606. Housing structure 602 forms a number of compartments including a receptacle compartment 610, a cushion receiving compartment 612, a storage compartment 614 and a wire management compartment 616. Receptacle compartment 610 is a rectilinear compartment that forms two receptacle openings in each of two opposite side wall members (only one pair shown in FIG. 43) in which power receptacles 606 are mounted. Compartment 612 is formed above compartment 610 and is shallow for receiving an arm rest cushion 604 as shown. Compartment 612 overhangs forward and to the lateral sides of compartment 610 so that receptacles 606 are somewhat hidden below cushion 604. The overhangs also provide some clearance for power cable connector heads adjacent the receptacles. Storage compartment 614 is rearward of compartments 612 and 610 and forms an upwardly opening cavity 630 for storing small items such as a phone, post its, pencils, etc. A false floor member 615 separates compartments 614 and 616 so power cables can pass out of compartment 610 rearward as illustrated in phantom in FIG. 44 below member 615.

Referring still to FIGS. 42 through 44, a rigid flange 620 is integrally formed with housing 602 and extends rearward from a lower edge thereof. Flange 620 is formed to mirror structure between a lounge bed rest 240 and a lounge seat structure 284 (see again FIG. 42).

In some cases flange 620 can be received between assemblies 240 and 284 to at least loosely mechanically couple bolster 600 to the lounge assembly 260. In other cases flange forms mounting holes 621 that can be used to mechanically fasten (e.g., via screws) bolster 600 to the lounge structure.

Figure 45:
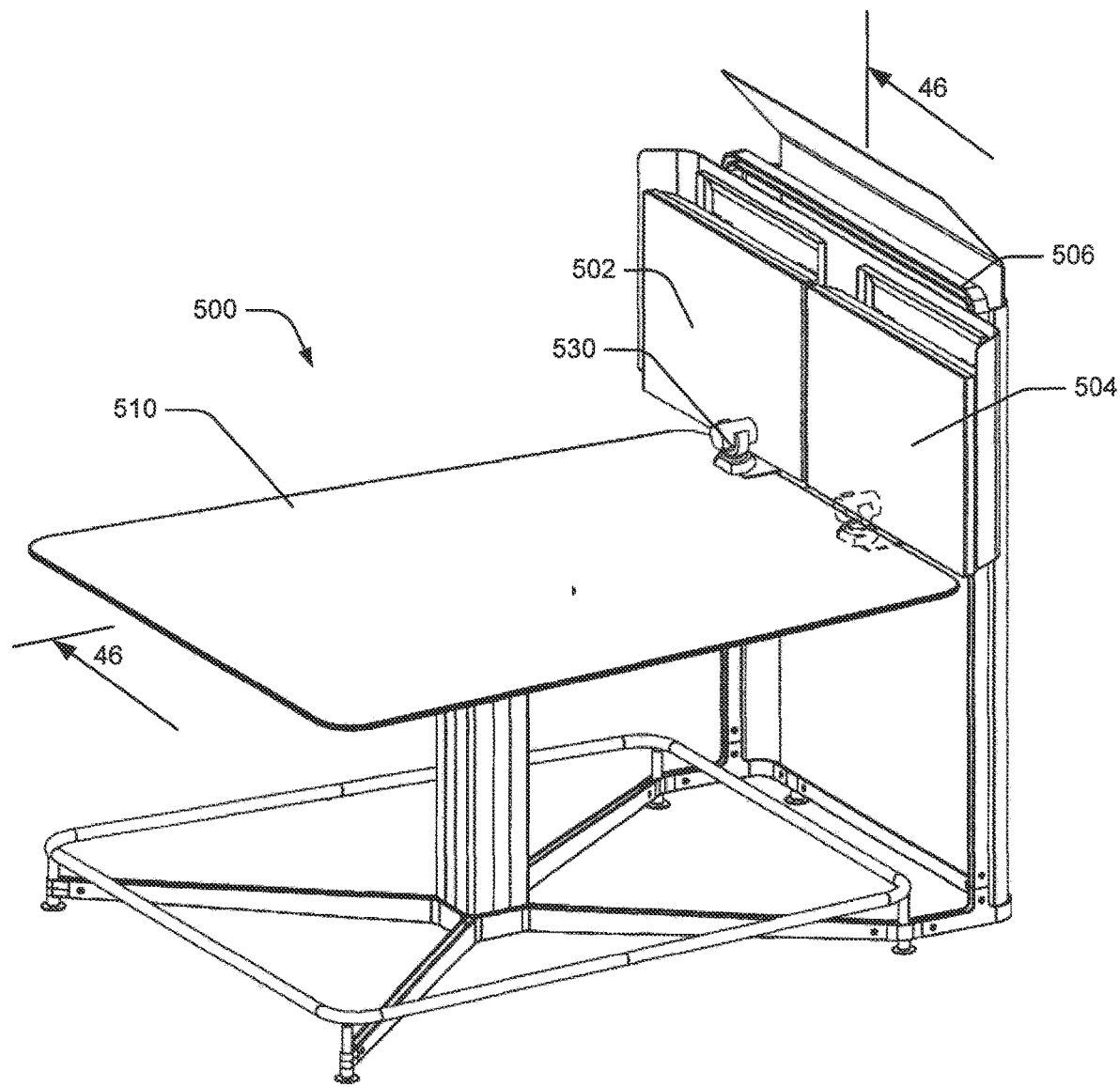
FIG. 45 is a perspective view of another table and screen support structure that is consistent with at least some aspects of the present invention.
Figure 46:
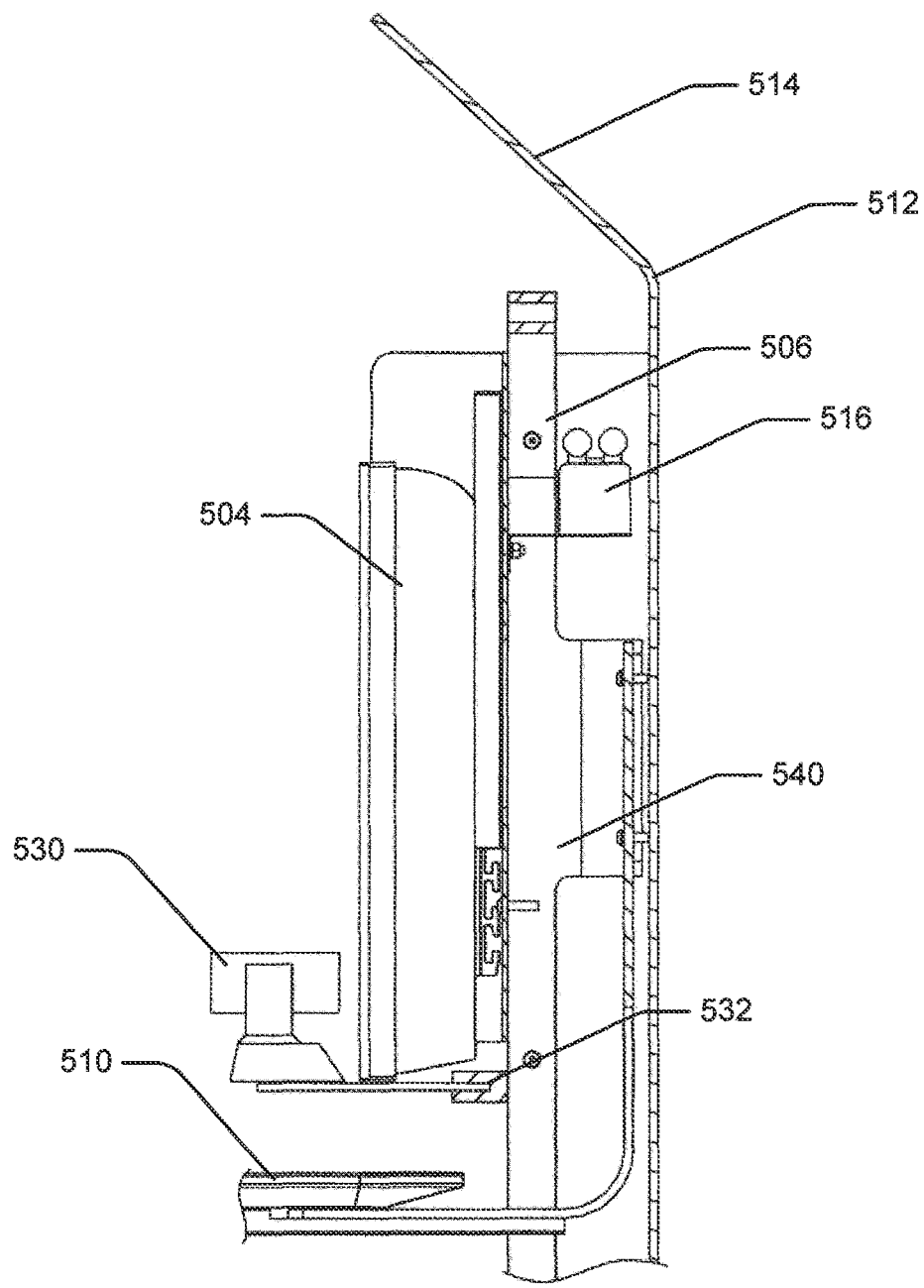
FIG. 46 is a cross-sectional view taken along the line 46-46 in FIG. 45.

Referring now to FIGS. 45 and 46, another assembly 500 having characteristics that are consistent with at least some aspects of the present invention is illustrated. In FIG. 45, two displays 502 and 504 are mounted to an upright totem 506 adjacent a worksurface 510. Here, a rear panel member 512 extends upward and angles forward to form a canopy 514 for reflecting light forward of the totem structure 506. At light source 516 is mounted below a reflecting surface of a canopy 514.

In addition, a camera 530 is mounted to a track 532 for sliding movement between different locations generally along a lower edge of the display screens 502 and 504. Track 532 is mechanically secured to a frame 540 or to other totem components. The camera 530 is positioned so that the camera is at a height where it is at least partially in front of at least one of screens 502 and 504 at some point along its travel along track 532. More specifically, camera 530 is moveable on track 532 to be centered with respect to at least one of displays 502 and 504 and reside in front of a lower portion of the display to at least somewhat obstruct a persons view of the lower part of the display when the person is positioned on a side of worksurface 510 opposite the display. It has been determined that it is particularly advantageous to have a camera positioned to obstruct view of a display for creating video of a local user during videoconferencing to generate video that helps conferees to have the illusion of direct eye-to-eye contact. When assembly 500 is not being used for videoconferencing, camera 530 can be moved on track 532 to a location where there is no obstruction of the view of either display 502 or 504 (e.g., between the displays in some cases). Cameras can be moved, in some embodiments, to locations in front of either display 502 and 504 (see phantom in FIG. 45).

While a track is shown in FIG. 46, it should be appreciated that other mechanical camera support structure is contemplated. For instance, an arm assembly mounted below one or both screens 502 and 504 may support camera 530 for videoconference use in which the camera is at least partially in front of one of the displays and other uses in which the camera 530 can be moved to a stored position. In addition, the track or other mechanical support structure and camera may be provided along other display edges including the top or side edges.

Figure 47:
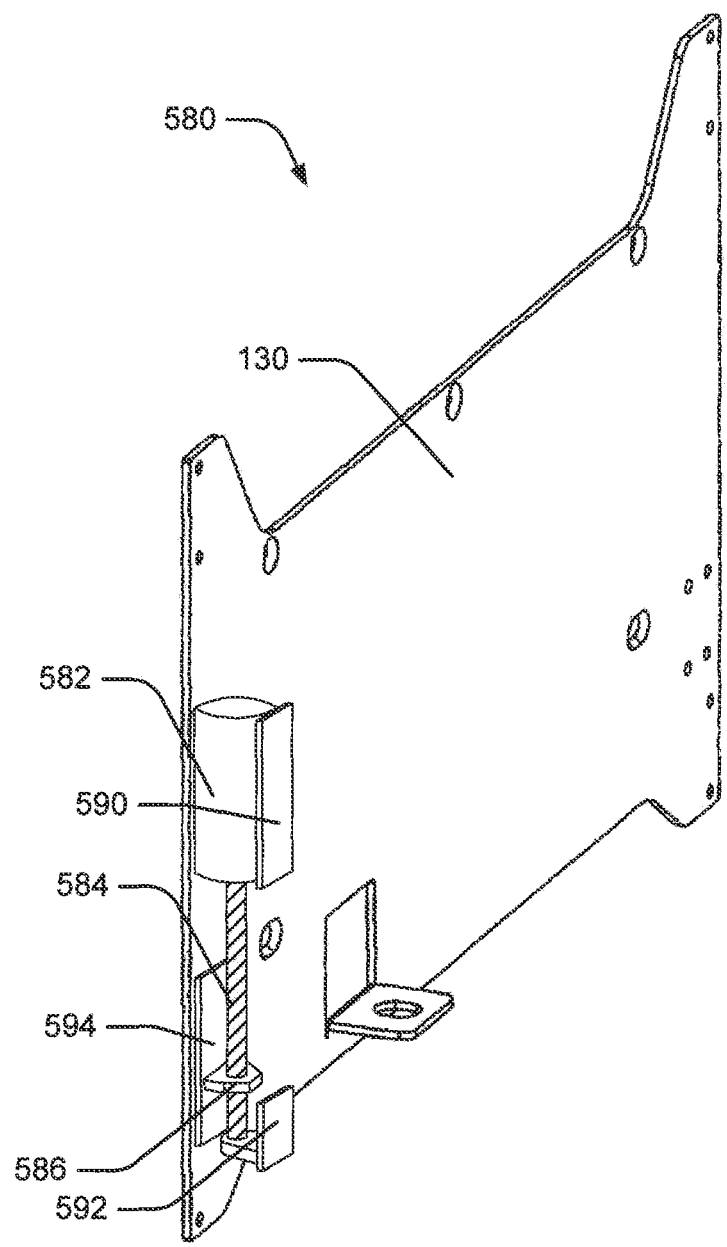
FIG. 47 is a perspective view of a subset of components that may be substituted for a subset of the components shown in FIG. 18.

Referring now to FIG. 47, a subassembly 580 that may be substituted for some of the components shown in FIG. 20 is illustrated. Assembly 580 includes a core mounting plate 130 akin to plate 130 in FIG. 20 and includes a motor 582, threaded shaft 584 and threaded adjustment nut 586 where motor 582, shaft 584 and nut 586 take the place of one of the gas springs 205 in FIG. 20. Not shown in FIG. 47 are the guide rods 243 and guide sleeves 245 and 247 or the assembly 140*a* that would be included in the FIG. 47 embodiment. Motor 582 includes threaded shaft 584 extending therefrom and would be mounted via brackets 590 and 592 to one of the surfaces forming chamber 204 (see FIG. 20 again). Nut 586 would be mounted to plate 130 via a bracket 594 so that nut 586 is stationary relative to plate 130. When motor 582 rotates shaft 584, thread 586 which is held stationary by plate 130, moves along shaft 584 causing the core assembly height to change. Although not shown, a core height adjust button for controlling motor 582 and core height may be provided either on the core or at some other location on either a core support structure, a table adjacent the core or within the exemplary lounge assembly described above.

Figure 48:
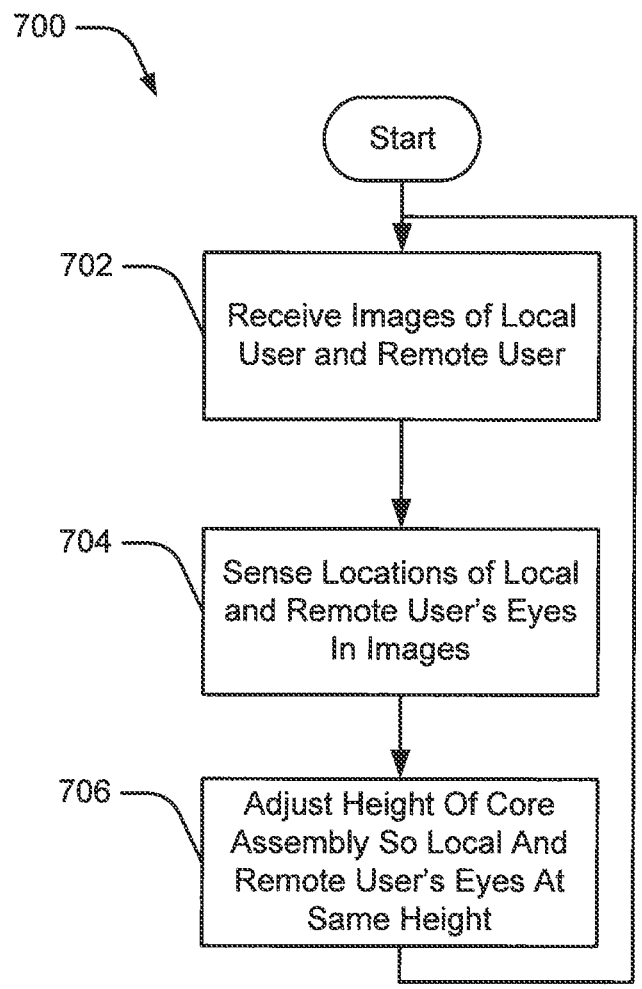
FIG. 48 is a flow chart that may be performed by a processor associated with the core shown in FIG. 12.

While embodiments described above require a core user to adjust the height of the display screen, in at least some embodiments it is contemplated that screen height may automatically be adjusted by a processor associated with the core 120. For instance, a processor may be programmed to use videoconferencing images of remote and local conferees to identify facial features (e.g., eyes) in each image and to then adjust the core height automatically to substantially align conferee's eyes. An exemplary process 700 for automatically adjusting core height is shown in FIG. 48. At block 702, a system processor receives images of local and remote users. At block 704, the processor senses the locations of user's eyes in the obtained images. At block 706, the processor automatically adjusts the height of the core in an attempt to align the conferee's eyes. Here, hysteresis can be built into the system so that core height is not changed often or the system may be set to require some signal from a local user to adjust the core height to avoid a constantly changing core height as conferees move with respect to cameras obtaining video. Where two local conferees are present during a videoconference, the processor may be programmed to set core height to an average height where the remote user's image appears with the remote user's eyes at a height between the height of the two local conferees.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

Figure 50:
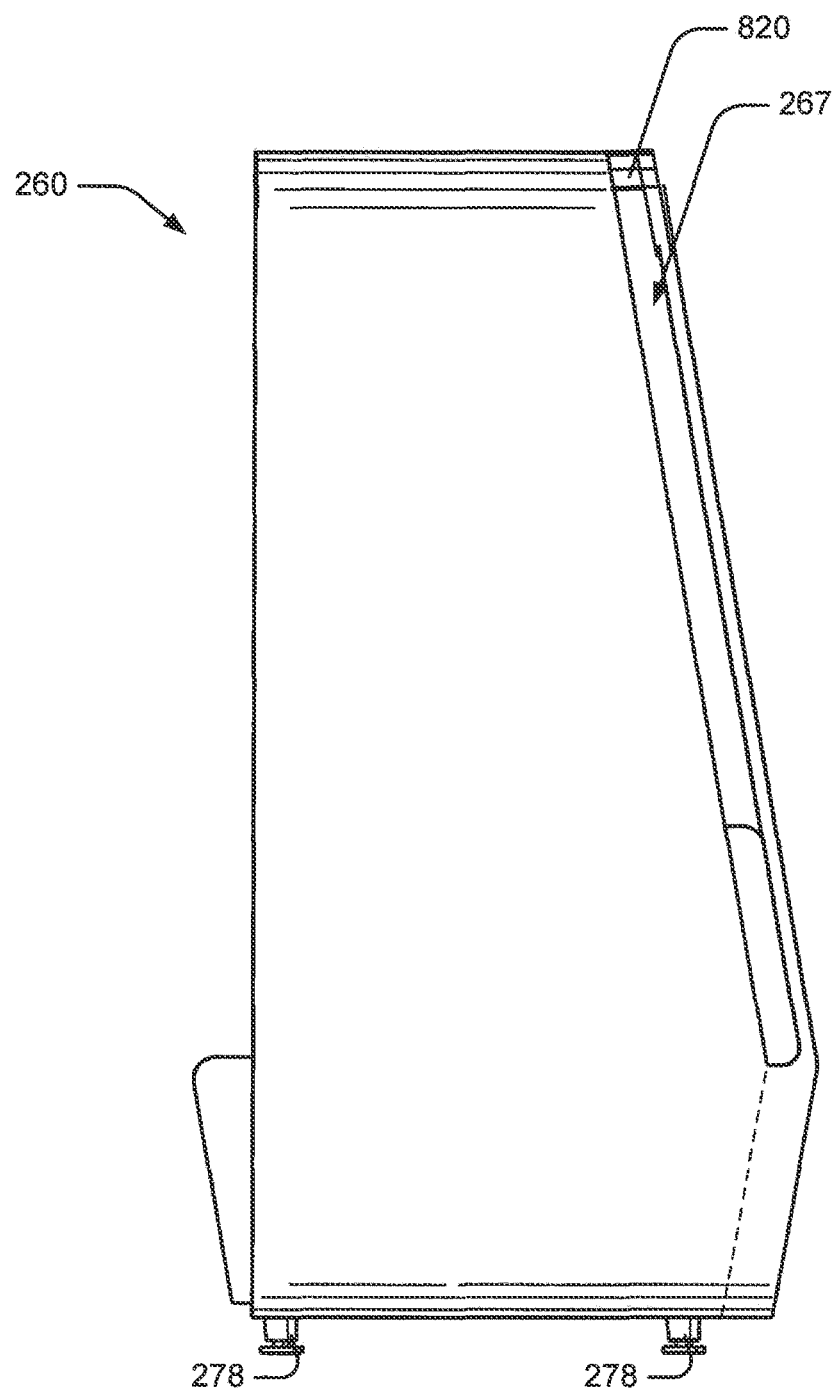
FIG. 50 is a side view similar to the view shown in FIG. 24, albeit including a screen support bracket.

Thus, the invention is to cover all modifications, equivalents, and alternatives falling within the spirit and scope of the invention as defined by the following appended claims. For example, referring to FIG. 50, one or more support brackets 820 (only one shown) may be provided to secure a top edge of screen member 274 to an adjacent portion of substructure 290 to provide screen stability. In FIG. 50 one bracket 820 is shown but two may be provided, one at each upper corner of screen 274 (see FIG. 28). As another example, referring again to FIG. 6, while receptacle 42 is described as a power receptacle or power strip, it should be appreciated that data connecting receptacles may also be provided at 42. For instance, a receptacle for receiving a connection to a laptop or the like may be provide at 42 so that the laptop can be linked to the display screen that forms part of a core assembly 120 (see again FIG. 2) supported by the assembly 10. Similarly, referring again to FIG. 43, bolster 600 may include data connections at 606 for linking a laptop or the like to a display included in a core assembly supported adjacent a lounge assembly as best shown in FIG. 22.

What is claimed is:

1. A space divider assembly comprising:
   at least first and second foot members;
   a frame including a curved lower rail and a plurality of substantially straight upright frame members, the lower rail supported at the upper ends of the foot members and having first and second ends, the upright frame members coupled to and extending upward from the lower rail and including at least first and second upright frame members extending upward from the first and second ends of the curved lower rail, the upright frame members forming first and second elongated openings that extend along substantially the entire length of each of the first and second upright frame members;
   a substantially uniform thickness panel member having a front surface, a rear surface, an upper edge, a lower edge and first and second side edges that extend between the upper edge and the lower edge, first and second lateral portions of the panel member adjacent the first and second side edges received within the first and second openings, respectively, a middle portion of the panel member between the first and second lateral portions curved so that the front surface of the panel member defines a recessed space, the panel member extending along at least the entire length of the upright frame members from the lower edge proximate the lower rail;
   a rear cover member having a front surface, a rear surface, an upper edge, a lower edge and first and second side edges that extend between the upper edge and the lower edge, a middle portion of the cover member between lateral portions adjacent the side edges curved, the rear cover member supported by the upright frame members with the front surface of the rear cover member immediately adjacent the rear surface of the panel member, the upper edge of the rear cover member immediately adjacent the upper edge of the panel member, the lower edge of the rear cover member proximate the lower edge of the panel member, and the first and second side edges of the rear cover member proximate the first and second side edges of the panel member, respectively.

2. The space divider assembly of claim 1 wherein the panel member is at least somewhat flexible.

3. The space divider assembly of claim 1 wherein the lateral portions of the rear cover member adjacent the first and second edges of the cover member are also received within the first and second elongated openings.

4. The space divider assembly of claim 1 wherein the first and second elongated openings include first and second elongated gaps.

5. The space divider assembly of claim 1 wherein the first and second openings extend substantially vertically.

6. The space divider assembly of claim 1 wherein the lower edges of each of the panel member and the rear cover member mirror a curved edge formed by the curved lower rail.

7. The space divider assembly of claim 6 wherein the lower edge of the panel member contacts and is supported by the lower rail.

8. The space divider assembly of claim 1 wherein the cover member conceals the rear surface of the panel member.

9. The space divider assembly of claim 1 wherein the rear cover member includes a fabric external surface.

10. The space divider assembly of claim 9 wherein the cover member includes a sound absorbing material under the fabric external surface.

11. A space divider assembly comprising:
at least first and second foot members;
a frame including a curved lower rail and a plurality of substantially straight upright frame members, the lower rail supported at the upper ends of the foot members and having first and second ends, the upright frame members coupled to and extending upward from the lower rail and including at least first and second upright frame members extending upward from the first and second ends of the curved lower rail, the upright frame members forming first and second elongated openings that extend along substantially the entire length of each of the first and second upright frame members;
a panel assembly, the panel assembly including a substantially uniform thickness panel member having a front surface, a rear surface, an upper edge, a lower edge and first and second side edges that extend between the upper edge and the lower edge, first and second lateral portions of the panel member adjacent the first and second side edges received within the first and second openings, respectively, a middle portion of the panel member between the first and second lateral portions curved so that the front surface of the panel member defines a recessed space between the first and second lateral portions, the panel member extending along at least the entire length of the upright frame members from the lower edge proximate the lower rail;
a sound absorption subassembly mounted to the rear surface of the panel member so as to conceal the rear surface of the panel member.

12. The space dividing assembly of claim 11 wherein the sound absorption subassembly includes an external fabric layer and a sound absorbing material between the fabric layer and the rear surface of the panel member.

13. The space dividing assembly of claim 12 wherein the sound absorbing material is foam.

14. The space dividing assembly of claim 11 wherein the sound absorption subassembly leaves the upper edge of the panel member exposed.

15. The space dividing assembly of claim 11 wherein the panel member is formed of bent sheet metal.

16. The space dividing assembly of claim 11 further including a second sound absorption subassembly covering at least a portion of the front surface of the panel member.

17. The space dividing assembly of claim 16 wherein the second sound absorption subassembly covers only a bottom portion of the panel member.

18. The space dividing assembly of claim 11 wherein the lower edge of the panel member is proximate the curved lower rail and has a shape the mirrors a curved edge of the curved lower rail.

19. A space divider assembly comprising:
at least first and second foot members;
a frame including a curved lower rail and a plurality of substantially straight upright frame members, the lower rail supported at the upper ends of the foot members and having first and second ends, the upright frame members coupled to and extending upward from the lower rail and including at least first and second upright frame members extending upward from the first and second ends of the curved lower rail, the upright frame members forming first and second elongated openings that extend along substantially the entire length of each of the first and second upright frame members;
a panel assembly, the panel assembly including a substantially uniform thickness panel member having a front surface, a rear surface, an upper edge, a lower edge and first and second side edges that extend between the upper edge and the lower edge, first and second lateral portions of the panel member adjacent the first and second side edges received within the first and second openings, respectively, a middle portion of the panel member between the first and second lateral portions curved so that the front surface of the panel member defines a recessed space between the first and second lateral portions, the panel member extending along at least the entire length of the upright frame members from the lower edge proximate the lower rail;
a sound absorption subassembly mounted to the front surface of the panel member so as to conceal at least a portion of the front surface of the panel member.

20. The space divider assembly of claim 19 further including a tabletop member and a bracket, the bracket mounted supported by the upright frame members and a rear end of the tabletop member supported by the bracket, the sound absorption subassembly covering only a lower portion of the front surface of the panel member that resides below the tabletop member.

21. A space divider assembly comprising:
at least first and second foot members;
a frame including a curved lower rail and a plurality of substantially straight upright frame members, the lower rail supported at the upper ends of the foot members and having first and second ends, the upright frame members coupled to and extending upward from the lower rail and including at least first and second upright frame members extending upward from the first and second ends of the curved lower rail, the upright frame members forming first and second elongated openings that extend along substantially the entire length of each of the first and second upright frame members;
a substantially uniform thickness panel member having a front surface, a rear surface, an upper edge, a lower edge and first and second side edges that extend between the upper edge and the lower edge, first and second lateral portions of the panel member adjacent the first and second side edges received within the first and second openings, respectively, a middle portion of the panel member between the first and second lateral portions curved so that the front surface of the panel member defines a recessed space, the panel member extending along at least the entire length of the upright frame members from the lower edge proximate the lower rail;
a front cover member having a front surface, a rear surface, an upper edge, a lower edge and first and second side edges that extend between the upper edge and the lower edge, a middle portion of the front cover member between lateral portions adjacent the side edges curved, the front cover member supported by the upright frame members with the rear surface of the front cover member immediately adjacent at least a portion of the front surface of the panel member, the upper edge of the front cover member immediately adjacent the upper edge of the panel member, and the first and second side edges of the front cover member proximate at least portions of the first and second side edges of the panel member, respectively.

22. The space divider assembly of claim 21 wherein the front cover member only conceals the upper portion of the front surface of the panel member.

23. The space divider assembly of claim 21 wherein the front cover member only conceals approximately the upper half of the front surface of the panel member.

24. The space divider assembly of claim 23 wherein the front cover member includes sound absorption material.

* * * * *